(12) United States Patent
Dekkers et al.

(10) Patent No.: US 10,168,621 B2
(45) Date of Patent: Jan. 1, 2019

(54) RADIATION BEAM APPARATUS

(71) Applicant: ASML NETHERLANDS B.V., Veldhoven (NL)

(72) Inventors: Jeroen Dekkers, Eindhoven (NL); Han-Kwang Nienhuys, Utrecht (NL); Michael Jozef Mathijs Renkens, Sittard (NL)

(73) Assignee: ASML Netherlands B.V., Veldhoven (NL)

( * ) Notice: Subject to any disclaimer, the term of this patent is extended or adjusted under 35 U.S.C. 154(b) by 51 days.

(21) Appl. No.: 15/523,938

(22) PCT Filed: Nov. 10, 2015

(86) PCT No.: PCT/EP2015/076179
§ 371 (c)(1),
(2) Date: May 2, 2017

(87) PCT Pub. No.: WO2016/083120
PCT Pub. Date: Jun. 2, 2016

(65) Prior Publication Data
US 2018/0314164 A1 Nov. 1, 2018

(30) Foreign Application Priority Data
Nov. 24, 2014 (EP) .................................... 14194518

(51) Int. Cl.
*G03F 7/20* (2006.01)
*G02B 5/18* (2006.01)
*G02B 26/00* (2006.01)

(52) U.S. Cl.
CPC ....... *G03F 7/70158* (2013.01); *G02B 5/1828* (2013.01); *G02B 5/1838* (2013.01);
(Continued)

(58) Field of Classification Search
CPC .. G02B 5/1828; G02B 5/1838; G02B 5/1861; G02B 26/004; G03F 7/70158; G03F 7/70308
(Continued)

(56) References Cited

U.S. PATENT DOCUMENTS

2002/0009178 A1  1/2002 Dinger et al.
2003/0117680 A1  6/2003 Allen et al.
(Continued)

FOREIGN PATENT DOCUMENTS

WO   WO 2006/079821   8/2006

OTHER PUBLICATIONS

International Search Report and Written Opinion dated Jun. 10, 2016 in corresponding International Patent Application No. PCT/EP2015/076179.
(Continued)

*Primary Examiner* — Colin Kreutzer
(74) *Attorney, Agent, or Firm* — Pillsbury Winthrop Shaw Pittman LLP

(57) ABSTRACT

An adjustable diffraction grating includes: an optical element and a distortion mechanism. The optical element has an optical surface to receive an input radiation beam. The optical element is provided with a plurality of closed channels below the optical surface, above each closed channel the optical surface being formed from a membrane of material. The distortion mechanism includes one or more actuators that are operable to distort the membranes over the closed channels so as to control the shape of the optical surface and to form a periodic structure on the optical surface which acts as a diffraction grating such that the input radiation beam is diffracted from the optical element to form a plurality of angularly separated sub-beams.

21 Claims, 24 Drawing Sheets

(52) U.S. Cl.
CPC ......... *G02B 5/1861* (2013.01); *G02B 26/004* (2013.01); *G03F 7/70308* (2013.01)

(58) Field of Classification Search
USPC ............. 355/67, 71; 359/566, 572, 573, 574
See application file for complete search history.

(56) References Cited

U.S. PATENT DOCUMENTS

2004/0212869 A1* 10/2004 Srinivasan ........... G02B 5/1828
359/295
2009/0174876 A1 7/2009 Schriever et al.

OTHER PUBLICATIONS

Newnam, Brian Emerson, "Development of free-electron lasers for XUV projection lithography", Proceedings of SPIE, May 1, 1990, vol. 1227, pp. 116-133.

* cited by examiner

RADIATION BEAM APPARATUS

CROSS-REFERENCE TO RELATED APPLICATIONS

This application is the U.S. national phase entry of PCT patent application no. PCT/EP2015/076179, which was filed on Nov. 10, 2015, which claims the benefit of priority of European patent application no. 14194518.8, which was filed on Nov. 24, 2014 and which is incorporated herein in its entirety by reference.

FIELD

The present invention relates to radiation beam apparatus for receiving an input radiation beam and outputting one or more output radiation beams. The radiation beam apparatus may be an attenuator for receiving an input radiation beam and outputting an output radiation beam, which may have a lower power than the input radiation beam. Alternatively, radiation beam apparatus may be a beam splitting apparatus. In particular, the radiation beam apparatus may form part of a lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses extreme ultraviolet (EUV) radiation, being electromagnetic radiation having a wavelength within the range 4-20 nm, may be used to form smaller features on a substrate than a conventional lithographic apparatus (which may for example use electromagnetic radiation with a wavelength of 193 nm). A free electron laser may be used to generate EUV radiation for use by a lithographic apparatus.

A lithographic system may comprise one or more radiation sources, a beam delivery system and one or more lithographic apparatus. The beam delivery system of a lithographic system may be arranged to direct radiation from the one or more radiation sources to the one or more lithographic apparatus. It may be desirable to control the power of radiation received by a lithographic apparatus.

It is an object of the present invention to obviate or mitigate at least one problem associated with the prior art.

SUMMARY

According to a first aspect of the invention there is provided an adjustable diffraction grating comprising: an optical element having an optical surface for receiving an input radiation beam, the optical element being provided with a plurality of closed channels below the optical surface, above each closed channel the optical surface being formed from a membrane of material; and a distortion mechanism comprising one or more actuators that are operable to distort the membranes over the closed channels so as to control the shape of the optical surface and to form a periodic structure on the optical surface which acts as a diffraction grating such that the input radiation beam is diffracted from the optical element to form a plurality of angularly separated subbeams.

The first aspect of the present invention provides a versatile diffraction grating mechanism for outputting one or more output radiation beams, the properties of which can be controlled using the distortion mechanism. Since the optical element remains fixed and only the shape of the periodic structure is used to control the properties of the output radiation beams, the adjustable diffraction grating can operate at high speeds with short response times. Further, there is no limit on the angle at which the input radiation beam is incident upon the optical element. This allows the adjustable diffraction grating to operate at very small grazing incidence angles, decreasing the power absorbed by the adjustable diffraction grating.

The one or more actuators may be operable to control a pressure difference between the interior of the closed channels and the optical surface.

The closed channels may be filled with a fluid and the distortion mechanism comprises one or more actuators that are operable to control the pressure of the fluid within the plurality of closed channels.

It may be desirable for the fluid to have a vapour pressure that is sufficiently low that during normal operation of the optical element the fluid remains in a liquid phase. That is, boiling effects of the fluid do not need to be considered. Additionally or alternatively, it may be desirable to for the fluid to have a vapour pressure that is sufficiently high that any leak of the fluid can be removed by evaporation, i.e. a vapour pressure that is higher that the ambient operating pressure of the optical element (which may typically be under vacuum conditions). The fluid may have a vapour pressure in the range 10-100 Pa when evaluated at 22° C. It will be appreciated by the skilled person that the operating temperature of the optical element when using such a fluid is not limited to 22° C. and may rather be used in a broad range of operating temperatures of the optical element. The temperature of 22° C. is merely used as an example which allows the vapor pressure of suitable hydraulic fluids to be unambiguously defined. A typical operating temperature of the optical element may be in the range 15-150° C. For example, the typical operating temperature of the optical element may be in the range 15-60° C. For example, the typical operating temperature of the optical element may be in the range 15-30° C.

The fluid may comprise a hydrocarbon of the form $C_xH_yO_z$. Advantageously, such fluids do not contain corrosive elements such as sulfur or halogens and therefore reduce the risk of damage being caused by a leak of the hydraulic fluid. In one embodiment, the fluid may be n-dodecane ($C_{12}H_{26}$), which has a vapour pressure of around 12 Pa at an operating temperature of approximately 22° C.

The adjustable diffraction grating may further comprise an external fluid supply arranged to supply fluid to and remove fluid from the plurality of channels.

Advantageously, with such an arrangement, the hydraulic fluid (for example water or a hydrocarbon) may be used as a cooling medium. An average pressure of the fluid within the plurality of channels is defined by the properties of the external fluid supply.

The external fluid supply may be arranged to create an oscillating pressure within the channels.

The distortion mechanism may comprise one or more piezoelectric actuators. The or each piezoelectric actuator may be operable to distort the membranes over one or more of the closed channels so as to control the shape of the optical surface.

The closed channels may be filled with a fluid and the or each piezoelectric actuator may be operable to control the pressure of the fluid within the plurality of closed channels.

Alternatively, each piezoelectric actuator may be operable to directly control the membrane of material above a closed channel within which the piezoelectric actuator is provided.

The piezoelectric actuator may be a piezoelectric bending actuator comprising two electrodes and one or more layers of piezoelectric material disposed between the electrodes.

The distortion mechanism may comprise one or more electrostatic actuators. The or each electrostatic actuator may be operable to distort the membranes over one or more of the closed channels so as to control the shape of the optical surface.

The plurality of channels may be arranged in groups with all of the channels in each group being in fluid communication and each group of channels being isolated from adjacent groups.

Each group of channels may be provided with one or more connecting channels arranged so as to connect each of the channels within that group together.

Each group of channels may be provided with an actuator that is operable to control the pressure of fluid within each of the channels of the group.

The adjustable diffraction grating may further comprise one or more cooling channels defined by a body of the optical element for circulation of a cooling fluid.

According to a second aspect of the invention there is provided an attenuator for receiving an input radiation beam and outputting an output radiation beam, the attenuator comprising: the adjustable diffraction grating according to the first aspect of the invention; and a blocking member which is positioned in the far field of the optical element such that at least one of the sub-beams passes the blocking member to form the output radiation beam and at least one of the sub-beams is blocked by the blocking member.

The second aspect of the present invention provides a simple and convenient mechanism for attenuating an input radiation beam.

The attenuator may further comprise a sensor operable to determine a quantity indicative of the power of the output radiation beam.

The distortion mechanism may be operable to control the shape of the periodic structure in dependence on the quantity indicative of the power of the output radiation beam so as to control the power of the output radiation beam. The shape of the periodic structure may for example be controlled by controlling the amplitude of the periodic structure.

According to a third aspect of the invention there is provided a lithographic apparatus comprising: an attenuator according to the second aspect of the invention; an illumination system configured to condition the output radiation beam of the attenuator; a support structure constructed to support a patterning device, the patterning device being capable of imparting the output radiation beam with a pattern in its cross-section to form a patterned radiation beam; a substrate table constructed to hold a substrate; and a projection system configured to project the patterned radiation beam onto the substrate.

According to a fourth aspect of the invention there is provided a lithographic system comprising: a radiation source operable to produce a radiation beam; one or more lithographic apparatuses; and at least one attenuator according to the second aspect of the invention, said attenuator being arranged to receive at least a portion of the radiation beam produced by the radiation source and to provide the output radiation beam of the attenuator to at least one of the one or more lithographic apparatuses.

According to a fifth aspect of the invention there is provided a beam splitting apparatus for receiving an input radiation beam and outputting a plurality of output radiation beams, the beam splitting apparatus comprising: an optical element having an optical surface for receiving the input radiation beam, a periodic structure being provided on the optical surface which acts as a diffraction grating such that the input radiation beam is diffracted from the optical element to form a plurality of angularly separated output radiation beams; a distortion mechanism operable to distort the optical surface so as to control a shape of the periodic structure; and a controller; wherein the controller is operable to use the distortion mechanism to control the shape of the periodic structure so as to at least partially correct for changes in the relative output powers of the output radiation beams due to variation in the wavelength of the input radiation beam.

The beam splitting apparatus according to the fifth aspect of the present invention provides a convenient arrangement for splitting an input radiation beam into a plurality of output radiation beams. The input radiation beam may, for example, be output by a radiation source such as, for example, a free electron laser. The output radiation beams may each provide radiation for one or more lithographic tool. The beam splitting apparatus according to the fifth aspect of the present invention may therefore be used within a beam delivery system of a lithographic system.

The angular separation of the output radiation beams is dependent on the orientation of the input radiation beam with respect to the periodic grating structure (e.g. the grazing incidence angle), a pitch of the periodic structure, and a wavelength of the input radiation beam. The relative powers of the output radiation beams are dependent on the shape of the periodic structure and the wavelength of the input radiation beam. Therefore both the angular separation of the output radiation beams and the relative powers of the output radiation beams are dependent on the wavelength of the input radiation beam. The beam splitting apparatus according to the fifth aspect of the present invention allows the relative powers of the plurality of output radiation beams to remain substantially unaffected by any drift in the wavelength of the input radiation beam over time.

The beam splitting apparatus may further comprise a sensor operable to determine a wavelength of the input radiation beam.

The beam splitting apparatus may further comprise a sensor operable to determine a quantity indicative of the power of one of the output radiation beams.

The distortion mechanism may be operable to control the shape of the periodic structure in dependence on: (a) the determined wavelength of the input radiation beam; and/or (b) the quantity indicative of the power of the output radiation beam so as to control the power of the output radiation beam. The shape of the periodic structure may for example be controlled by controlling the amplitude of the periodic structure.

According to a sixth aspect of the invention there is provided radiation system comprising: a radiation source operable to produce a main radiation beam; and the beam splitting apparatus of the fifth aspect of the invention arranged to receive the main radiation beam and to output a plurality of output radiation beams.

According to a seventh aspect of the invention there is provided a lithographic system comprising: a radiation source operable to produce a main radiation beam; a plurality of lithographic apparatuses; and a beam delivery system operable to receive the main radiation beam from the radiation source, split the main radiation beam into a plurality of separate branch radiation beams and to direct each of the branch radiation beams to a different one of the plurality of lithographic apparatuses, wherein the beam delivery system comprises a beam splitting apparatus according to the fifth aspect of the invention.

According to an eighth aspect of the invention there is provided a method for splitting an input radiation beam into a plurality of output radiation beams, the method comprising: providing an adjustable diffraction grating comprising an optical surface, a periodic structure being provided on the optical surface; directing the input radiation beam so as to illuminate the optical surface such that the input radiation beam is diffracted from the optical element to form a plurality of angularly separated output radiation beams; and controlling a shape of the periodic structure so as to at least partially correct for changes in the relative output powers of the output radiation beams due to variation in the wavelength of the input radiation beam.

According to a ninth aspect of the present invention there is provided an attenuator for receiving an input radiation beam and outputting an output radiation beam, the attenuator comprising: an optical element having an optical surface for receiving the input radiation beam; a distortion mechanism operable to distort the optical surface to form a periodic structure on the optical surface which acts as a diffraction grating such that the input radiation beam is diffracted from the optical element to form a plurality of angularly separated sub-beams; and a blocking member which is positioned in the far field of the optical element such that at least one of the sub-beams passes the blocking member to form the output radiation beam and at least one of the sub-beams is blocked by the blocking member; wherein the distortion mechanism is operable to control the amplitude of the periodic structure so as to control the power of the output radiation beam.

The ninth aspect of the present invention provides a simple mechanism for attenuating an input radiation beam. Since the optical element remains fixed and only the amplitude of the periodic structure is used to control the power of the output radiation beam, the attenuator can operate at high speeds with short response times. Further, there is no limit on the angle at which the input radiation beam is incident upon the optical element. This allows the attenuator to operate at very small grazing incidence angles, decreasing the minimum attenuation that is achieved by the attenuator.

The distortion mechanism may comprise one or more actuators that are operable to induce a surface acoustic wave on the optical surface, the adjustable periodic structure on the optical surface comprising the surface acoustic wave.

The optical element may comprise a layer of piezoelectric material and the one or more actuators may comprise a transducer, the transducer comprising two electrodes provided on the piezoelectric material, the two electrodes being connected to an alternating power source.

The one or more actuators may comprise two such transducers provided on the piezoelectric material along opposing sides of the optical surface. With such an arrangement, for an optical element of fixed length, there is less variation in the amplitude of the surface acoustic waves formed on the optical surface than there would be with an arrangement comprising only one transducer.

The or each transducer may be disposed adjacent to a side of the optical surface which is generally parallel to a minor axis of a beam spot region formed by the input radiation beam on the optical surface.

The power required to achieve a given amplitude of surface acoustic waves is dependent upon the length of the electrodes of the transducer, since this determines the area over which the acoustic energy is spread. By arranging the or each transducer adjacent to a side of the optical surface which is generally parallel to the minor axis of the beam spot region the length of the electrodes is minimised and, therefore, the power required to achieve a given amplitude of surface acoustic waves is minimised. Further, the effective pitch of the adjustable periodic structure on the optical surface is maximised.

The transducer may be an interdigitated transducer.

The transducer may be arranged to produce surface acoustic waves that propagate across the optical surface at an oblique angle with respect to a major axis of a beam spot region formed by the input radiation beam on the optical surface. By arranging the direction of propagation of the surface acoustic waves at an oblique angle to the major axis of the beam spot region, the propagation distance of the surface acoustic waves is reduced (compared to an arrangement wherein the propagation direction is parallel to the major axis). Advantageously, this reduction in propagation distance results in: (a) a smaller response time for the distortion mechanism; and (b) less attenuation of the surface acoustic waves (and therefore less variation in the amplitude of the surface acoustic waves formed on the optical surface).

For example, the transducer may comprise a plurality of electrodes arranged along one side of the optical element, each of the plurality of electrodes comprising a spine section and a plurality of parallel, evenly spaced fingers extending from, and generally perpendicular to, its spine section wherein the spine section of each electrode may be arranged at an oblique angle with respect to a major axis of a beam spot region formed by the input radiation beam on the optical surface.

The piezoelectric material may be quartz. Quartz has a high Q-factor and therefore, advantageously, the use of quartz results in less attenuation of the surface acoustic waves (and therefore less variation in the amplitude of the surface acoustic waves formed on the optical surface).

The optical element may be provided with a plurality of closed channels below the optical surface, above each closed channel the optical surface may be formed from a membrane of material, and the distortion mechanism may comprise one or more actuators that are operable to distort the membranes over the closed channels so as to control the shape of the optical surface.

The one or more actuators may be operable to control a pressure difference between the interior of the closed channels and the optical surface.

The closed channels may be filled with a fluid and the distortion mechanism may comprise one or more actuators that are operable to control the pressure of the fluid within the plurality of closed channels.

A piezoelectric element may be provided within each of the closed channels, said piezoelectric element being operable to distort the membranes over the closed channels so as to control the shape of the optical surface.

An electrostatic actuator may be provided within each of the closed channels, said electrostatic actuator being operable to distort the membranes over the closed channels so as to control the shape of the optical surface.

The attenuator may further comprise a sensor operable to determine a quantity indicative of the power of the output radiation beam.

The distortion mechanism may be operable to control the amplitude of the periodic structure in dependence on the quantity indicative of the power of the output radiation beam so as to control the power of the output radiation beam.

According to a tenth aspect of the present invention there is provided a lithographic apparatus comprising: an attenuator according to the ninth aspect of the present invention; an illumination system configured to condition the output radiation beam of the attenuator; a support structure constructed to support a patterning device, the patterning device being capable of imparting the output radiation beam with a pattern in its cross-section to form a patterned radiation beam; a substrate table constructed to hold a substrate; and a projection system configured to project the patterned radiation beam onto the substrate.

According to a eleventh aspect of the present invention there is provided a lithographic system comprising: a radiation source operable to produce a radiation beam; one or more lithographic apparatuses; and at least one attenuator according to the ninth aspect of the present invention, said attenuator being arranged to receive at least a portion of the radiation beam produced by the radiation source and to provide the output radiation beam of the attenuator to at least one of the one or more lithographic apparatuses.

According to a twelfth aspect of the present invention there is provided an attenuation method, comprising: providing an optical element having an optical surface for receipt of an input radiation beam; distorting the optical surface to form an adjustable periodic structure on the optical surface which acts as a diffraction grating such that the input radiation beam is diffracted from the optical element to form a plurality of angularly separated sub-beams; determining a quantity indicative of the power of the output radiation beam; and controlling the amplitude of the periodic structure in dependence on the quantity indicative of the power of the output radiation beam so as to control the power of the output radiation beam.

According to a thirteenth aspect of the present invention there is provided a beam splitting apparatus for receiving an input radiation beam and outputting a plurality of output radiation beams, the beam splitting apparatus comprising: an optical element having an optical surface for receipt of the input radiation beam; a distortion mechanism operable to distort the optical surface to form an adjustable periodic structure on the optical surface which acts as a diffraction grating such that the input radiation beam is diffracted from the optical element to form a plurality of angularly separated output radiation beams, wherein the distortion mechanism is operable to control the amplitude of the periodic structure so as to control the relative powers of the plurality of output radiation beams.

One or more aspects of the invention may be combined with any one or more other aspects described herein, and/or with any one or more features described in the preceding or following description.

BRIEF DESCRIPTION OF THE DRAWINGS

Embodiments of the invention will now be described, by way of example only, with reference to the accompanying schematic drawings, in which:

FIG. 7a shows an embodiment of an optical element and a distortion mechanism that may form part of the attenuator of FIGS. 5 and 5a;

FIG. 8a shows an alternative embodiment of an optical element and a distortion mechanism that may form part of the attenuator of FIGS. 5 and 5a;

FIG. 9 shows an alternative embodiment of a distortion mechanism that may form part of the attenuator of FIGS. 5 and 5a;

FIG. 10 is a schematic partial cross section of a portion of an optical element which may form part of the attenuator of FIGS. 5 and 5a;

FIG. 13b shows a second cross sectional view of a portion of the first embodiment of the optical element of FIG. 10 as shown in FIG. 13a.

FIG. 19b is a plan view of the optical element of FIG. 19a;

FIG. 19c is a side view of the optical element of FIG. 19a;

FIG. 21b is a cross sectional view of the optical element and actuator of FIG. 21a.

DETAILED DESCRIPTION

Figure 1:
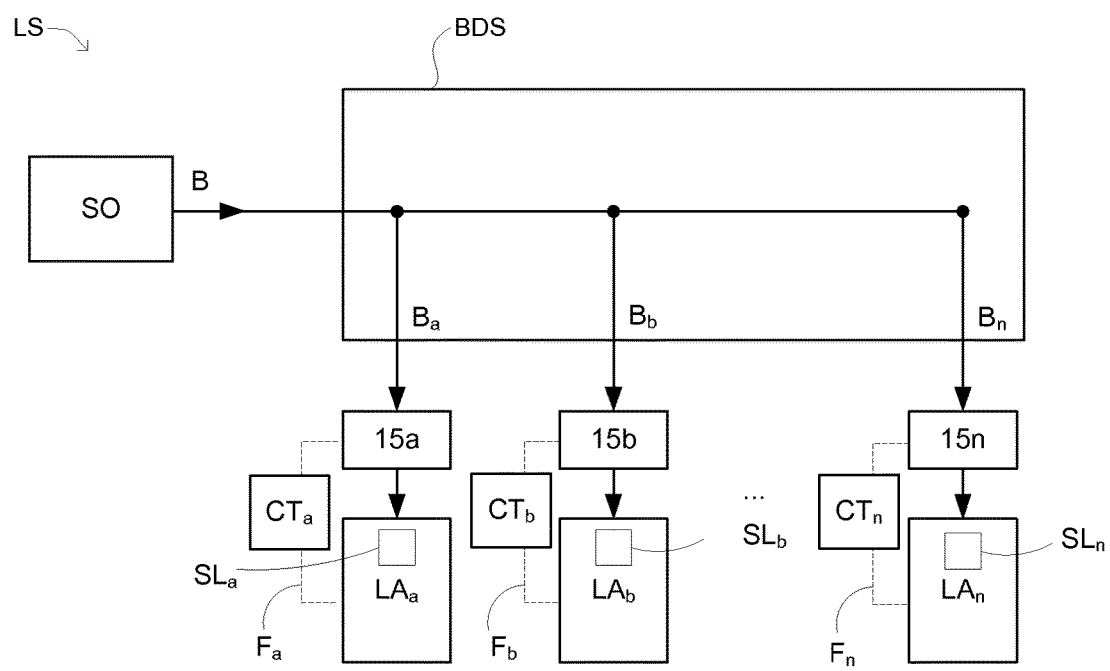
FIG. 1 is a schematic illustration of a lithographic system according to an embodiment of the invention.

FIG. 1 shows a lithographic system LS according to one embodiment of the invention. The lithographic system LS comprises a radiation source SO, a beam delivery system BDS and a plurality of lithographic tools $LA_a$-$LA_n$. The radiation source SO is configured to generate an extreme ultraviolet (EUV) radiation beam B (which may be referred to as a main beam) and may, for example, comprise at least one free electron laser. Each of the lithographic tools may be any tool which receives a radiation beam. The tools $LA_a$-$LA_n$ are generally referred to herein as lithographic apparatuses, although it will be appreciated that the tools are not so limited. For example, the tools may comprise lithographic apparatuses, mask inspection apparatuses, Arial Image Measurement Systems (AIMS).

The beam delivery system BDS comprises beam splitting optics. The beam splitting optics splits main radiation beam B into n separate radiation beams $B_a$-$B_n$ (which may be referred to as branch beams), each of which is directed to a different one of the n lithographic apparatuses $LA_a$-$LA_n$.

The beam delivery system BDS may further comprise beam expanding optics and/or beam shaping optics. The beam expanding optics may be arranged to increase the cross sectional area of the main radiation beam B and/or the branch radiation beam $B_a$-$B_n$. This decreases the power density of the heat load on mirrors downstream of the beam expanding optics. This may allow the mirrors downstream of the beam expanding optics to be of a lower specification, with less cooling, and therefore less expensive. Further, the lower power density on such mirrors results in less deformation of their optical surfaces due to thermal expansion. Additionally or alternatively, reducing the power density of the heat load on downstream mirrors may allow these mirrors to receive the main radiation beam or the branch radiation beams at a larger grazing incidence angle. For example, the mirrors may receive radiation at a grazing incidence angle of 5 degrees rather than, say, 2 degrees. The beam shaping optics may be arranged to alter the cross sectional shape and/or the intensity profile of the main radiation beam B and/or the branch radiation beams.

In alternative embodiments, the beam delivery system BDS may not comprise beam expanding optics or beam shaping optics.

In some embodiments, the beam delivery system BDS may comprise beam reducing optics, which may be arranged to decrease the cross sectional area of one or more of the main radiation beam B and/or the branch radiation beams. As discussed above, beam expanding optics may reduce the power density of the heat load received by mirrors within the beam delivery system BDS, which may be desirable. However, beam expanding optics will also increase the size of said mirrors, which may be undesirable. Beam expanding optics and beam reducing optics may be used to reach a desired beam size, which may be the smallest beam cross section that results in optical aberrations below a given threshold level.

Figure 2:
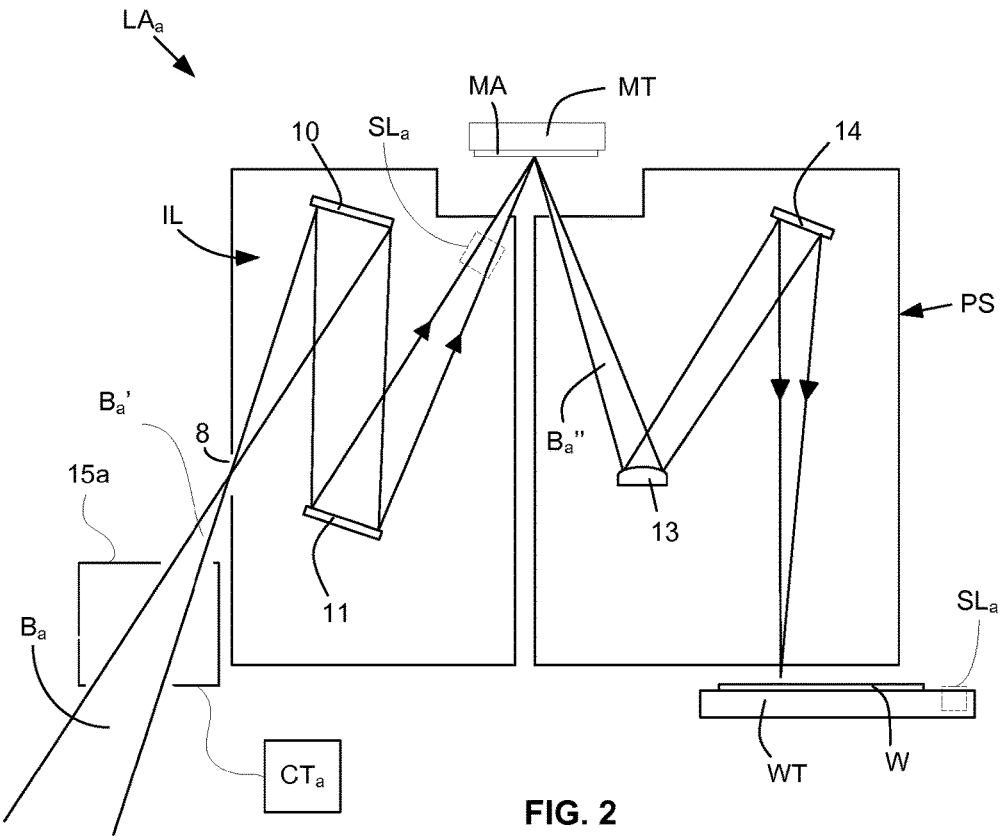
FIG. 2 is a schematic illustration of a lithographic apparatus that may form part of the lithographic system of FIG. 1.

Referring to FIG. 2, a lithographic apparatus $LA_a$ comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus $LA_a$ before it is incident upon the patterning device MA. The projection system PS is configured to project the radiation beam $B_a"$ (now patterned by the patterning device MA) onto the substrate W. The substrate W may include previously formed patterns. Where this is the case, the lithographic apparatus aligns the patterned radiation beam $B_a"$ with a pattern previously formed on the substrate W.

The branch radiation beam $B_a$ that is received by the lithographic apparatus $LA_a$ passes into the illumination system IL from the beam delivery system BDS though an opening 8 in an enclosing structure of the illumination system IL. Optionally, the branch radiation beam $B_a$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_a$ with a desired cross-sectional shape and a desired angular distribution. The radiation beam $B_a$ passes from the illumination system IL and is incident upon the patterning device MA held by the support structure MT. The patterning device MA reflects and patterns the radiation beam to form a patterned beam $B_a"$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be microelectromechanical systems (MEMS) devices.

Following redirection (e.g. reflection) from the patterning device MA the patterned radiation beam $B_a"$ enters the projection system PS. The projection system PS comprises a plurality of mirrors 13, 14 which are configured to project the radiation beam $B_a"$ onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The lithographic apparatus $LA_a$ is operable to impart a radiation beam $B_a'$ with a pattern in its cross-section and project the patterned radiation beam onto a target portion of a substrate thereby exposing a target portion of the substrate to the patterned radiation. The lithographic apparatus $LA_a$ may, for example, be used in a scan mode, wherein the support structure MT and the substrate table WT are scanned synchronously while a pattern imparted to the radiation beam $B_a''$ is projected onto a substrate W (i.e. a dynamic exposure). The velocity and direction of the substrate table WT relative to the support structure MT may be determined by the demagnification and image reversal characteristics of the projection system PS. The patterned radiation beam $B_a''$ which is incident upon the substrate W may comprise a band of radiation. The band of radiation may be referred to as an exposure slit. During a scanning exposure, the movement of the substrate table WT and the support structure MT are such that the exposure slit travels over a target portion of substrate W thereby exposing the target portion of the substrate W to patterned radiation. It will be appreciated that a dose of radiation to which a given location within the target portion of the substrate W is exposed depends on the power of the radiation beam $B_a''$ and the amount of time for which that location is exposed to radiation as the exposure slit is scanned over the location (the effect of the pattern is neglected in this instance). The term "target location" may be used to denote a location on the substrate which is exposed to radiation (and for which the dose of received radiation may be calculated).

In an embodiment, the branch radiation beams $B_a$-$B_n$ are each directed through a respective attenuator 15a-15n before entering a respective lithographic apparatus $LA_a$-$LA_n$. Each attenuator 15a-15n is arranged to adjust the intensity of a respective branch radiation beam $B_a$-$B_n$ before the branch radiation beam $B_a$-$B_n$ passes into its corresponding lithographic apparatus $LA_a$-$LA_n$. Each attenuator 15a-15n may be considered to form part of its corresponding lithographic apparatus $LA_a$-$LA_n$. Alternatively, each attenuator 15a-15n may be considered to be separate from its corresponding lithographic apparatus $LA_a$-$LA_n$. Each attenuator 15a-15n may be controlled by a controller $CT_a$-$CT_n$ using feedback provided from a lithographic apparatus associated with that attenuator. For example, a lithographic apparatus $LA_n$ may include a sensor $SL_n$ which monitors the intensity of the branch radiation beam $B_n$ within that lithographic apparatus. The output from the sensor $SL_n$ may be used to control the attenuator 15$_n$. Thus a feedback-based control loop is provided, as indicated by the dashed line $F_n$. The sensor $SL_n$ may be provided at any suitable location in the lithographic apparatus $LA_n$. For example, the sensor $SL_n$ may be located after the projection system PS of the lithographic apparatus. The sensor $SL_n$ may for example be provided on the substrate table W, as indicated schematically by dashed line $SL_a$. Additionally or alternatively, the sensor $SL_n$ may be located before the projection system PS of the lithographic apparatus. For example, the sensor $SL_n$ may be located in the illumination system IL, as schematically indicated by dashed line $SL_a$, or between the illumination system IL and the support structure MT.

A target location on the substrate W may receive EUV radiation for an exposure time period, which may be around 1 ms or greater. In some embodiments, the exposure time may be of the order of tens of milliseconds, for example in the range of 50-100 ms. Controlling the power of EUV radiation delivered to a lithographic substrate via a feedback-based attenuator 15a-15n may provide improved consistency of exposure dose at target locations on a lithographic substrate. A feedback-based control loop operating at a frequency of 10 kHz or more will provide some control of exposure dose delivered in 1 ms. A feedback-based control loop operating at a frequency of 50 kHz or more will provide improved control of exposure dose delivered in 1 ms (it may allow fluctuations in the power of the EUV radiation beam to be smoothed out more completely). A feedback-based control loop operating at a frequency of around 100 kHz or more may provide still further improved control of exposure dose delivered in 1 ms. A feedback-based control loop operating at frequencies of 1 MHz or more may not provide any significant additional benefit in terms of dose control because the 1 ms exposure time is such that EUV radiation fluctuations at such frequencies will effectively be averaged out during the exposure time.

The radiation source SO, beam delivery system BDS and lithographic apparatus $LA_a$-$LA_n$ may all be constructed and arranged such that they can be isolated from the external environment. A vacuum may be provided in at least part of the radiation source SO, beam delivery system BDS and lithographic apparatuses $LA_a$-$LA_n$ so as to minimise the absorption of EUV radiation. Different parts of the lithographic system LS may be provided with vacuums at different pressures (i.e. held at different pressures which are below atmospheric pressure).

Referring again to FIG. 1, radiation source SO is configured to generate an EUV radiation beam B with sufficient power to supply each of the lithographic apparatus $LA_a$-$LA_n$. As noted above, the radiation source may comprise a free electron laser.

A free electron laser comprises an electron source, which is operable to produce a bunched relativistic electron beam, and a periodic magnetic field through which the bunches of relativistic electrons are directed. The periodic magnetic field is produced by an undulator and causes the electrons to follow an oscillating path about a central axis. As a result of the acceleration caused by the magnetic structure the electrons spontaneously radiate electromagnetic radiation generally in the direction of the central axis. The relativistic electrons interact with radiation within the undulator. Under certain conditions, this interaction causes the electrons to bunch together into microbunches, modulated at the wavelength of radiation within the undulator, and coherent emission of radiation along the central axis is stimulated.

The path followed by the electrons may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may emit elliptically polarized radiation, which may be desirable for exposure of a substrate W by some lithographic apparatus.

Figure 3:
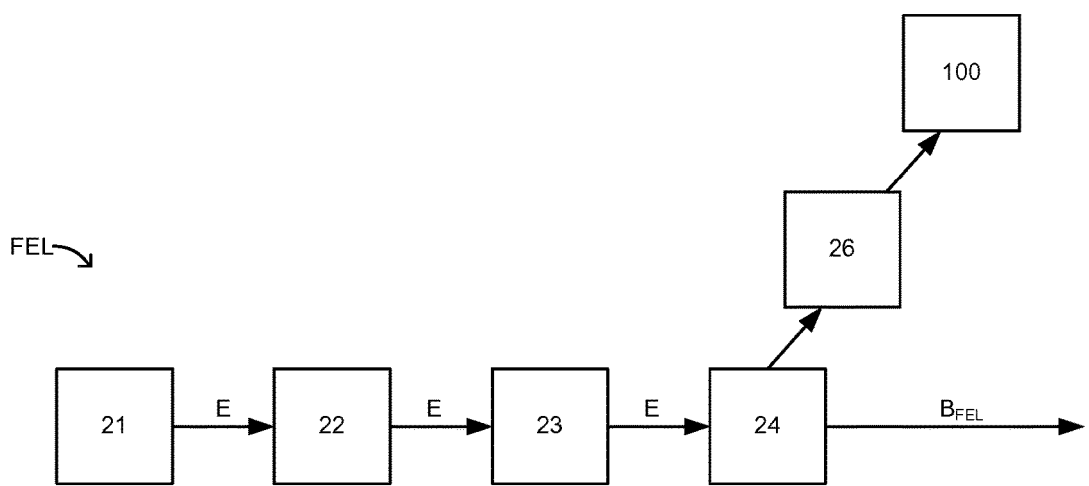
FIG. 3 is a schematic illustration of a free electron laser that may form part of the lithographic system of FIG. 1.

FIG. 3 is a schematic depiction of a free electron laser FEL comprising an injector 21, a linear accelerator 22, a bunch compressor 23, an undulator 24, an electron decelerator 26 and a beam dump 100.

The injector 21 is arranged to produce a bunched electron beam E and comprises an electron source such as, for example, a thermionic cathode or photo-cathode and an accelerating electric field. The injector 21 may comprise an electron gun and an electron booster. The electron gun may comprise a photocathode inside a vacuum chamber which is arranged to receive a pulsed laser beam. Photons in the laser beam are absorbed by the photocathode, excite electrons in the photocathode resulting in emission of some electrons from the photocathode. The photocathode is held at a high negative voltage (for example a voltage of the order of several hundred kilovolts) and thus serves to accelerate electrons which are emitted from the photocathode away from the photocathode, thereby forming a beam of electrons. Since the laser beam is pulsed, the electrons are emitted from the photocathode in bunches, which correspond to the pulses of the laser beam. The electron beam E which is emitted from the photocathode is accelerated by the electron booster. The electron booster may, for example, accelerate electron bunches to energies in excess of approximately 5 MeV. In some embodiments the electron booster may accelerate electron bunches to energies in excess of approximately 10 MeV. In some embodiments the electron booster may accelerate electron bunches to energies of up to approximately 20 MeV.

Electrons in the electron beam E are further accelerated by the linear accelerator 22. In an example, the linear accelerator 22 may comprise a plurality of radio frequency cavities, which are axially spaced along a common axis, and one or more radio frequency power sources, which are operable to control the electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the cavities may be conventionally conducting (i.e. not superconducting), and may be formed from, for example, copper.

The final energy of the beam E can be reached over several acceleration steps. For example, the beam E may be sent through a plurality of linear accelerator modules, which are separated by beam transport elements (bends, drift spaces, etc.). Alternatively, or additionally, the beam E may be sent through the same linear accelerator module repeatedly, with gains and/or losses of energy in the beam E corresponding to the number of repetitions. Other types of linear accelerators may also be used. For example, laser wake-field accelerators or inverse free electron laser accelerators may be used.

The injector 21 and the linear accelerator 22 may be considered to form an electron source operable to produce a bunched electron beam.

The electron beam E passes through a bunch compressor 23, disposed between the linear accelerator 22 and the undulator 24. The bunch compressor 23 is configured to bunch electrons in the electron beam E and spatially compress existing bunches of electrons in the electron beam E. One type of bunch compressor 23 comprises a radiation field directed transverse to the electron beam E. An electron in the electron beam E interacts with the radiation and bunches with other electrons nearby. Another type of bunch compressor 23 comprises a magnetic chicane, wherein the length of a path followed by an electron as it passes through the chicane is dependent upon its energy. This type of bunch compressor may be used to compress a bunch of electrons which have been accelerated in a linear accelerator 22 by a plurality of conductors whose potentials oscillate at, for example, radio frequencies.

The electron beam E then passes through the undulator 24. Generally, the undulator 24 comprises a plurality of modules. Each module comprises a periodic magnet structure, which is operable to produce a periodic magnetic field and is arranged so as to guide the relativistic electron beam E produced by the injector 21 and linear accelerator 22 along a periodic path within that module. As a result, within each undulator module, the electrons radiate electromagnetic radiation generally in the direction of a central axis of their periodic path through that module. The undulator 24 may further comprise a mechanism to refocus the electron beam E, such as a quadrupole magnet in between one or more pairs of adjacent modules. The mechanism to refocus the electron beam E may reduce the size of the electron bunches, which may improve the coupling between the electrons and the radiation within the undulator 24, increasing the stimulation of emission of radiation.

As electrons move through each undulator module, they interact with the electric field of the radiation, exchanging energy with the radiation. In general the amount of energy exchanged between the electrons and the radiation will oscillate rapidly unless conditions are close to a resonance condition, given by:

$$\lambda_{em} = \frac{\lambda_u}{2\gamma^2}\left(1 + \frac{K^2}{A}\right), \tag{1}$$

where $\lambda_{em}$ is the wavelength of the radiation, $\lambda_u$ is the undulator period for the undulator module that the electrons are propagating through, $\gamma$ is the Lorentz factor of the electrons and K is the undulator parameter. A is dependent upon the geometry of the undulator 24: for a helical undulator that produces circularly polarized radiation A=1, for a planar undulator A=2, and for a helical undulator which produces elliptically polarized radiation (that is neither circularly polarized nor linearly polarized) 1<A<2. In practice, each bunch of electrons will have a spread of energies although this spread may be minimized as far as possible (by producing an electron beam E with low emittance). The undulator parameter K is typically approximately 1 and is given by:

$$K = \frac{q\lambda_u B_o}{2\pi mc}, \tag{2}$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 24. The free electron laser FEL may operate as a recirculating amplifier free electron laser (RAFEL), wherein a portion of the radiation generated by the free electron laser FEL is used to seed further generation of radiation.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance. The radiation produced in the undulator 24 exits the undulator as radiation beam $B_{FEL}$, which may, for example, correspond to the radiation beam B in FIG. 1.

A region around a central axis of each undulator module may be considered to be a "good field region". The good field region may be a volume around the central axis wherein, for a given position along the central axis of the undulator module, the magnitude and direction of the magnetic field within the volume are substantially constant. An electron bunch propagating within the good field region may satisfy the resonant condition of Eq. (1) and will therefore amplify radiation. Further, an electron beam E propagating within the good field region should not experience significant unexpected disruption due to uncompensated magnetic fields.

Each undulator module may have a range of acceptable initial trajectories. Electrons entering an undulator module with an initial trajectory within this range of acceptable initial trajectories may satisfy the resonant condition of Eq. (1) and interact with radiation in that undulator module to stimulate emission of coherent radiation. In contrast, electrons entering an undulator module with other trajectories may not stimulate significant emission of coherent radiation.

For example, generally, for helical undulator modules the electron beam E should be substantially aligned with a central axis of the undulator module. A tilt or angle between the electron beam E and the central axis of the undulator module should generally not exceed $\frac{1}{10}\rho$, where $\rho$ is the Pierce parameter. Otherwise the conversion efficiency of the undulator module (i.e. the portion of the energy of the electron beam E which is converted to radiation in that module) may drop below a desired amount (or may drop almost to zero). In an embodiment, the Pierce parameter of an EUV helical undulator module may be of the order of 0.001, indicating that the tilt of the electron beam E with respect to the central axis of the undulator module should be less than 100 μrad.

For a planar undulator module, a greater range of initial trajectories may be acceptable. Provided the electron beam E remains substantially perpendicular to the magnetic field of a planar undulator module and remains within the good field region of the planar undulator module, coherent emission of radiation may be stimulated.

As electrons of the electron beam E move through a drift space between each undulator module, the electrons do not follow a periodic path. Therefore, in this drift space, although the electrons overlap spatially with the radiation, they do not exchange any significant energy with the radiation and are therefore effectively decoupled from the radiation.

The bunched electron beam E has a finite emittance and will therefore increase in diameter unless refocused. Therefore, the undulator 24 further comprises a mechanism for refocusing the electron beam E in between one or more pairs of adjacent modules. For example, a quadrupole magnet may be provided between each pair of adjacent modules. The quadrupole magnets reduce the size of the electron bunches and keep the electron beam E within the good field region of the undulator 24. This improves the coupling between the electrons and the radiation within the next undulator module, increasing the stimulation of emission of radiation.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator 24 in order to keep bunches of electrons at or close to resonance as they are guided though the undulator 24. The tapering may be achieved by varying the amplitude of the periodic magnetic field and/or the undulator period $\lambda_u$ within each undulator module and/or from module to module. Additionally or alternatively tapering may be achieved by varying the helicity of the undulator 24 (thereby varying the parameter A) within each undulator module and/or from module to module.

After leaving the undulator 24, the electron beam E is absorbed by a dump 100. The dump 100 may comprise a sufficient quantity of material to absorb the electron beam E. The material may have a threshold energy for induction of radioactivity. Electrons entering the dump 100 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It is desirable to reduce the energy of electrons in the electron beam E before they enter the dump 100. This removes, or at least reduces, the need to remove and dispose of radioactive waste from the dump 100. This is advantageous since the removal of radioactive waste requires the free electron laser FEL to be shut down periodically and the disposal of radioactive waste can be costly and can have serious environmental implications.

The energy of electrons in the electron beam E may be reduced before they enter the dump 100 by directing the electron beam E through a decelerator 26 disposed between the undulator 24 and the beam dump 100.

In an embodiment the electron beam E which exits the undulator 24 may be decelerated by passing the electrons back through the linear accelerator 22 with a phase difference of 180 degrees relative to radio frequency (RF) fields in the linear accelerator 22. The RF fields in the linear accelerator therefore serve to decelerate the electrons which are output from the undulator 24. As the electrons decelerate in the linear accelerator 22 some of their energy is transferred to the RF fields in the linear accelerator 22. Energy from the decelerating electrons is therefore recovered by the linear accelerator 22 and may be used to accelerate the electron beam E output from the injector 21. Such an arrangement is known as an energy recovering linear accelerator (ERL). An example of a free electron laser FEL using an ERL is shown in FIG. 4.

Figure 4:
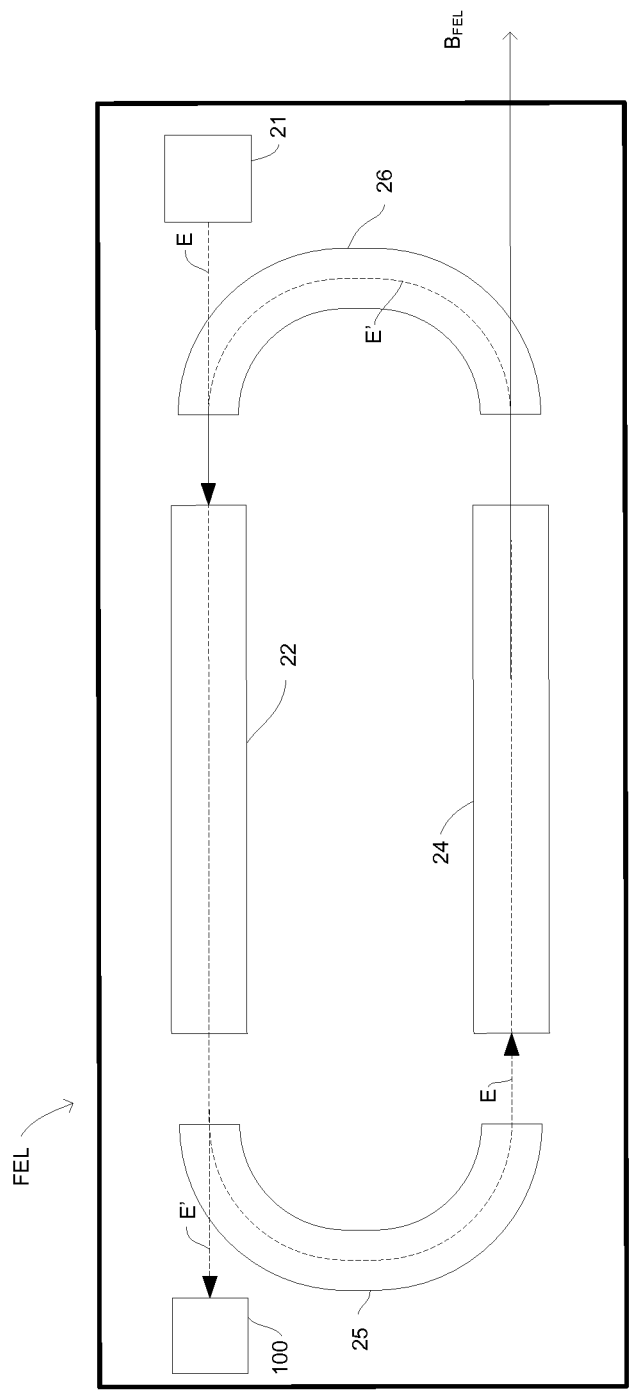
FIG. 4 is a schematic illustration of a free electron laser that may form part of the lithographic system of FIG. 1 and which uses an energy recovery LINAC.

Referring to FIG. 4, the relativistic electron beam E which exits the linear accelerator 22 enters a steering unit 25. The steering unit 25 is operable to alter the trajectory of the relativistic electron beam E so as to direct the electron beam E from the linear accelerator 22 to the undulator 24. The steering unit 25 may, for example, comprise one or more electromagnets and/or permanent magnets configured to generate a magnetic field in the steering unit 25. The magnetic field exerts a force on the electron beam E which acts to alter the trajectory of the electron beam E. The trajectory of the electron beam E upon leaving the linear accelerator 22 is altered by the steering unit 25 so as to direct the electrons to the undulator 24.

In embodiments in which the steering unit 25 comprises one or more electromagnets and/or permanent magnets, the magnets may be arranged to form one or more of a magnetic dipole, a magnetic quadrupole, a magnetic sextupole and/or any other kind of multipole magnetic field arrangement configured to apply a force to the electron beam E. The steering unit 25 may additionally or alternatively comprise one or more electrically charged plates, configured to create an electric field in the steering unit 25 such that a force is applied to the electron beam E. In general the steering unit 25 may comprise any apparatus which is operable to apply a force to the electron beam E to alter its trajectory.

In the embodiment of a free electron laser which is depicted in FIG. 4, the electron beam E' which leaves the undulator 24 enters a second steering unit 26. The second steering unit 26 alters the trajectory of the electron beam E' which leaves the undulator 24 so as to direct the electron beam E' back through the linear accelerator 22. The second steering unit 26 may be similar to the steering unit 25 and may, for example, comprise one or more electromagnets and/or permanent magnets. The second steering unit 26 does not affect the trajectory of the radiation beam $B_{FEL}$ which leaves the undulator 24. The steering unit 25 therefore decouples the trajectory of the electron beam E' from the radiation beam $B_{FEL}$. In some embodiments, the trajectory of the electron beam E' may be decoupled from the trajectory of the radiation beam $B_{FEL}$ (e.g. using one or more magnets) before reaching the second steering unit 26.

The second steering unit 26 directs the electron beam E' to the linear accelerator 22 after leaving the undulator 24. Electron bunches which have passed through the undulator 24 may enter the linear accelerator 22 with a phase difference of approximately 180 degrees relative to accelerating fields in the linear accelerator 22 (e.g. radio frequency fields). The phase difference between the electron bunches and the accelerating fields in the linear accelerator 22 causes the electrons to be decelerated by the fields. The decelerating electrons E' pass some of their energy back to the fields in the linear accelerator 22 thereby increasing the strength of the fields which accelerate the electron beam E arriving from the electron source 21. This arrangement therefore recovers some of the energy which was given to electron bunches in the linear accelerator 22 (when they were accelerated by the linear accelerator) in order to accelerate subsequent electron bunches which arrive from the electron source 21. Such an arrangement may be known as an energy recovering LINAC.

Electrons E' which are decelerated by the linear accelerator 22 are absorbed by beam dump 100. The steering unit 25 may be operable to decouple the trajectory of the electron beam E' which has been decelerated by the linear accelerator 22 from the trajectory of the electron beam E which has been accelerated by the linear accelerator 22. This may allow the decelerated electron beam E' to be absorbed by the beam dump 100 whilst the accelerated electron beam E is directed to the undulator 24.

The free electron laser FEL may comprise a beam merging unit (not shown) which substantially overlaps the trajectories of the beam E coming from the source 21 and the beam E' coming from the steering unit 26. The merging is possible due to the fact that prior to acceleration by the accelerator 22, the energy of the beam E is significantly smaller than the energy of the beam E'. The trajectory of the accelerated electron beam E may be decoupled from the trajectory of the decelerated electron beam E' by generating a substantially constant magnetic field. The difference in energies between the accelerated electron beam E and the decelerated electron beam E' causes the trajectories of the two electron beams to be altered by different amounts by the constant magnetic field. The trajectories of the two electron beams will therefore become decoupled from each other.

Alternatively, the steering unit 25 may, for example, be operable to generate a periodic magnetic field which has a substantially constant phase relationship with the electron bunches which form the accelerated electron beam E and the decelerated electron beam E'. For example at times at which electron bunches from the accelerated electron beam E enter the steering unit 25, the steering unit 25 may generate a magnetic field which acts to direct the electrons to the undulator 24. At times at which electron bunches from the decelerated electron beam E' enter the steering unit 25, the steering unit 25 may generate a magnetic field which acts to direct the electrons to the beam dump 100. Alternatively, at times at which electron bunches from the decelerated electron beam E' enter the steering unit 25, the steering unit 25 may generate little or no magnetic field such that the electrons pass out of the steering unit 25 and to the beam dump 100.

Alternatively the free electron laser FEL may comprise a beam splitting unit (not shown) which is separate from the steering unit 25 and which is configured to decouple the trajectory of the accelerated electron beam E from the trajectory of the decelerated electron beam E' upstream of the steering unit 25. The beam splitting unit may, for example, be operable to generate a periodic magnetic field which has a substantially constant phase relationship with the electron bunches which form the accelerated electron beam E and the decelerated electron beam E'.

When operating as a decelerator, the linear accelerator 22 may be operable to reduce the energy of the electrons E' to below a threshold energy. Electrons below this threshold energy may not induce any significant level of radioactivity in the beam dump 100.

In some embodiments a decelerator (not shown) which is separate to the linear accelerator 22 may be used to decelerate the electron beam E' which has passed through the undulator 24. The electron beam E' may be decelerated by the decelerator in addition to being decelerated by the linear accelerator 22 or instead of being decelerated by the linear accelerator 22. For example, the second steering unit 26 may direct the electron beam E' through a decelerator prior to the electron beam E' being decelerated by the linear accelerator 22. Additionally or alternatively the electron beam E' may pass through a decelerator after having been decelerated by the linear accelerator 22 and before being absorbed by the beam dump 100. Alternatively the electron beam E' may not pass through the linear accelerator 22 after leaving the undulator 24 and may be decelerated by one or more decelerators before being absorbed by the beam dump 100.

The free electron laser FEL may form part of the lithographic system LS of FIG. 1, wherein radiation produced by the free electron laser is ultimately received by one or more substrates W within one or more lithographic apparatus $LA_a$-$LA_n$. These substrates W may be considered to comprise target portions which are arranged to receive patterned radiation. Within the lithographic system LS, radiation is transported from the free electron laser FEL to the substrates via: (i) beam delivery system BDS (for example comprising beam expanding optics and the beam splitting optics); and (ii) optics within the lithographic apparatuses $LA_a$-$LA_n$ (for example optics 10, 11, 13, 14). The beam delivery system BDS and the optics within a lithographic apparatus may be referred to as an optical path which is configured to transport radiation from the free electron laser FEL to a substrate W. The optical path reflects and/or transmits radiation so as to provide a dose of radiation at the substrate W. The fraction of the radiation beam B which propagates through the optical path and which is incident on a substrate W may be referred to as the transmittance of the optical path. It will be appreciated that an optical path may include reflective and/or transmissive elements and the transmittance of the optical path depends on the reflectivity of any reflective elements in the optical path as well as the transmittance of any transmissive elements in the optical path. The transmittance of the optical path may additionally depend on a matching of the cross-section of the radiation beam B with optical elements on which the radiation beam is incident in the optical path. For example, an optical element (e.g. a mirror) in the optical path may have a smaller cross-section than the cross-section of the radiation beam B which is incident on the optical element. Portions of the cross-section of the radiation beam B which lie outside of the cross-section of the optical element may therefore be lost from the radiation beam (e.g. by not being reflected by a mirror) and may therefore reduce the transmittance of the optical path.

It may be desirable to control the dose of radiation which is received by target locations on substrates W in the lithographic apparatus $LA_a$-$LA_n$ of the lithographic system LS. In particular it may be desirable to control the dose of radiation such that each target location of a given target portion on a substrate receives substantially the same dose of radiation (assuming that the patterning device MA does not significantly affect the dose of radiation). It may be particularly desirable to be able to control the dose of radiation received by target locations on substrate W in each lithographic apparatus $LA_a$-$LA_n$ independently of the dose of radiation received by target locations on substrates W in the other lithographic apparatus $LA_a$-$LA_n$.

As was described above with reference to FIG. 2, a dose of radiation which is received by a target location of a substrate W depends on the power of the radiation beam to which the target location is exposed (e.g. patterned radiation beam $B_a''$) and the amount of time for which the target location of the substrate W is exposed to the radiation beam. The power of a patterned radiation beam $B_a''$ in a lithographic apparatus $LA_a$ depends on the power of the radiation beam B which is emitted by the radiation source SO and the transmittance of the optical path between the radiation source SO and the substrate W. A dose of radiation which is received at a target location of a substrate W may therefore be controlled by controlling the power of the radiation beam B which is emitted from the radiation source SO and/or by controlling the transmittance of the optical path between the radiation source SO and the substrate W.

In an embodiment, the lithographic apparatus may be configured such that a target portion of a substrate W is exposed by scanning the substrate relative to a band of radiation which extends across the target portion transverse to the scanning direction. The band of radiation may be referred to as an exposure slit. The dose of radiation received at a target location on the substrate W depends on an exposure time period during which a radiation beam (e.g. patterned radiation beam $B_a''$) is directed onto that target location, and the number and duration of pulses which occur in the radiation beam during the exposure time period. For example, in a scanning lithographic apparatus, the amount of time for which a target location of the substrate W is exposed to a radiation beam depends on the time taken for the exposure slit to travel over that location. The dose of radiation which is received at the target location depends upon the number of pulses of the radiation beam which occur during that exposure time period and the average energy which is delivered to the target location with each pulse. In an embodiment, a wafer may be scanned relative to the exposure slit such that the exposure time period is approximately 1 ms. In other embodiments the exposure time period may be greater than 1 ms and may, for example, be as long as 5 ms (e.g. due to slower scanning movement of the wafer relative to the exposure slit). In other embodiments the exposure time period may be much longer than 1 ms, for example in the range of 50-100 ms.

Figure 5:
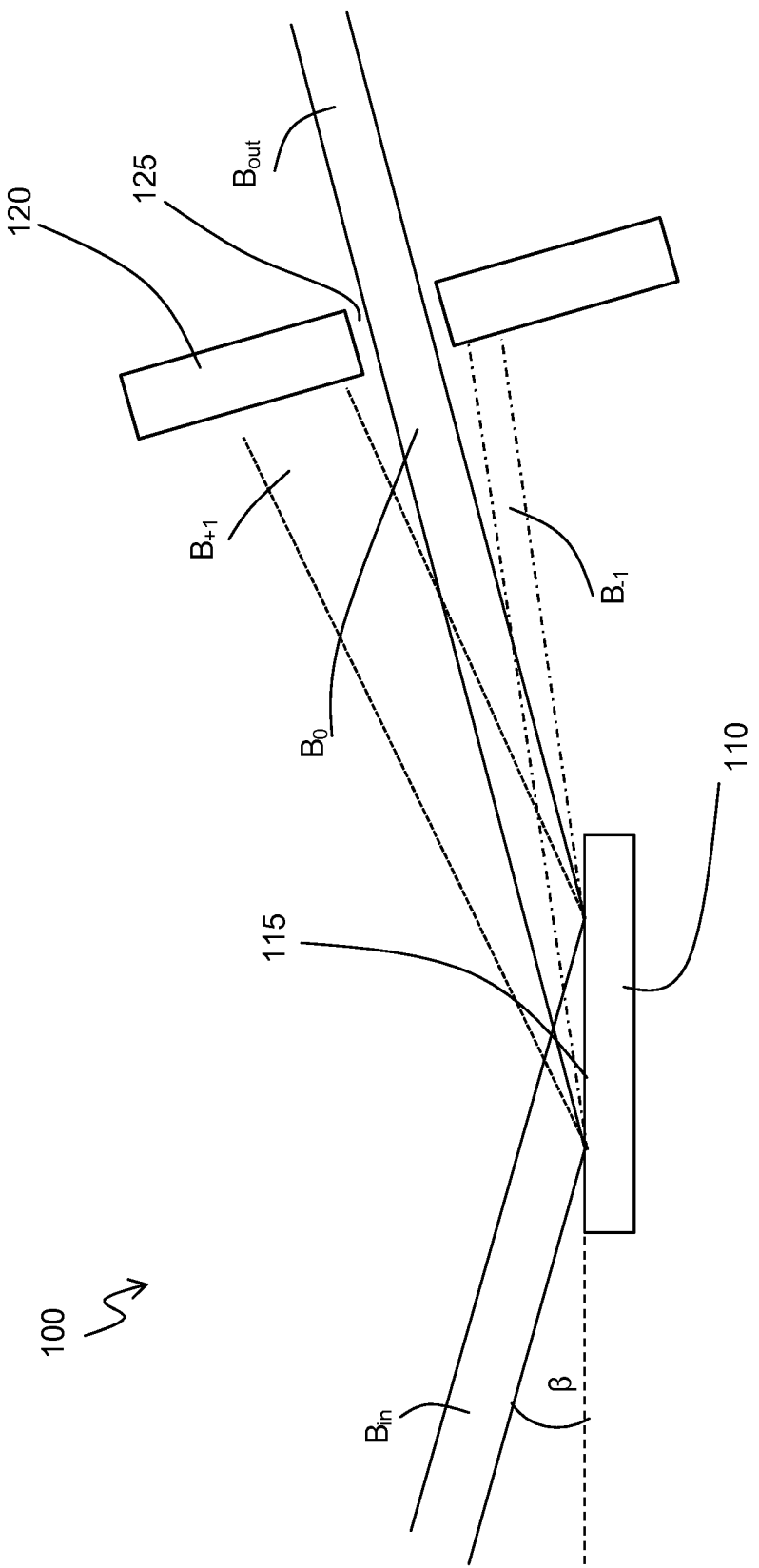
FIG. 5 is a schematic side view illustration of an attenuator that may form part of the lithographic system of FIG. 1.
Figure 5A:
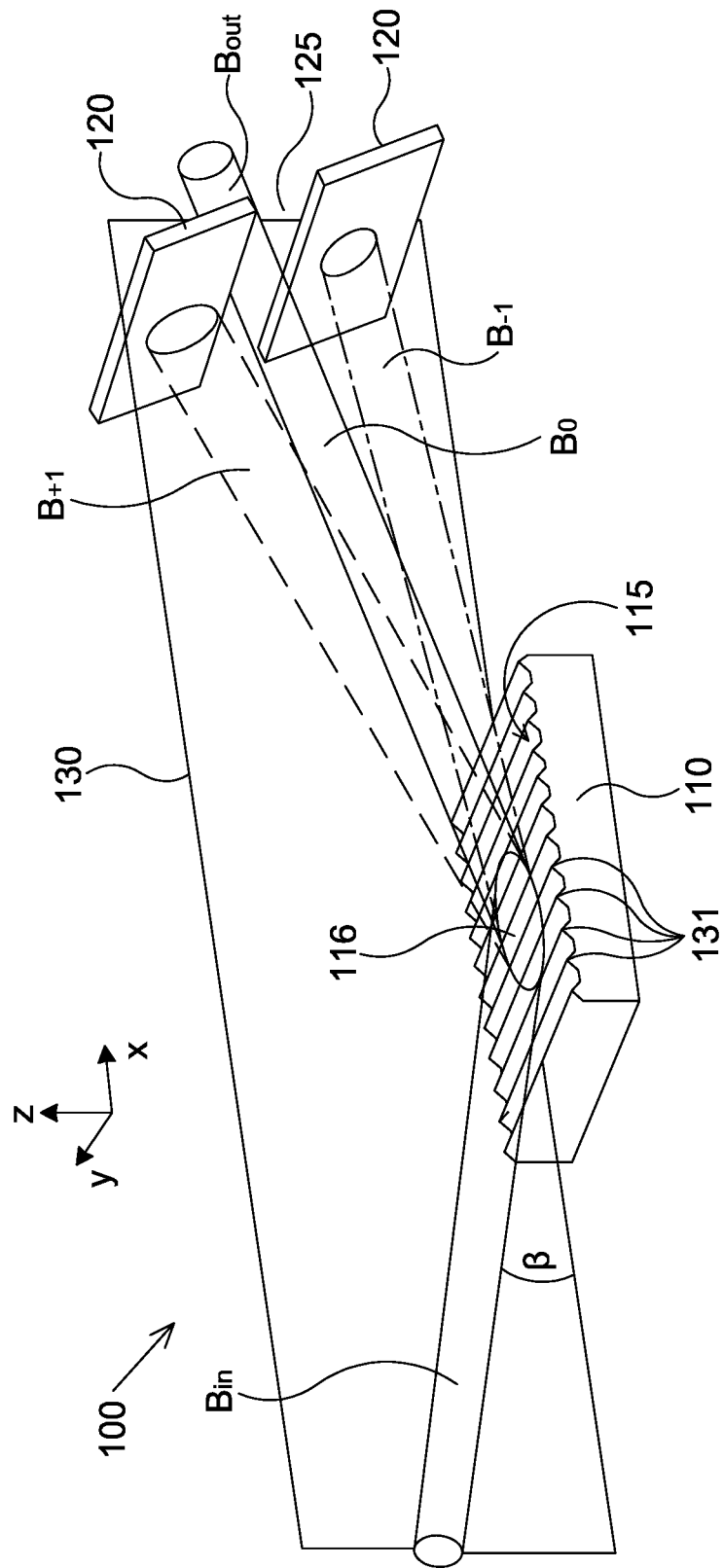
FIG. 5a is a schematic perspective view illustration of the attenuator of FIG. 5.

FIGS. 5 and 5a show an example of an attenuator 100 that may correspond with the attenuator 15a shown in FIGS. 1 and 2. Attenuator 100 comprises an optical element 110, which has a reflective optical surface 115. Optical surface 115 is arranged to receive an input radiation beam $B_{in}$. The input radiation beam $B_{in}$ may correspond with one of the branch radiation beams $B_a$-$B_n$ output by the beam delivery system BDS.

The optical surface 115 is formed from, or provided with a coating of, a material which is relatively reflective for the input radiation beam $B_{in}$, which may comprise EUV radiation. Suitable materials include ruthenium (Ru) and molybdenum (Mo).

Input radiation beam $B_{in}$ is incident on the optical surface 115 at a relatively small grazing incidence angle β. As the grazing incidence angle β is reduced, losses at the optical surface 115 from absorption are also reduced, increasing the efficiency of the attenuator 100. For example, at a grazing incidence angle β of 20°, for an optical surface 115 coated in ruthenium the optical surface 115 may have an efficiency of around 70%. The range of acceptable grazing incidence angles β may be dependent on the level of attenuation that can be tolerated. For example, the input radiation beam $B_{in}$ may be incident on the optical surface 115 at a grazing incidence angle β of around 5° or less. In some embodiments, the grazing incidence angle β may be around 2° or less. In some embodiments, the grazing incidence angle β may be around 1° or less. The input radiation beam $B_{in}$ may be generally circular in cross section and may have a diameter of the order of 10 mm. In some embodiments, the diameter of the input radiation beam may be in the range 5 mm to 20 mm. The generally circular input radiation beam $B_{in}$ will irradiate a generally elliptical region 116 of the optical surface 115, which may be referred to as a beam spot region. The length of the minor axis of the beam spot region 116 will be the diameter of the input radiation beam. The length of the major axis of the beam spot region 116 will be the ratio of the diameter of the input radiation beam to sin(β) or, for small angles, the ratio of the diameter of the input radiation beam to β (measured in radians). In order for the entire input radiation beam $B_{in}$ to irradiate the optical surface 115, the beam spot region 116 should be smaller than the optical surface 115. Therefore, the largest dimension of the optical surface 115 imposes an upper limit on the size of the major axis of the beam spot region 116. In turn, for a given diameter of the input radiation beam $B_{in}$, this imposes a lower limit on the grazing incidence angle β.

In some embodiments, the optical element 110 may be formed from a silicon wafer. The silicon wafer may, for example, have a diameter of 300 mm. For such embodiments, it may be desirable for the length of the major axis of the beam spot region 116 to be below, for example, 260 mm. For an input radiation beam $B_{in}$ with a diameter of 5 mm, this imposes a lower limit on the grazing incidence angle β of 1.1°; for an input radiation beam $B_{in}$ with a diameter of 10 mm it imposes a lower limit on the grazing incidence angle β of 2.2°; and for an input radiation beam $B_{in}$ with a diameter of 20 mm it imposes a lower limit on the grazing incidence angle β of 4.4°.

As will be described further below, attenuator 100 further comprises a distortion mechanism which is operable to distort the optical surface 115 to form an adjustable periodic structure on the optical surface 115. The periodic structure comprises a plurality of ridges 131 which extend across the optical surface 115. The periodic structure on the optical surface 115 acts as a diffraction grating such that the input radiation beam $B_{in}$ is diffracted from the optical element 110 to form a plurality of angularly separated sub-beams $B_0$, $B_{+1}$, $B_{-1}$. In a far field of the optical element 110, the sub-beams $B_0$, $B_{+1}$, $B_{-1}$ are spatially separated. Each sub-beam $B_0$, $B_{+1}$, $B_{-1}$ propagates in a different direction and corresponds to a different diffraction order. In the present application, unless stated otherwise, $B_m$ will be understood to refer to the sub-beam corresponding to the $m^{th}$ order diffraction beam. For example, sub-beam $B_0$ corresponds to the $0^{th}$ order diffraction beam, which forms the same angle with respect to the optical surface 115 as does the input radiation beam $B_{in}$. Although only the $0^{th}$, $+1^{st}$ and $-1^{st}$ diffraction orders are shown in FIG. 5, it will be understood that higher diffraction orders may also be present.

In FIG. 5a the optical element 110 is orientated relative to the input radiation beam $B_{in}$ such that the plane of incidence 130 (containing the propagation direction of the input radiation beam $B_{in}$ and the normal to the optical surface 115, i.e. the x-z plane in FIG. 5a) is generally perpendicular to the direction in which the plurality of ridges 131 extends the periodic structure extends (the y-direction in FIG. 5a). With such an arrangement the propagation direction of each sub-beam $B_0$, $B_{+1}$, $B_{-1}$ also lies in the plane 130. Therefore, such an arrangement may be referred to as planar diffraction.

When the plane of incidence 130 is not generally perpendicular to the direction in which the plurality of ridges 131 that form the periodic structure extends the outgoing sub-beam $B_0$, $B_{+1}$, $B_{-1}$ no longer lie in a plane but rather lie on the surface of a cone. Such an arrangement may be referred to as conical diffraction.

An advantage of the optical element 110 being orientated relative to the input radiation beam $B_{in}$ such that the plane of incidence 130 is generally perpendicular to the direction in which the plurality of ridges 131 that form the periodic structure extends is that the effective pitch of the adjustable periodic structure on the optical surface 115 seen by the input radiation beam $B_{in}$ is smaller for a given grating pitch on the optical surface 115. Therefore, with the orientation as shown in FIG. 5a a larger grating pitch can be used than would be necessary with other orientations. For planar diffraction, the effective pitch of the adjustable periodic structure on the optical surface 115 is given by the product of the pitch $\Lambda$ and $\sin(\beta)$ or, for small angles, the product of the pitch $\Lambda$ and $\beta$ (measured in radians).

It may be desirable for the orientation of the optical element 110 relative to the input radiation beam $B_{in}$ to be such that the product of and the grazing angle $\beta$ (in radians) and $\tan(\pi/2-\theta)$ is significantly smaller than 1, where $\theta$ is the angle between the plane of incidence 130 and the direction of the ridges 131. For example, for a grazing incidence angle of $\beta=35$ mrad (equivalent to 2°) and $\theta=\pi/4$, $\beta\cdot\tan(\theta)=0.035$, which is significantly smaller than 1.

The relative intensities of the plurality of sub-beams are dependent upon the shape of the adjustable periodic structure on the optical surface 115. In particular, the ratio of the power of sub-beam $B_0$ to the power of the input radiation beam $B_{in}$ is dependent upon the shape of the adjustable periodic structure on the optical surface 115 and the grazing incidence angle $\beta$. For a given pitch, the shape of the adjustable periodic structure on the optical surface 115 is dependent on the amplitude of the adjustable periodic structure. The ratio of the power of sub-beam $B_m$ to the power of the input radiation beam $B_{in}$ may be referred to as the relative power of sub-beam $B_m$. For a given grazing incidence angle $\beta$, as the amplitude of the periodic structure increases the relative power of each sub-beam $B_m$ will vary between local maxima and minima. The sum of the relative powers of all sub-beams $B_m$, (i.e. summed over all diffraction orders) is equal to the reflectance of the optical element 110. For sufficiently small grazing incidence angles $\beta$ the reflectance of the optical element 110 may be close to 1. For example, for embodiments wherein the optical surface 115 is provided with a coating of ruthenium and $\beta<0.2$ radians, the reflectance R of the optical element 110 may be approximately given by $R=1-0.75\beta$, where $\beta$ is in radians. Therefore, for an embodiment wherein the optical surface 115 is provided with a coating of ruthenium and $\beta=17$ mrad (equivalent to 1°), the reflectance R of the optical element 110 may be approximately given by $R=1-0.75\times0.017=0.987$.

Figure 6:
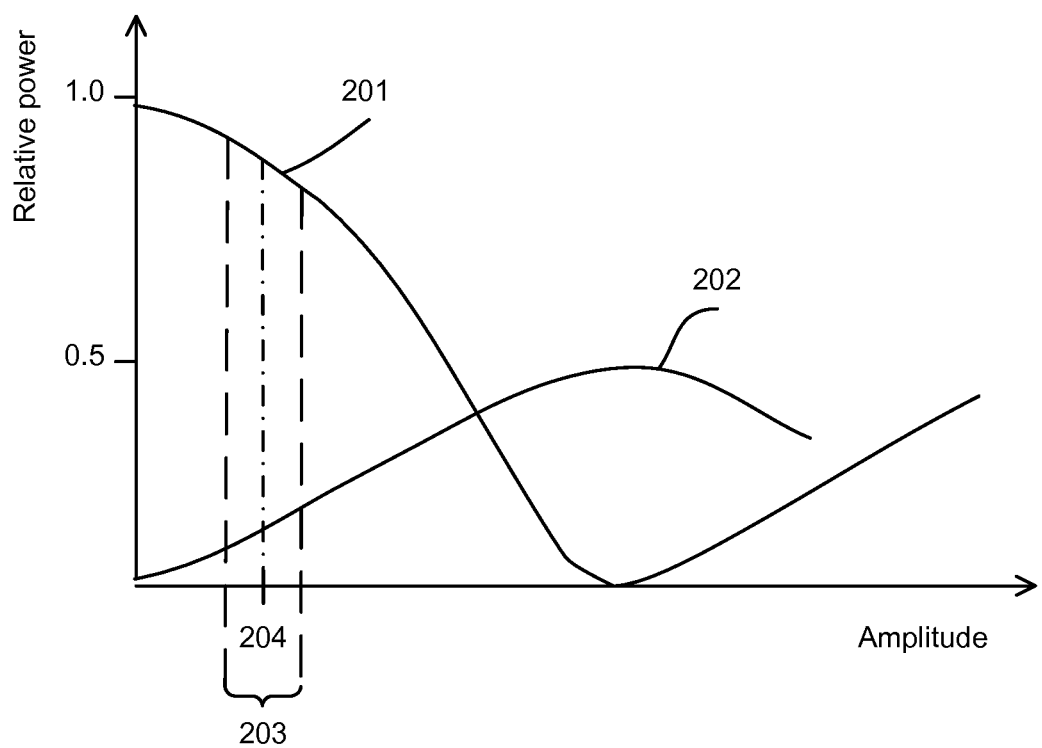
FIG. 6 shows the relative power of the $0^{th}$ and $1^{st}$ order diffraction beams formed by the attenuator of FIGS. 5 and 5a, as a function of the amplitude of a periodic structure on its optical surface.

FIG. 6 shows the relative power of sub-beams $B_0$, $B_{+1}$ and $B_{-1}$ as a function of the amplitude of the adjustable periodic structure on the optical surface 115 for a fixed grazing incidence angle $\beta$. The relative power of sub-beam $B_0$ as a function of the amplitude is given by curve 201 and the relative power of each sub-beam $B_{+1}$ and $B_{-1}$ as a function of the amplitude is given by curve 202. For small amplitudes, the relative power of sub-beam $B_0$ is close to 1 and the relative power of sub-beams $B_{+1}$ and $B_{-1}$ is close to 0. As the amplitude increases the relative power of sub-beam $B_0$ falls to zero and the relative power of each of sub-beams $B_{+1}$ and $B_{-1}$ rises to around 0.5.

The ratio of the power of sub-beam $B_m$ to the sum of the powers of all of the sub-beams $B_m$ may be referred to as the fractional power of sub-beam $B_m$. The sum of the fractional powers of all sub-beams $B_m$, (i.e. summed over all diffraction orders) is equal to 1.

Figure 6A:
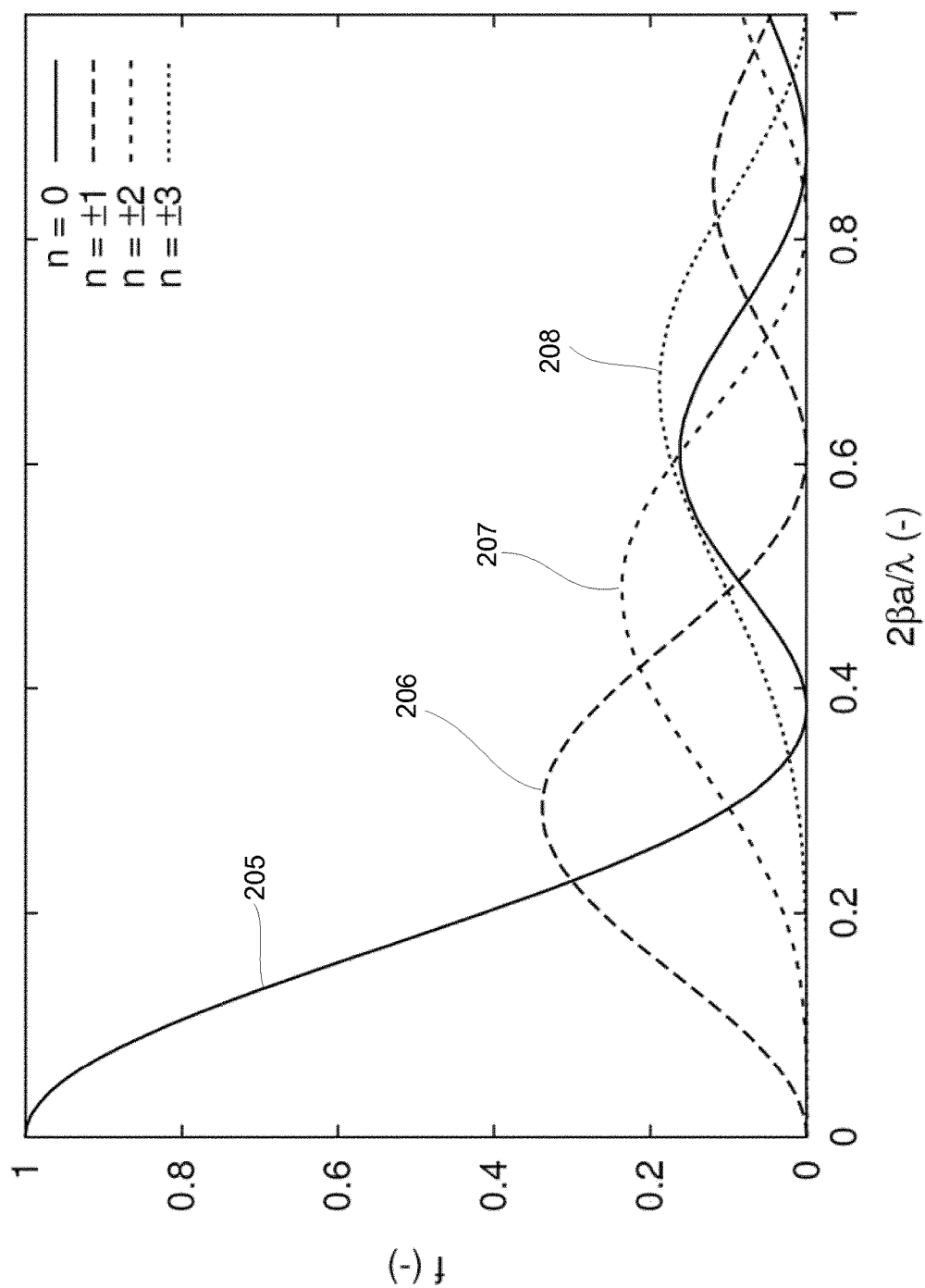
FIG. 6a shows the fractional power of the $0^{th}$, $1^{st}$, $2^{nd}$ and $3^{rd}$ order diffraction beams formed by the attenuator of FIGS. 5 and 5a for a sinusoidal periodic structure on the optical surface as a function of the amplitude of the sinusoidal periodic structure (for a fixed grazing incidence angle)

FIG. 6a shows the fractional power of the $0^{th}$, $1^{st}$, $2^{nd}$ and $3^{rd}$ order diffraction beams $B_0$, $B_{+1}$ and $B_{-1}$ for a sinusoidal periodic structure on the optical surface 115 as a function of the amplitude of the sinusoidal periodic structure (for a fixed grazing incidence angle $\beta$). The fractional power of sub-beam $B_0$ as a function of the amplitude is given by curve 205; the fractional power of each sub-beam $B_{+1}$ and $B_{-1}$ as a function of the amplitude is given by curve 206; the fractional power of each sub-beam $B_{+2}$ and $B_{-2}$ as a function of the amplitude is given by curve 207; and the fractional power of each sub-beam $B_{+3}$ and $B_{-3}$ as a function of the amplitude is given by curve 208. For small amplitudes, the fractional power of sub-beam $B_0$ is close to 1 and the fractional power of the higher order sub-beams is close to 0.

The angle $\alpha_m$ between each sub-beam $B_m$ and the optical surface 115 is dependent upon the pitch of the adjustable periodic structure on the optical surface 115 and the grazing incidence angle $\beta$. In particular, for planar diffraction the angle $\alpha_m$ between sub-beam $B_m$ and the optical surface 115 satisfies the following condition:

$$\frac{1}{\lambda}\cos(\alpha_m) = \frac{1}{\lambda}\cos(\beta) + \frac{m}{\Lambda}, \tag{3}$$

where $\lambda$ is the wavelength of the input radiation beam $B_{in}$, and $\Lambda$ is the pitch of the adjustable periodic structure on the optical surface 115. For conical diffraction Eq. (3) no longer holds. Rather, for conical diffraction $\cos(\alpha_m)$ should be replaced with $\cos(\varepsilon)\cos(\alpha_m)$ and $\cos(\beta)$ should be replaced with $\cos(\varepsilon)\cos(\beta)$, where $\varepsilon$ is the angle between the plane of incidence 130 and a plane perpendicular to the direction of the ridges 131. It can be seen from Eq. (3) that the angular separation between sub-beam $B_0$ and the sub-beams $B_{+1}$, $B_{-1}$ corresponding to higher order diffraction beams is dependent upon the wavelength of the input radiation beam $B_{in}$ and the effective pitch of the adjustable periodic structure on the optical surface 115 seen by the input radiation beam $B_{in}$. For planar diffraction the effective pitch of the adjustable periodic structure on the optical surface 115 is given by the product of the pitch $\Lambda$ and $\sin(\beta)$ or, for small angles, the product of the pitch $\Lambda$ and $\beta$ (measured in radians). It may be desirable for the effective pitch to be as small as possible so as to maximise the angular separation between sub-beam $B_0$ and sub-beams $B_{+1}$, $B_{-1}$. In particular, it may be desirable for the effective pitch to be of the order of the wavelength of the input radiation beam $B_{in}$. In some embodiments, the wavelength of the input radiation beam $B_{in}$ may be of the order or 13.5 nm, the grazing incidence angle $\beta$ may be of the order of 5° and the pitch of the adjustable periodic structure on the optical surface 115 may be, for example, of the order of 100 μm.

Attenuator 100 further comprises a wall 120 which is provided with an aperture 125. The wall 120 is positioned such that the sub-beam $B_0$ corresponding to the $0^{th}$ order diffraction passes through the aperture 125 and the sub-beams $B_{+1}$, $B_{-1}$ corresponding to higher order diffraction beams are incident on wall 120. That is, the wall 120 is positioned in the far field of optical element 110 such that sub beam $B_0$ is spatially separated from the sub-beams $B_{+1}$, $B_{-1}$ corresponding to higher order diffraction beams. Sub-beam $B_0$ passes through the aperture 125 in the wall 120 and forms an output radiation beam $B_{out}$ of the attenuator 100. The sub-beams $B_{+1}$, $B_{-1}$ corresponding to higher order diffraction beams are blocked by the wall 120. The wall 120 therefore acts as a blocking member which is positioned in the far field of the optical element 110 such that sub-beam $B_0$ passes the blocking member to form the output radiation beam $B_{out}$ and sub-beams $B_{+1}$, $B_{-1}$ are blocked by the blocking member. For example, sub-beams $B_{+1}$, $B_{-1}$ may be absorbed by the wall 120. Alternatively, sub-beams $B_{+1}$, $B_{-1}$ may be directed (for example by reflection) away from the output radiation beam $B_{out}$ by the wall 120. In alternative embodiments, rather than a wall 120 with an aperture 125, the blocking member may comprise a plurality of separate members, each arranged to block a different one of the sub-beams $B_{+1}$, $B_{-1}$ corresponding to higher order diffraction beams and sub-beam $B_0$ may pass between said separate members (see FIG. 5a).

In order for the sub beam $B_0$ to be spatially separated from the sub-beams $B_{+1}$, $B_{-1}$ corresponding to higher order diffraction beams, the separation distance between the centre of sub beam $B_0$ and each of the sub-beams $B_{+1}$, $B_{-1}$ should be greater than the diameter of the input radiation beam $B_{in}$. Therefore the minimum distance between the wall 120 and the optical surface 115 is dependent upon the diameter of the input radiation beam $B_{in}$ and the angular separation. Using a small angle approximation for the angular separation between sub-beam $B_0$ and the sub-beams $B_{+1}$, $B_{-1}$ corresponding to higher order diffraction beams, the minimum distance between the wall 120 and the optical surface 115 is given by the ratio of the diameter of the input radiation beam $B_{in}$ to the angular separation (measured in radians). It may be desirable to minimise the distance between the wall 120 and the optical surface 115 so as to minimise the size of attenuator 100.

In some embodiments, the distortion mechanism is operable to control the periodic structure on the optical surface 115 in dependence on the power of the output radiation beam $B_{out}$ so as to control the power of the output radiation beam $B_{out}$. The power of the output radiation beam $B_{out}$ is dependent upon the shape of the periodic structure on the optical surface 115 (which in turn is dependent on the amplitude of the periodic structure) and the grazing incidence angle $\beta$. The distortion mechanism may, for example, be controlled by one of the controllers $CT_a$-$CT_n$ of FIG. 1 in response to a signal output by sensor $SL_a$. The signal output by sensor $SL_a$ may be indicative of the power of output radiation beam $B_{out}$, which may be determined directly or indirectly (e.g. from a quantity indicative of the power). A quantity indicative of the power of a radiation beam may be any quantity from which the power of the radiation beam may be determined and may comprise, for example, the power of a fraction of the radiation beam that has been directed towards a sensor (e.g. sensor $SL_a$). Such controller may form part of attenuator 100 or, alternatively, may be separate from the attenuator 100. The pitch $\Lambda$ of the periodic structure on the optical surface 115 may remain fixed and the distortion mechanism may be operable to control the amplitude of the periodic structure in dependence on the power of the output radiation beam $B_{out}$ so as to control the power of the output radiation beam $B_{out}$.

In some embodiments, one of the controllers $CT_a$-$CT_n$ may be operable to control the distortion mechanism such that the amplitude of the periodic structure falls within a range that is centred on a nominal value which is close to but not equal to 0. For example, the amplitude of the periodic structure may be kept within range 203 indicated in FIG. 6, which is centred on nominal value 204. This allows the power of the output radiation beam $B_{out}$ to be increased or decreased as required or desired. In some embodiments, attenuator 100 may be operable to control the dose such that it can be varied by ±10% from a nominal value.

In summary, it may be desirable to minimise the effective grating pitch so as to maximise the angular separation between sub-beam $B_0$ and the sub-beams $B_{-0}$, $B_{-1}$ corresponding to higher order diffraction beams. This can be achieved by minimising the grazing incidence angle $\beta$ and/or the pitch $\Lambda$ of the periodic structure on the optical surface 115. The effective grating pitch should be small enough to ensure that there is a large number of grating periods in the elliptical beam spot region 116. For example, the effective grating pitch may be small enough to ensure that there is of the order of 100 grating periods or more, or of the order of 1000 grating periods of more, in the elliptical beam spot region 116. The minimum grazing incidence angle is determined by the dimensions of the optical surface 115 and the diameter of the input radiation beam $B_{in}$. Minimising the effective grating pitch so as to maximise the angular separation between sub-beam $B_0$ and the sub-beams $B_{-0}$, $B_{-1}$ corresponding to higher order diffraction beams reduces the physical size of the attenuator, which may be desirable.

In the absence of the adjustable periodic structure on the optical surface 115, the optical surface 115 may be generally flat.

Various different embodiments of distortion mechanisms that may form part of attenuator 100 are described below.

Figure 7A:
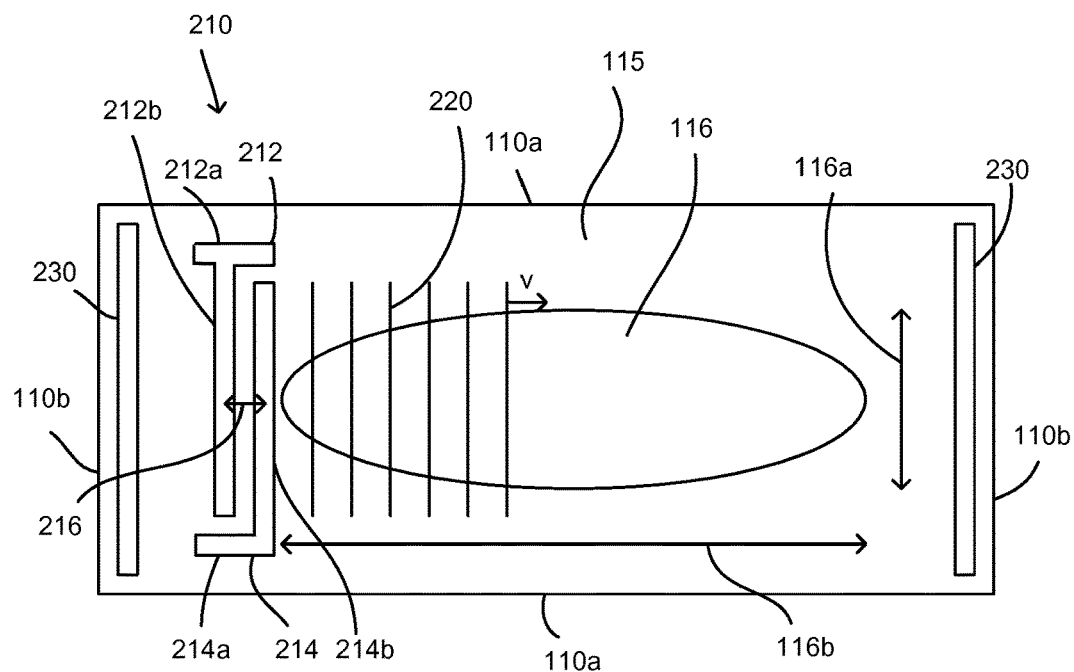

In one embodiment, the distortion mechanism comprises one or more actuators that are operable to induce a surface acoustic wave on the optical surface 115 of optical element 110. FIG. 7a shows such an arrangement.

As described above, the optical surface 115 of optical element 110 comprises a generally elliptical beam spot region 116, which is irradiated by the input radiation beam $B_{in}$. The length 116a of the minor axis of the beam spot region 116 is equal to the diameter of the input radiation beam $B_{in}$ and may be of the order of 10 mm. The length 116b of the major axis of the beam spot region is the ratio of the diameter of the input radiation beam to sin(β) and may be of the order of 260 mm. Since the major axis is significantly longer than the minor axis, the optical surface comprises two shorter sides 110b and two longer sides 110a.

The optical element 110 may be formed from a base layer which may be provided with a layer of piezoelectric material. Alternatively, the optical element may be formed from a piezoelectric material. Suitable piezoelectric materials may, for example, comprise silicon, lithium niobate ($LiNbO_3$) or quartz. A reflective coating may be provided on the piezoelectric material, at least over the beam spot region 116 on which the input beam $B_{in}$ is incident. The reflective coating may, for example, comprise ruthenium (Ru) or silicon carbide (SiC). In an embodiment, the optical element 110 may be formed from a silicon wafer, which may have a diameter of around 300 mm. For example, the generally rectangular optical element 110 may be formed by cutting a generally circular silicon wafer down in size. Therefore the longer sides 110a may be of the order of 300 mm in length. Optionally, for such embodiments the silicon may be provided with a layer of piezoelectric material such as, for example, lithium niobate ($LiNbO_3$) or quartz.

An transducer 210 is provided on the optical surface 115, adjacent to one of the shorter sides 110b.

The transducer 210 comprises two electrodes 212, 214 and an alternating current power supply (not shown) arranged to apply an alternating voltage across the two electrodes 212, 214. The electrodes 212, 214 may be formed on the piezoelectric material using standard lithographic techniques. Each electrode 212, 214 comprises a spine section 212a, 214a and a single finger 212b, 214b. The spine sections 212a, 214a are parallel to the longer sides 110a of the optical element 110 with spine section 212a extending partially along one longer side 110a and spine section 214a extending partially along the opposite longer side 110a of the optical element 110. Each of the fingers 212b, 214b is parallel to the shorter sides 110b of the optical element. The fingers 212b, 214b have a pitch 216. In alternative embodiments, transducer 210 may comprise an interdigitated transducer (IDT), wherein each electrode 212, 214 may comprise a plurality of parallel, evenly spaced fingers extending from its spine section 212a, 214a such that the transducer 210 comprises two interlocking comb-shaped electrodes. In such embodiments, the two electrodes are arranged such that there is a constant spacing between each pair of adjacent fingers (which are from different electrodes).

By applying the power supply across the two electrodes 212, 214, an alternating periodic potential is applied to the piezoelectric material. This causes an alternating periodic strain field, leading to the generation of acoustic waves that propagate away from the transducer 210 in all directions. The two electrodes 212, 214 are applied as relatively thin layers to the piezoelectric material of the optical surface 115. For example, in some embodiments, the electrodes 212, 214 may have thickness of the order of 100 nm. Therefore, a significant portion of said acoustic waves comprises surface acoustic waves (SAWs) which propagate in both directions away from the transducer 210. A portion of these surface acoustic waves therefore propagates across the optical surface 115 from the transducer 210 towards the opposite shorter side 110b of the optical element 110. This is indicated in FIG. 7a by a plurality of equally spaced wavefronts 220. In order to ensure that surface acoustic waves are generated across the entire beam spot region 116, each of the fingers 212b, 214b of the electrodes 212, 214 should be at least as long as the minor axis 116a of the beam spot region 116.

The frequency of the surface acoustic waves is determined by the frequency of the alternating voltage provided by the power supply. As indicated by arrow v on FIG. 7a, the surface acoustic waves propagate across the optical surface 115 at speed v, which is a property of the piezoelectric material of the optical surface 115. The wavelength of the surface acoustic waves is given by the ratio of the speed v to the frequency. For example, in one embodiment the piezoelectric material comprises quartz and the speed of surface acoustic waves in quartz is around 3000 m/s. For such embodiments, in order to achieve an alternating periodic structure on the optical surface 115 with a pitch of 100 μm the power supply should be operated at a frequency of around 30 MHz. It may be desirable to match the wavelength of the surface acoustic waves (i.e. the distance between two successive wavefronts) to the pitch 216 of the fingers 212b, 214b of the two electrodes 212, 214. For example, it may be desirable to ensure that the wavelength of the surface acoustic waves is approximately twice the pitch 216 of the two electrodes 212, 214.

The amplitude of the surface acoustic waves is dependent on the amplitude of the voltage applied by the power supply, the type of piezoelectric material and the spacing and the width of the electrodes of the transducer 210. The power supply should supply sufficient power to achieve the desired amplitude of surface acoustic waves within the beam spot region 116, taking into account all losses of power (i.e. power which is not converted into surface acoustic waves in the beam spot region 116).

The desired amplitude is dependent on the amount of attenuation desired (i.e. the desired relative power of sub-beam $B_0$). The power required in order to achieve a given amplitude of surface acoustic waves is dependent upon the length of each of the fingers 212b, 214b of the electrodes 212, 214, since this determines the area over which the acoustic energy is spread. As explained above, the minimum size of the fingers 212b, 214b is set by the length of the minor axis 116a of the beam spot region 116 or, equivalently, the diameter of the input radiation beam $B_{in}$. Therefore the power required is dependent on the diameter of the input radiation beam $B_{in}$, more power being required as the diameter of the input radiation beam $B_{in}$ increases.

An absorber 230 is provided along each shorter side 110b of the optical surface 115. These absorbers 230 prevent, or at least significantly reduce, reflection of the surface acoustic waves from each of the shorter sides 110b. Therefore, in this embodiment the surface acoustic waves are travelling waves.

In some embodiments, the transducer 210 may employ power circulation methods as are known in the art. This may lead to a reduction in the amount of electrical power that is needed to produce the surface acoustic waves, for example by a factor of around 7.

Since the relative power of sub-beam $B_0$ (and therefore of the output radiation beam $B_{out}$) is dependent upon the amplitude of the adjustable periodic structure on the optical surface 115, it is desirable to generate surface acoustic waves with substantially constant amplitude over the optical surface. However, there will be some loss of energy as the waves propagate over the optical surface 115. The attenuation of the surface acoustic waves as they propagate over the beam spot region will depend on the distance traveled by the waves. The waves propagate across the optical surface, travelling over a distance of the order of the length of the longer sides 110a of the optical element 110. As explained above, the longer sides 110a of the optical element 110 may have a length of the order of 300 mm.

One source of energy loss is the intrinsic loss of energy in the material of the optical surface. This is dependent upon the Q factor of the piezoelectric material. To minimise these losses, it is desirable to use a piezoelectric material with a high Q factor or, equivalently, a small bandwidth. Q factors for piezoelectric materials can vary over several orders of magnitude from around 10 for some ceramics to around $10^4$ for Lithium niobate ($LiNbO_3$) and in excess of $10^5$ for quartz. Quartz has a Q-factor of $1.6 \times 10^7/f$, where f is the frequency of the surface acoustic waves (measured in Megahertz). At a frequency of 30 MHz (which, as explained above, is required for a pitch of the order of 100 μm) quartz has a Q-factor of around $5 \times 10^5$.

Energy losses due to scattering and by change in material properties can be reduced by ensuring that the optical surface 115 is not in contact with anything and is smooth. Since the attenuator 100 may be used for attenuation of EUV radiation, in use the optical element 110 will be disposed in a vacuum, which reduces energy losses. Surface acoustic waves are constrained to a thin layer close to the surface of the piezoelectric material. Therefore for a sufficiently thick layer of piezoelectric material, attaching the layer of piezoelectric material to a rigid base substrate should not significantly affect the surface acoustic waves.

Figure 7B:
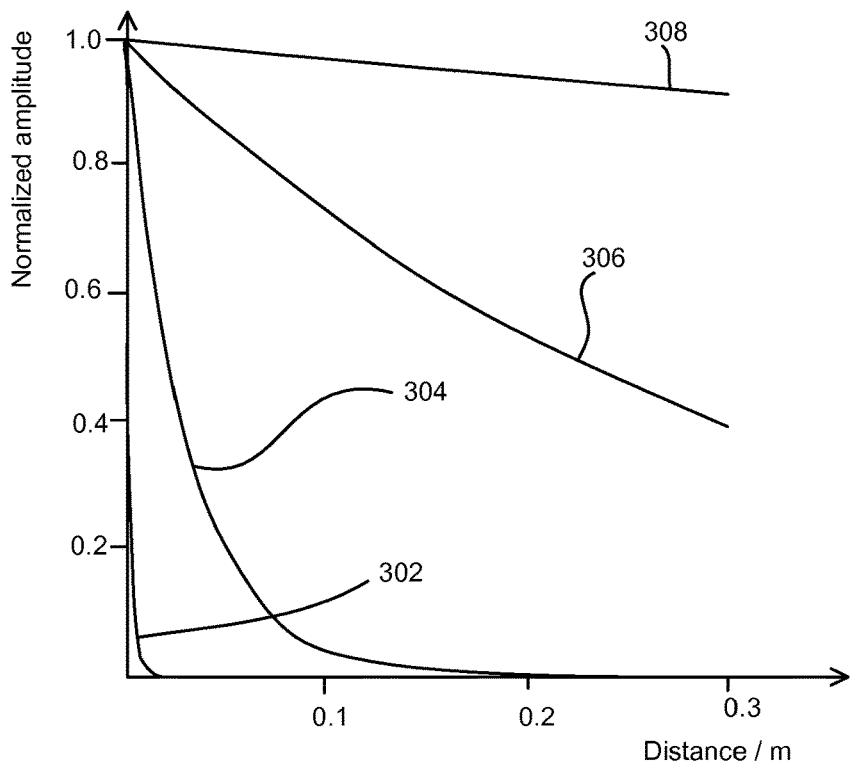
FIG. 7b shows the amplitude of the surface acoustic waves formed by the distortion mechanism of FIG. 7a as a function of distance from the transducer for different Q values of piezoelectric material.

FIG. 7b shows the amplitude of the surface acoustic waves (for an optical element 110 using the distortion mechanism of FIG. 7a) as a function of distance from the transducer 210 (normalized to the amplitude of the waves at the transducer 210) for different Q values of the piezoelectric material. Curves 302, 304, 306, 308 correspond to a Q factor of $10^2$, $10^3$, $10^4$, $10^5$ respectively. It can be seen from curve 308 that for a piezoelectric material with a Q factor of $10^5$, over a distance of 300 mm the normalized amplitude falls from 1 to just over 0.9.

It may also be desirable to minimize the ratio of the amplitude of the periodic structure on the optical surface 115 to the pitch Λ. This minimises stress within the piezoelectric material and the energy required by the distortion mechanism.

Figure 8A:
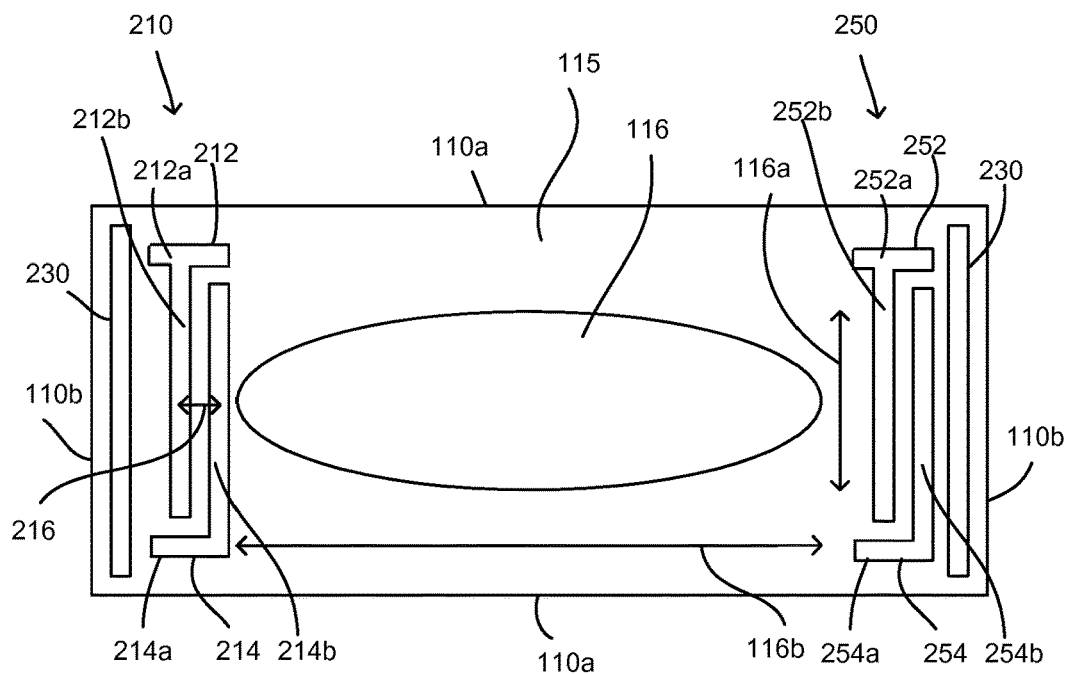

FIG. 8a shows an alternative embodiment of a distortion mechanism for optical element 110. The arrangement of FIG. 8a is generally similar to that of FIG. 7a, except that a second transducer 250 is provided on the optical surface 115 on an opposite one of the shorter sides 110b to transducer 210.

The second transducer 250 is generally similar to transducer 210, comprising two electrodes 252, 254 and an alternating current power supply (not shown) arranged to apply an alternating voltage across the two electrodes 252, 254. Similarly to transducer 210, each electrode 252, 254 of second transducer 250 comprises a spine section 252a, 254a and a single finger 252b, 254b. The two transducers 210, 250 may share a common alternating current power supply (not shown) or, alternatively, the two transducers 210, 250 may be provided with separate alternating current power supplies, which may be synchronized (i.e. they may have the same frequency).

Since there are two transducers 210, 250, for an optical element 110 of fixed length, there is less variation in the amplitude of the surface acoustic waves formed on the optical surface 115 with such an arrangement than there would be with the arrangement of FIG. 7a. Effectively, this is because the maximum distance between any point on the optical surface and one of the transducers has effectively been halved.

Figure 8B:
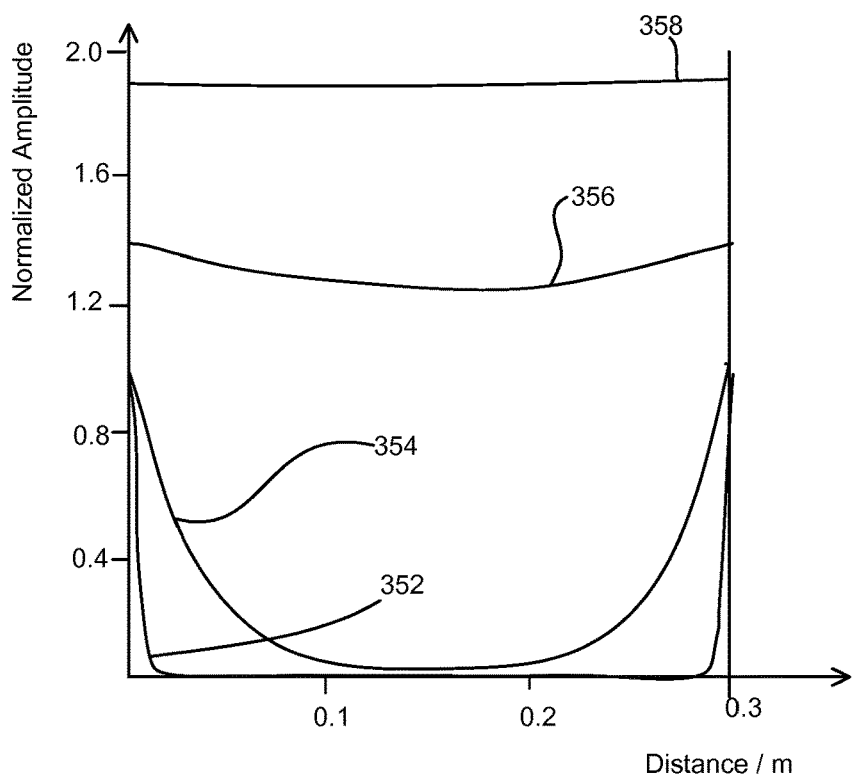
FIG. 8b shows the amplitude of the surface acoustic waves formed by the distortion mechanism of FIG. 8a as a function of distance from one of the two transducers for different Q values of piezoelectric material.

FIG. 8b shows the normalized amplitude of the surface acoustic waves generated using the arrangement of FIG. 8a as a function of distance from transducer 210 for different Q values of the piezoelectric material. The normalized amplitude in FIG. 8a is normalized to the component to the surface acoustic wave that arises from each of the two transducers 210, 250 at that transducer 210, 250. The surface acoustic wave is a sum of the components from each of the two transducers 210, 250 and therefore, the normalized amplitude in FIG. 8a lies between 0 and 2. In this model, the second transducer 250 is disposed 300 mm from transducer 210. At a distance of 0 m from transducer 210, the normalized amplitude of the surface acoustic waves is the sum the component arising from transducer 210 (i.e. 1 since this component has not been attenuated) and the component arising from transducer 250 (i.e. <1 due to the attenuation over 0.3 m). Curves 352, 354, 356, 358 correspond to a Q factor of $10^2$, $10^3$, $10^4$, $10^5$ respectively. Since equal voltages are applied to the two transducers then the amplitude of the surface acoustic waves has a minimum which is midway between the two transducers 210, 250, i.e. at a distance of 150 mm from transducer 210. For a piezoelectric material with a Q factor of $10^5$, at its minimum the amplitude falls by around 0.1%.

Such an arrangement with surface acoustic wave actuation from two opposing sides (using transducers 210, 250) of the optical surface 115 at the same frequency results in the generation of surface acoustic standing waves on the optical surface. Therefore, the amplitude of the periodic structure that is formed on the optical surface 115 varies with time. If the amplitude of each component to the standing wave from each of the two transducers 210, 250 is A then the amplitude of the standing surface acoustic wave at each antinode will oscillate over time between 0 and 2 A. The mean time averaged amplitude of the standing surface acoustic wave at each antinode is given by A multiplied by $2/\pi \approx 0.64$.

As a result of such a time varying amplitude, the relative power of the output radiation beam $B_{out}$ of attenuator 100 will also vary with time. Note that the relationship between the relative power of the output radiation beam $B_{out}$ of attenuator 100 and the amplitude of the periodic structure is non-linear (see FIG. 6). Therefore the relative power of the output radiation beam $B_{out}$ of attenuator 100 will not simply be the value given by the arrangement of FIG. 7a but with an amplitude of 0.64 A. In order to achieve the same time averaged attenuation of the input radiation beam $B_{in}$ using the arrangement of FIGS. 7a and 8a, the contribution to the surface acoustic wave generated by each of the two transducers 210, 250 of FIG. 8a should have approximately twice the amplitude of the surface acoustic wave generated by the transducer 210 of FIG. 7a.

For embodiments wherein attenuator 100 is used as part of a feedback loop to control a dose of radiation received by a substrate in a lithographic apparatus, the time period of the fluctuations in the relative power of the output radiation beam $B_{out}$ of attenuator 100 should be significantly shorter than the exposure time of the substrate.

As described above, the power of the output radiation beam $B_{out}$ of attenuator 100 is dependent on the amplitude of the surface acoustic waves. For the embodiments shown in FIGS. 7a and 8a this in turn is dependent upon the amplitude of the alternating voltage applied to the electrodes of the or each transducer. The surface acoustic waves will propagate across the optical element 110 at the speed of sound in the piezoelectric material. The time taken for the surface acoustic waves to propagate across the optical surface 115 is given by the ratio of the length of the longer sides 110a of optical surface 115 to the speed of propagation. This is the response time of the distortion mechanism, i.e. the minimum time required to change the amplitude of the waves. For example, for embodiments wherein the speed of surface acoustic waves is around 3000 m/s and the longer sides 110a of the optical element 110 have a length of the order of 300 mm, the distortion mechanism may have a response time of the order of 0.1 ms.

Figure 9:
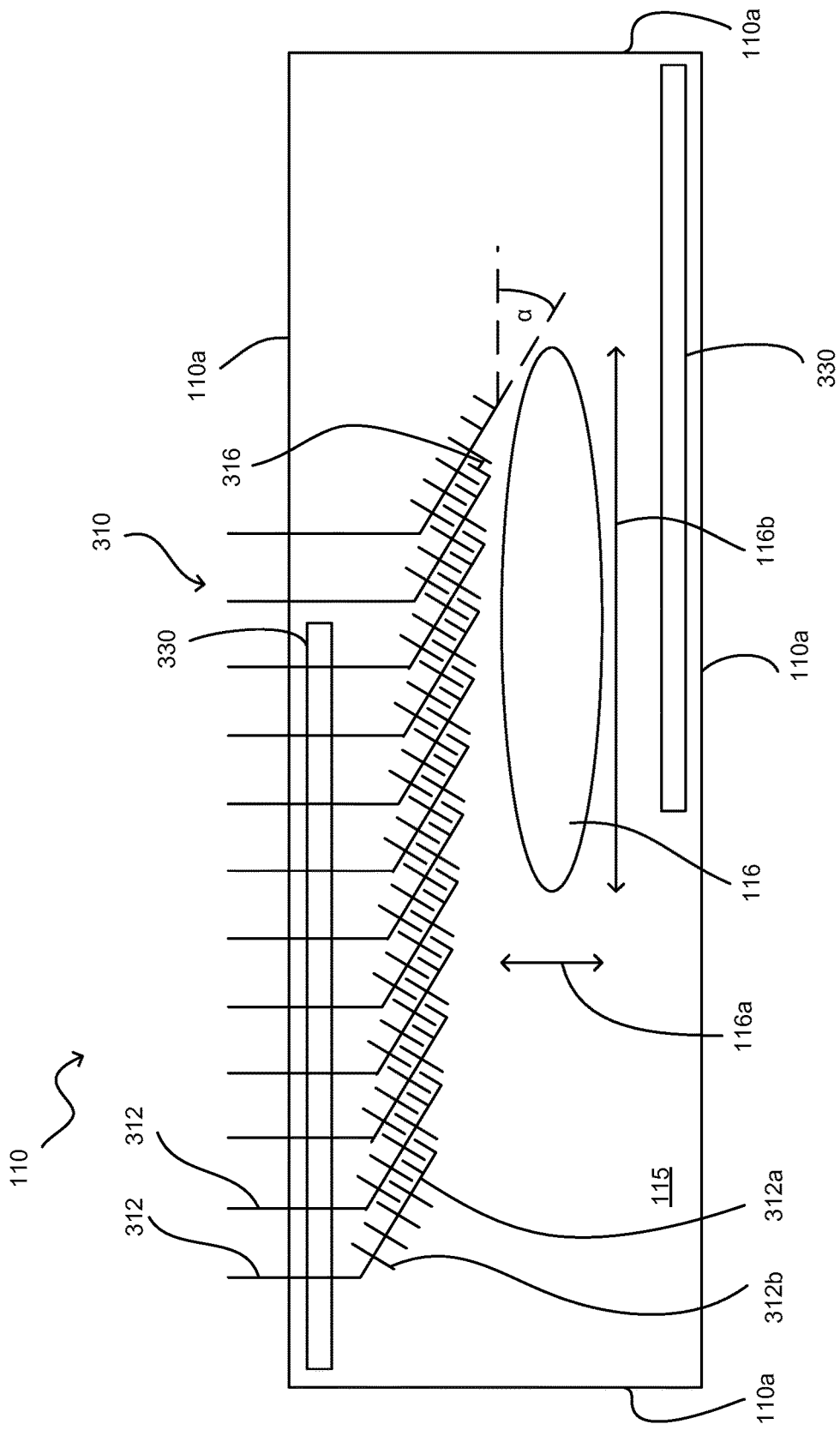

FIG. 9 shows a further embodiment of a distortion mechanism for attenuator 100, which is a variant of the embodiments shown in FIGS. 7a and 8a. The distortion mechanism comprises an interdigitated transducer (IDT) 310 which in turn comprises a plurality of electrodes 312 (in this example, twelve electrodes) arranged along one of the longer sides 110a of the optical element 110 (and along the major axis of the beam spot region 116).

Each electrode 312 comprises a spine section 312a and a plurality of parallel, evenly spaced fingers 312b extending from, and generally perpendicular to its spine section 312a. The fingers 312b of each electrode 312 extend in both directions from its spine sections 312a. The spine section 312a of each electrode 312 is arranged at an angle α with respect to the major axis of the beam spot region 116. The fingers 312b of each pair of adjacent electrodes 312 interlock such that there is a constant spacing 316 between each pair of adjacent fingers 312b (which are from different electrodes 312). An alternating power supply (not shown) applies an alternating voltage, of the same frequency, across each pair of adjacent electrodes 312. The alternating power supply 314 is arranged such that every other electrode 312 is in phase.

The IDT 310 is operable to induce a travelling surface acoustic plane wave on the optical surface 115 of optical element 110 that propagates at an angle of a to the major axis of the beam spot region 116. The electrodes 312 are arranged along the longer side 110a such that surface acoustic waves are generated across the entire beam spot region 116.

An absorber 330 is provided along each longer side 110a of the optical surface 115. These absorbers 330 prevent, or at least significantly reduce, reflection of the surface acoustic waves from each of the longer sides 110a. Therefore, in this embodiment the surface acoustic waves are travelling waves.

By arranging the direction of propagation of the surface acoustic waves at an oblique angle α to the major axis of the beam spot region 116, the propagation distance between the IDT 310 and the far side of the beam spot region 116 is reduced. Advantageously, this reduction in propagation distance results in: (a) a smaller response time for the distortion mechanism; and (b) less attenuation of the surface acoustic waves (and therefore less variation in the amplitude of the surface acoustic waves formed on the optical surface 115). For example, for an input radiation beam with a diameter of 10 mm which is incident on the optical surface at a grazing incidence angle of 35 mrad (~2 degrees) the length of the major axis of the beam spot region 116 is around 285 mm. This would be the propagation distance of the surface acoustic waves for the embodiments of FIGS. 7a and 8a. However, with α=45° the propagation distance for the embodiment of FIG. 9 is around 14 mm.

Arranging the direction of propagation of the surface acoustic waves at an oblique angle to the major axis of the beam spot region 116 also alters the diffraction pattern produced in the far field of the optical element 110. In particular, it varies the angular separation of the plurality of spatially separated sub-beams $B_0$, $B_{+1}$, $B_{-1}$ for a given wavelength or pitch of surface acoustic wave. In effect, the pitch of the periodic pattern that the radiation beam $B_{in}$ sees is increased by a factor of $1/\cos(\alpha)$. Therefore, in order to achieve the same angular separation as with the embodiments of FIGS. 7a and 8a, the wavelength of the surface acoustic waves should be reduced by a factor of $\cos(\alpha)$. Alternatively, the distance between the optical element 110 and the aperture 125 in wall 120 may be increased to compensate for the reduction in angular separation.

In an alternative embodiment, the optical element 110 is provided with a plurality of closed channels below the optical surface 115. Said channels are close to the optical surface such that above each channel the optical surface is formed from a membrane of material which can be distorted by the distortion mechanism. Such an embodiment is shown in FIGS. 10, 10a, 11, 11a and 12.

Figure 10:
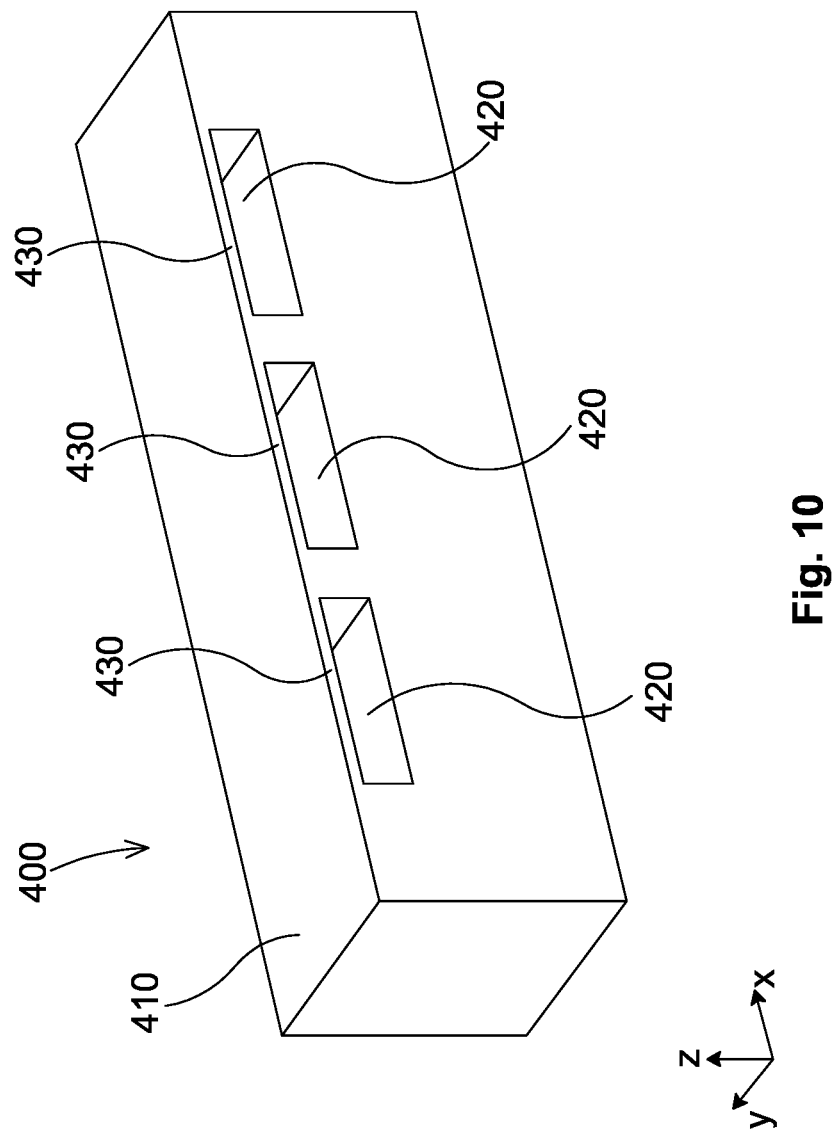
Figure 10A:
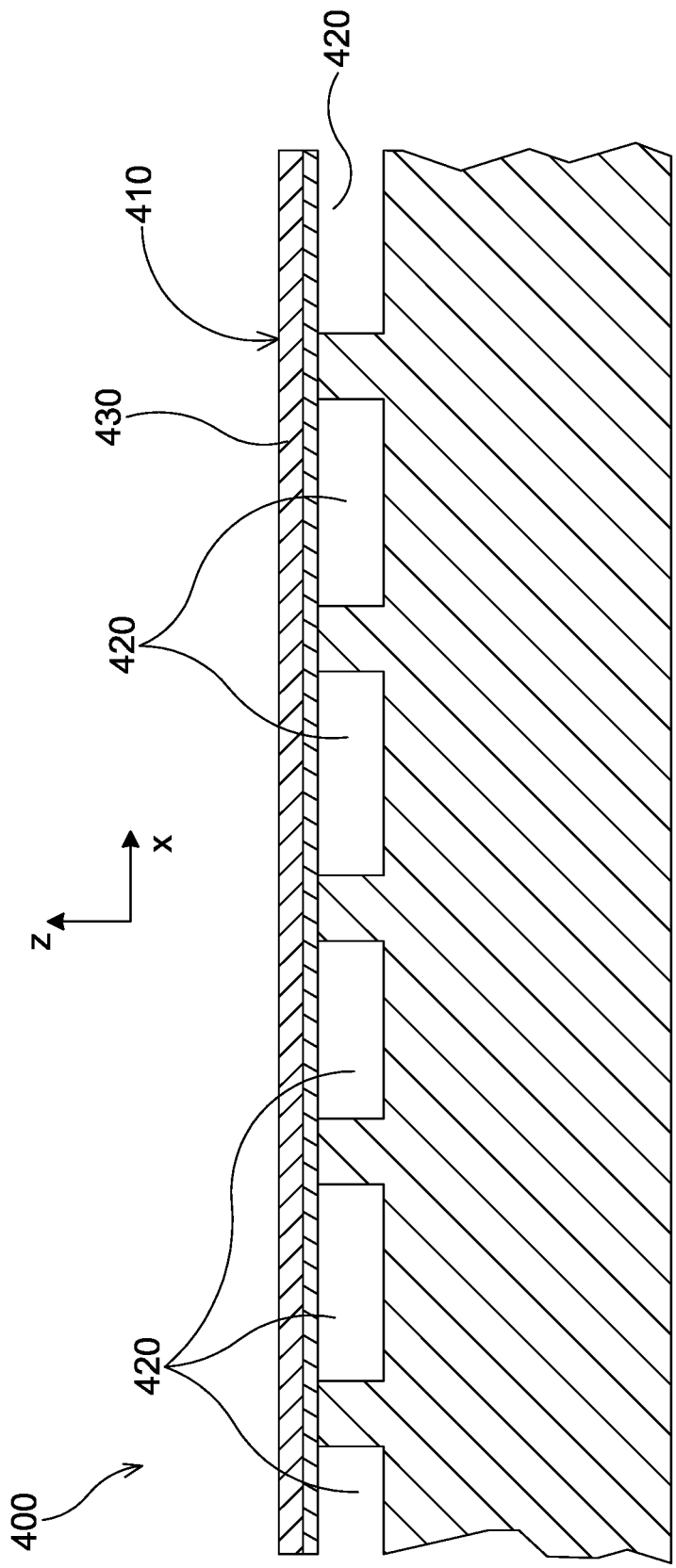
FIG. 10a is a schematic cross section of a portion of the optical element of FIG. 10.

FIGS. 10 and 10a show a partial cross section and a cross section respectively of a portion of an optical element 400, which may correspond to the optical element 110 of attenuator 100. Optical element 400 comprises an optical surface 410 (which may correspond to optical surface 115 of FIG. 5) and a plurality of closed channels 420 extending through the optical element 400, below the optical surface 410. Each channel 420 is rectangular in cross section although it will be appreciated that other shapes may alternatively be used. Each channel 420 extends under the optical surface 410 at a generally constant depth such that above each channel 420 there is provided a membrane 430 of generally uniform thickness. Each channel 420 extends in the y-direction in the Figures. The membranes 430 may, for example, have a thickness of around 5 μm. It will be appreciated that different thicknesses may alternatively be provided and that the thickness of the membrane 430 may be chosen with reference to the stiffness/flexibility of the material from which it is formed and the force/pressure applied by the distortion mechanism. The channels 420 are mutually parallel and equally spaced so as to form a periodic structure within the optical element 400. The pitch of this periodic structure is the sum of the width of each channel 420 (in a direction perpendicular to its extent, i.e. the x-direction) and a separation distance between each pair of adjacent channels 420 (also in a direction perpendicular to its extent, i.e. the x-direction). Each channel 420 may have a width of the order of 80 μm and a separation between adjacent channels 420 of 20 μm, which would produce a periodic structure within the optical element 400 with a pitch of the order of 100 μm. It will be appreciated that other widths, separation distances and pitches may alternatively be used.

As with previous embodiments, the optical surface 410 of optical element 400 may comprise a generally elliptical beam spot region which is irradiated by the input radiation beam $B_{in}$. The length of the minor axis of the beam spot region may be equal to the diameter of the input radiation beam $B_{in}$ and may be of the order of 10 mm. The length of the major axis of the beam spot region may be the ratio of the diameter of the input radiation beam to $\sin(\beta)$ and may be of the order of 260 mm. The optical surface 410 may be generally rectangular. Since the major axis is significantly longer than the minor axis, in some embodiments, the optical surface 410 comprises two shorter sides and two longer sides. The optical surface 410 may be formed from, or provided with a coating of, a material which is relatively reflective for the input radiation beam $B_{in}$, which may comprise EUV radiation. Suitable materials include ruthenium (Ru) and molybdenum (Mo).

Each of the channels 420 may extend parallel to a side of the optical element 400. For example, each of the channels 420 may extend parallel to a shorter side of the optical surface 410.

Figure 11:
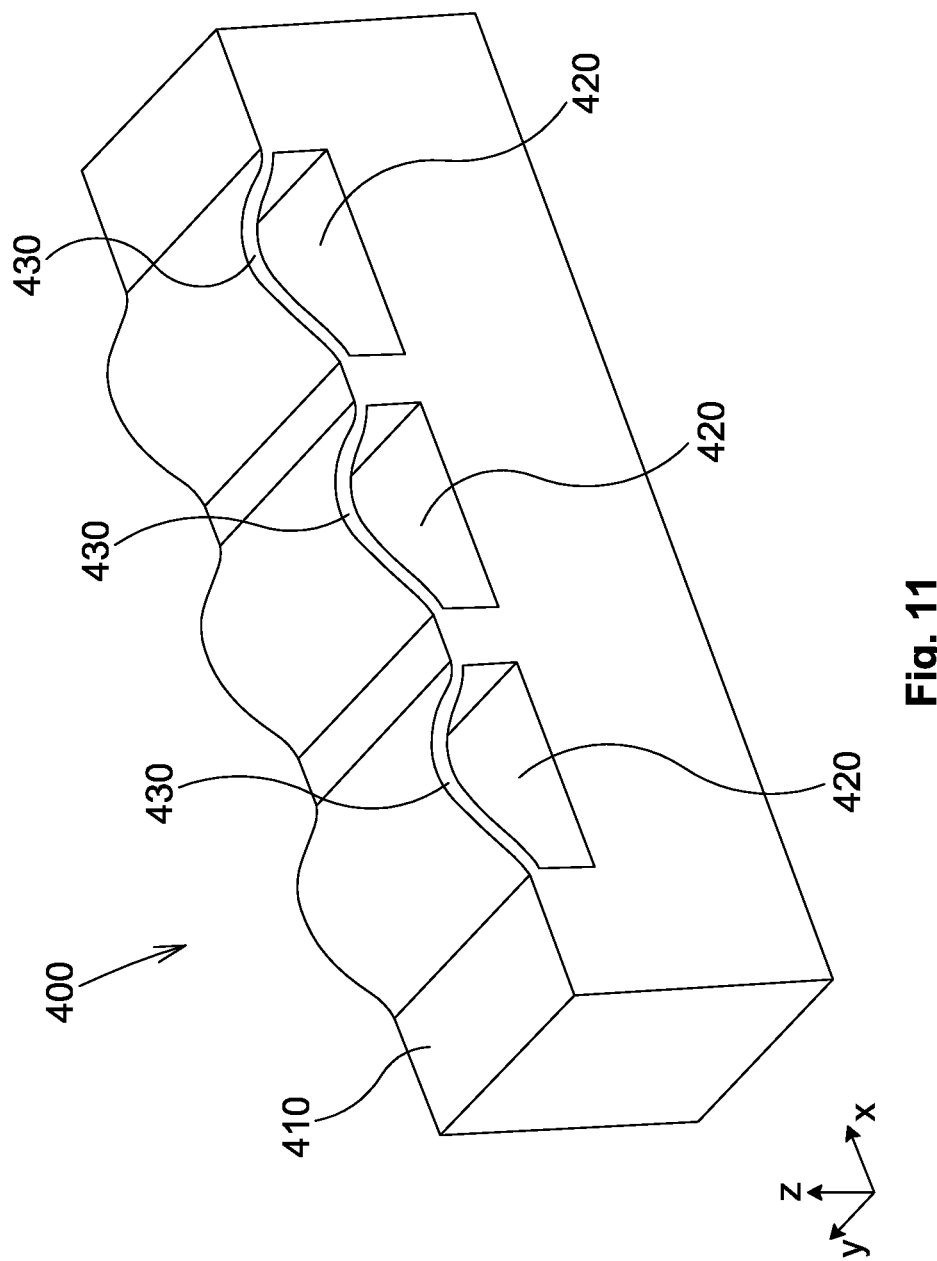
FIG. 11 is a schematic partial cross section of the portion of the optical element of FIG. 10 which has been distorted by a distortion mechanism.

Although only three channels are shown in FIGS. 10 and 11, it will be appreciated that these Figures only show a portion of the optical element 400 and any number of channels may be provided. For embodiments wherein the beam spot region is around 300 mm long, with a pitch of 100 µm, the optical element may comprise of the order of 3000 channels.

A method of forming an optical element 400 with a plurality of closed channels 420 substantially as described above is now described with reference to FIG. 12. The optical element 400 may be formed from two layers: a base substrate 440 and a patterned substrate 450.

The base substrate 440 may comprise, for example, a silicon wafer. The base substrate 440 is of generally uniform thickness, comprising generally flat opposed upper and lower surfaces 440a, 440b.

Figure 12:
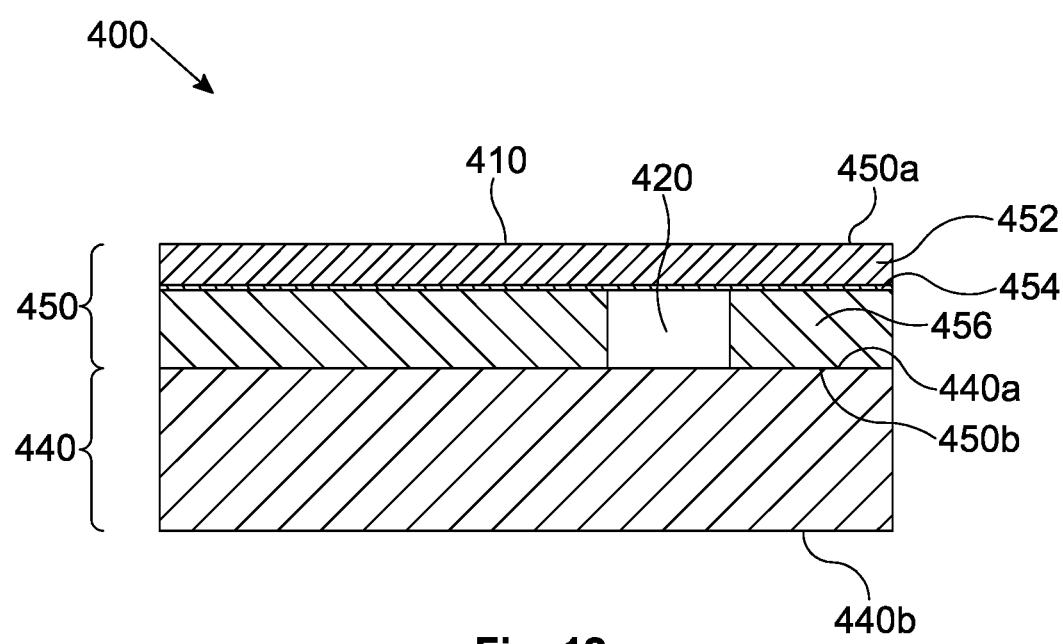
FIG. 12 is a schematic cross sectional view of a portion of the optical element of FIG. 10.

The patterned substrate 450 has a generally flat upper surface 450a and a lower surface 450b which comprises a plurality of open channels (only one is shown in FIG. 12). The patterned substrate 450 may comprise a silicon-on-insulator (SOI) wafer, comprising an upper silicon layer 452, a central insulator layer 454 and a lower silicon layer 456. The open channels may be formed by etching regions of the lower silicon layer 456. For example a periodic structure of open channels may be formed by etching regions of the lower silicon layer 456 back to the insulator layer 454.

Once the plurality of open channels has been formed on the lower surface 450b, the lower surface 450b of the patterned substrate 450 is bonded to the upper surface 440a of the base substrate 440. The upper surface 440a of the base substrate 440 closes the open channels in the lower surface 450b of the patterned substrate 450, forming a plurality of closed channels 420. Any suitable bonding mechanism may be used including, for example, any of: adhesive, direct bonding or anodic bonding.

Figure 11A:
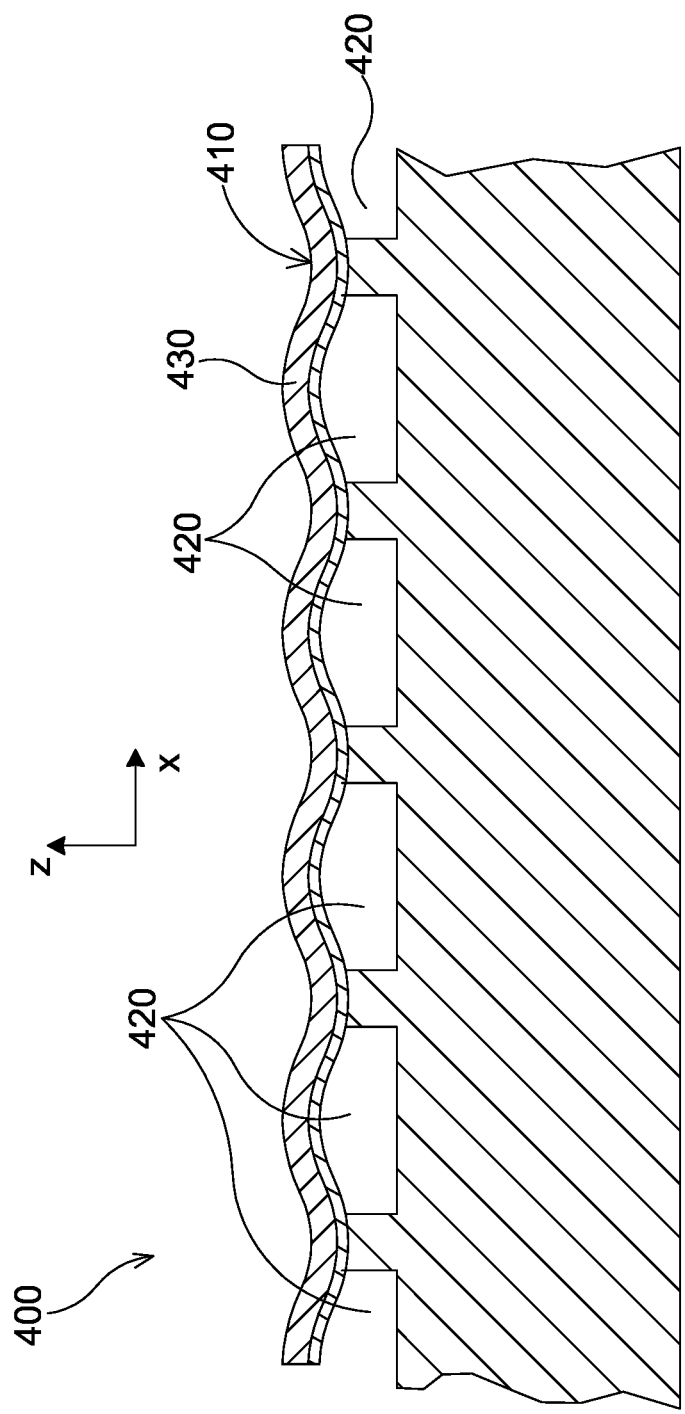
FIG. 11a is a schematic cross section of the portion of the optical element shown in FIG. 11 (which has been distorted by a distortion mechanism)

For such embodiments, wherein a plurality of closed channels is formed under the optical surface 410 of the optical element 400, the distortion mechanism comprises one or more actuators that are operable to distort the membrane 430 over each of the plurality of channels 420 so as to control the shape of the optical surface 410. A distortion of the membrane 430 above each channel 420 is illustrated in FIGS. 11 and 11a. The amplitude of the distortion may be controlled by the actuators so as to vary the relative power of sub-beam $B_0$ (and therefore of the output radiation beam $B_{out}$). Various different actuators that may form part of the distortion mechanism are now described.

In one embodiment, the distortion mechanism uses hydraulics. In this embodiment, the closed channels 420 are filled with a fluid and the distortion mechanism of the optical element 400 comprises one or more actuators that are operable to control the pressure of the fluid within the plurality of closed channels 420.

The fluid may be water although other fluids may alternatively be used. In general, it is desirable to maintain the fluid within the closed channels 420 at a sufficiently high pressure that the fluid will remain in a liquid phase. This ensures that the fluid is incompressible and may reduce a resilience of the hydraulic system formed by the closed channels 420 (which may arise as a result of any gaseous phase of the fluid present). This can be achieved by maintaining the pressure of the fluid within the closed channels 420 above the vapour pressure of the fluid.

In some embodiments, the input radiation beam $B_{in}$ comprises EUV radiation. Therefore, the optical surface 410 is typically under vacuum conditions to reduce absorption of EUV radiation.

It may be desirable to maintain the optical element 400 at an ambient temperature for the lithographic system LS. This may be around room temperature (22° C.), for example, the ambient temperature may be in the range 15-30° C. In use, the optical element 400 may heat up due to absorption of EUV radiation. For example, in use, the optical element 400 may increase in temperature by up to 30° C. or higher due to the heat load of the input radiation beam $B_{in}$. Therefore, in use the operating temperature of the optical element 400 may be in the range 15-60° C. As explained above, in some embodiments, the optical surface 410 may be provided with a coating of a material with a relatively high reflectivity for EUV radiation (for example ruthenium or molybdenum). For such embodiments, it may be desirable to maintain the operating temperature of the optical element 400 below a threshold temperature, above which such EUV-reflecting coatings may be at risk of degradation. For example, it may be desirable to maintain the temperature of the optical element 400 below 150° C. If the input radiation beam has a relatively high power (for example or the order of 50 kW) and/or if higher priority is given to the hydraulic performance of the optical element than to its thermal management then the operating temperature of the optical element may, for example, be in the range 15-150° C.

In some embodiments, the optical element 400 may be cooled to a temperature below the ambient temperature of the lithographic system LS. For example, the optical element 400 may be maintained at a temperature of approximately −20° C.

For embodiments wherein the optical surface 410 is under vacuum conditions the minimum pressure difference across the membranes 430 will be the vapour pressure of the fluid. Therefore, if the fluid is water then the minimum pressure difference across the membranes 430 is approximately 2 kPa at an operating temperature of approximately 22° C. This may be too high for relatively thin membranes 430 to withstand without damage. Therefore, it may be desirable to use an alternative fluid that has a lower vapour pressure than that of water. It may be desirable to use a fluid with a vapour pressure that is: sufficiently low that boiling effects do not need to be considered; and sufficiently high that any leak of the hydraulic fluid can be removed by evaporation. For example, a fluid with a vapour pressure in the range 10-100 Pa under typical operating temperatures of the optical element 400 may be used. Suitable fluids may include hydrocarbons of the form $C_xH_yO_z$. Advantageously, such fluids do not contain corrosive elements such as sulfur or halogens and therefore reduce the risk of damage being caused by a leak of the hydraulic fluid. For example, n-dodecane ($C_{12}H_{26}$) has a vapour pressure of around 12 Pa at an operating temperature of approximately 22° C.

In particular, the actuators are operable to control a pressure difference across the membrane 430 above each closed channel 420. One or more pressure sensors may be used to monitor the pressure within the plurality of closed channels 420 and/or the pressure difference across the membrane 430 above each closed channel 420. In use, the optical surface 410 may be held under vacuum conditions.

By varying the pressure difference across the membrane 430 above each closed channel 420, each membrane 430 may be adjustably distorted to form an adjustable periodic structure on the optical surface 410 (as shown in FIGS. 11 and 11a). As explained above, the pitch of said periodic structure is given by the width and separation of the closed channels 420 (in the x-direction). By controlling the pressure difference across the membrane 430 above each closed channel 420, the amplitude of the adjustable periodic structure on the optical surface 410 may be controlled.

Figure 13A:
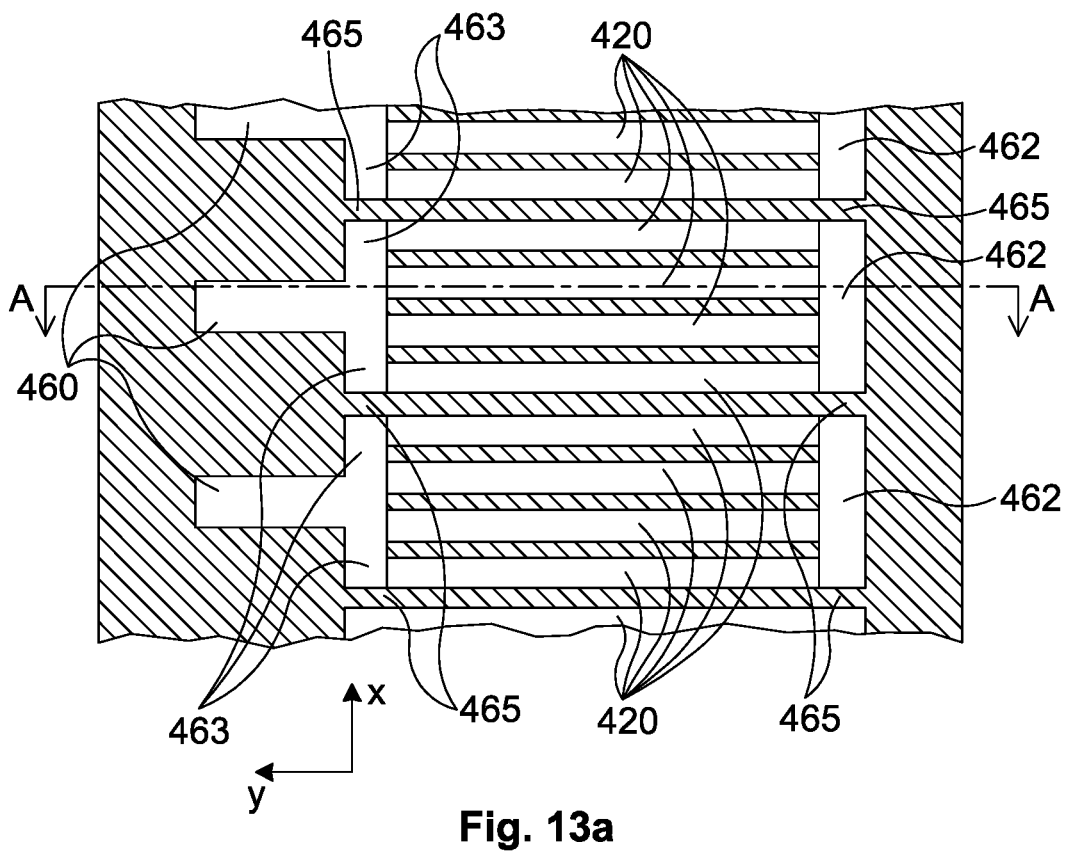
FIG. 13a shows a first cross sectional view of a portion of a first embodiment of the optical element of FIG. 10.
Figure 13B:
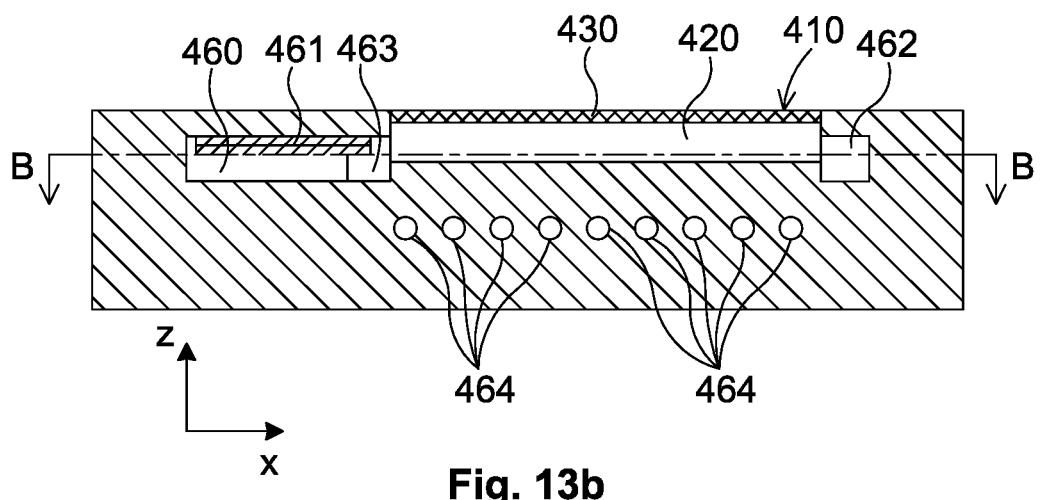
Figure 14:
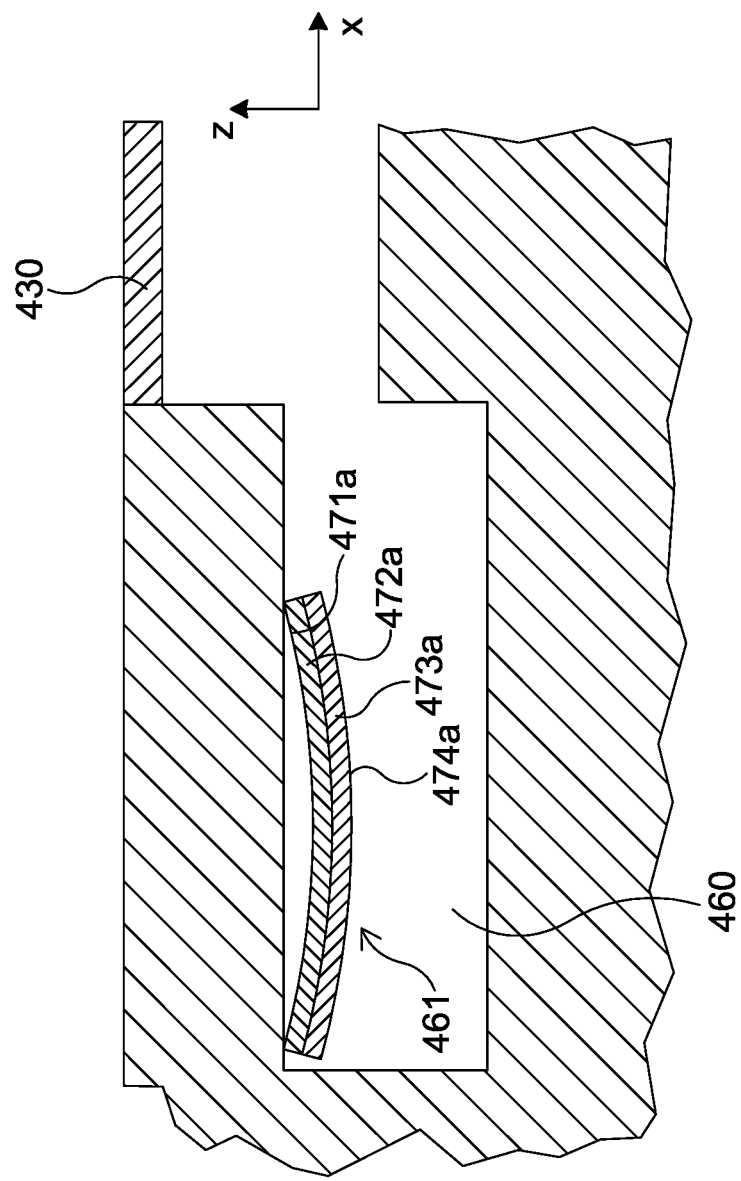
FIG. 14 shows an enlarged view of a portion of the cross sectional view of the optical element shown in FIG. 13b.

An example of a hydraulic distortion mechanism of the type described above is now described with reference to FIGS. 13*a*, 13*b* and 14. FIGS. 13*a* and 13*b* show two different, perpendicular cross sectional views of a portion of the optical element 400. The view shown in FIG. 13*b* is a cross section through the line A-A shown in FIG. 13*a* and the view shown in FIG. 13*a* is a cross section through the line B-B shown in FIG. 13*b*. FIG. 14 shows an enlarged view of a portion of the cross sectional views of the optical element 400 shown in FIG. 13*b*.

The plurality of channels 420 are arranged in groups with all of the channels 420 in each group being in fluid communication. In the illustrated embodiment, each group comprises four channels 420 although it will be appreciated that in alternative embodiments, each group may comprise more or fewer channels. Each group of channels 420 is isolated from adjacent groups by barriers 465.

Each group of channels is provided with a first connecting channel 462 and a second connecting channel 463. Each of the channels 420 extends in the y-direction between the first connecting channel 462 and the second connecting channel 463 for the group to which the channel 420 belongs. The first connecting channel 462 connects a first end of each of the channels 420 in a given group and the second connecting channel 463 connects a second end of each of the channels 420 in a given group. The first and second connecting channels 462, 463 are therefore provided on opposite sides on the optical element 400. The first and second connecting channels 462, 463 are generally perpendicular to the channels 420, i.e. the first and second connecting channels 462, 463 extend in the x-direction. Each of the second connecting channels 463 is in fluid connection with a pump volume 460.

Each group of channels, along with the corresponding first and second connecting channels 462, 463 and pump volume 460 may be considered to form a hydraulic circuit, which is filled with a hydraulic fluid. In some embodiments, each such hydraulic circuit may be closed such that the amount of hydraulic fluid within the hydraulic circuit remains fixed.

A single actuator is provided for each group of channels (and the associated hydraulic circuit). In this embodiment, a piezoelectric actuator 461 is provided in each pump volume 460 and is operable to control the pressure of fluid within the corresponding hydraulic circuit. As shown in FIG. 14, the piezoelectric actuator 461 may comprise two electrodes 471*a*, 474*a* and two layers 472*a*, 473*a* of piezoelectric material disposed between the electrodes. The piezoelectric actuator 461 is further provided with a power supply (not shown) that is operable to apply a voltage across the two electrodes 471*a*, 474*a*, and a controller (not shown) operable to control the voltage applied by the power supply. The two layers of piezoelectric material 472*a*, 473*a* are configured such that a voltage applied across the electrodes 471*a* and 474*a* results in a bending of the piezoelectric actuator 461.

The illustrated piezoelectric actuator 461 is a bimorph piezoelectric bending actuator, comprising two layers of piezoelectric material. However, it will be appreciated that many other types of bending actuators are possible. For example, the piezoelectric actuator 461 may alternatively be a unimorph piezoelectric bending actuator (i.e. with a single layer of piezoelectric material) or multimorph (i.e. with more than two layers of piezoelectric material).

As a voltage is applied across the two electrodes 471*a*, 474*a* the piezoelectric actuator 461 will bend or flex (see FIG. 14). In turn, this results in an increase in the pressure of the hydraulic fluid in the volume 460 and the corresponding first and second connecting channels 462, 463 and group of channels 420. As a result, the membrane 430 above each of the plurality of channels will be distorted upwards.

By suitable control of the voltage applied across the two electrodes 471*a*, 474*a*, the pressure within each hydraulic circuit can be controlled and, in turn, an amplitude of the modulation of optical surface 410 may be controlled.

In the illustrated embodiment, each piezoelectric actuator 460 actuates a group of four channels 420 although, as stated above, each piezoelectric actuator 460 may alternatively actuate a different number of channels 420. For example each group may contain more than or fewer than four channels 420 and may, for example, contain only a single channel 420. A relatively small group of channels 420 may be advantageous since there will be less parasitic compliance in the first and second connecting channels 462, 463. Therefore such embodiments will operate with a higher resonance frequency, which allows a higher control bandwidth. However, it may be necessary to calibrate and electrically connect each piezoelectric actuator 461 individually, therefore there may be some advantage to a the use of larger groups of channels 420.

It will be appreciated that the first connecting channels 462 are optional and may be omitted.

As can be seen in FIG. 13*b*, in some embodiments a plurality of cooling channels 464 may be provided through a body of the optical element 400. In use, a suitable cooling fluid such as, for example, water may be pumped through the cooling channels 464 to remove heat from the input radiation beam $B_{in}$. In the illustrated embodiment, the cooling channels 464 extend in a direction generally parallel to that of the channels 420 (i.e. the y-direction). In alternative embodiments the cooling channels 464 may extend in a direction generally perpendicular to that of the channels 420 (i.e. the x-direction).

In use, the input radiation beam $B_{in}$ may be incident on optical surface 410 with a grazing incidence angle of 1° to 2° and may have a power of the order of 1.5 kW. With such an arrangements around 20 to 40 W of power may be absorbed by the optical element 400 and subsequently dissipated as heat. For example, this dissipated heat may be removed by cooling fluid flowing through the cooling channels 464. However, alternatively or additionally, the hydraulic fluid (for example water) may be used as a cooling medium.

In order to achieve this, the hydraulic circuits may be open such that hydraulic fluid is input into and extracted from the hydraulic circuit. For example, in a modified embodiment, the groups of channels 420 may be interconnected, by removing the barriers 465, and the first and second connecting channels 462, 463 may be used as supply and return lines for a cooling/hydraulic fluid and may be connected to an external fluid supply. The average pressure of the fluid within the channels 420 is defined by the properties of the external fluid supply. Rather than maintaining a quasi-static pressure that is controlled using the piezoelectric actuators 461, in an alternative embodiment, the external fluid supply may be arranged to create an oscillating (or pulsed) pressure within the channels 420. The piezoelectric actuators 461 may be used to modulate the amplitude of the oscillating pressure (rather than the absolute pressure). If the oscillation of the pressure is at a sufficiently high frequency (for example >10 kHz), then the fluctuations in the output power of the of the output radiation beam $B_{out}$ caused by these oscillations will be averaged out sufficiently for dose control within the lithographic apparatus $LA_a$ to $LA_n$.

For embodiments that use such an open hydraulic system wherein the hydraulic fluid is also used for cooling, the transitions between the channels 420 and the first and second connecting channels 462, 463 may be designed such that there is no significant reflection of acoustic waves in order to reduce the occurrence of standing-wave patterns with nodes of zero amplitude. This may be achieved by impedance matching and/or by use of an absorber of the acoustic energy.

For hydraulic embodiments (wherein the distortion mechanism uses the pressure of a hydraulic fluid within channels 420 to control the shape of the optical surface 410), the response time of the distortion mechanism, i.e. the minimum time required to change the amplitude of the periodic structure on optical surface 410, is dependent upon: (a) the time taken for a change in pressure caused by the actuators to affect a change in pressure within the channels 420; and (b) the dynamics of the hydraulic circuit linking the actuator(s) to the channels 420. The time taken for a change in pressure caused by the actuators to affect a change in pressure within the channels 420 is defined by the speed of sound through the fluid (for example water) within the circuit and the distance between the actuator(s) and the channels 420. The dynamics of the hydraulic circuit are defined by the channel length and stiffness of the system. The stiffness of the system is a combined stiffness defined by bulk stiffness of the water and the compliance of the channels 420, as now described.

The response time of the distortion mechanism will now be estimated for an example embodiment, wherein the upper silicon layer 452, of which the membrane 430 above each closed channel 420 forms part, is formed from silicon, having a Young's modulus of 170 GPa and a Poisson's ratio of 0.064. The membranes 430 each have a thickness of 5 µm, each channel 420 has a width of 80 µm and the separation between adjacent channels 420 is 20 µm (i.e. the periodic structure within the optical element 400 has a pitch of the order of 100 µm). Each channel 420 has a depth of 20 µm. The length of each channel is dependent upon the length of the shorter sides of the optical surface 410, which, in turn, is dependent upon the diameter of the input radiation beam $B_{in}$. For this estimate, the length of each channel will be assumed to be around 50 mm although, in practice, the length of each channel may be less than this (for example around 5-20 mm).

The stiffness of water within the hydraulic system is dependent upon the bulk modulus of water and the volume of water within the system. The bulk modulus of water is $2.2 \times 10^9$ Pa. The volume of the system may be estimated by the volume of each channel 420 multiplied by the total number of channels. If each channel has a width of 80 µm, a depth of 20 µm and a length of 50 mm, the volume of each channel is $8 \times 10^{-11}$ m$^3$. For embodiments with 3000 channels, the total volume of the system is $2.4 \times 10^{-7}$ m$^3$. The stiffness of the water is given by the ratio of the bulk modulus to the volume of the system, i.e. $9.2 \times 10^{15}$ Pa/m$^3$.

For a pressure within each channel 420 of 1 bar, the amplitude of the periodic structure on the optical surface is 4.2 nm, which corresponds to a bulging in the centre of each membrane 430 of the order of 8.4 nm. This corresponds to an extra channel area of $4.2 \times 10^{-13}$ m$^2$ and a change in channel volume of $2.1 \times 10^{-14}$ m$^3$. The stiffness of each channel is given by the differential of the pressure within the channel with respect to the volume of the channel. Therefore the stiffness per channel is $4.8 \times 10^{18}$ Pa/m$^3$ and the total stiffness of all (3000) channels is $1.6 \times 10^{15}$ Pa/m$^3$.

To estimate the combined stiffness of the system, the stiffness of the water is added to the stiffness of the channels in quadrature to give $1.36 \times 10^{15}$ Pa/m$^3$. From this the effective bulk modulus and acoustic velocity of the system can be estimated as $3.3 \times 10^8$ Pa and 571 m/s respectively. The response time can be estimated as the ratio of the maximum length of channel through which pressure waves travel to the acoustic velocity of the system. Assuming a maximum channel length of 0.2 m the response time can be estimated as 0.35 ms.

In another embodiment, a piezoelectric element is provided within each of the closed channels. By applying an appropriate voltage across each piezoelectric element, the shape of the optical surface 410 may be controlled accurately.

Figure 15A:
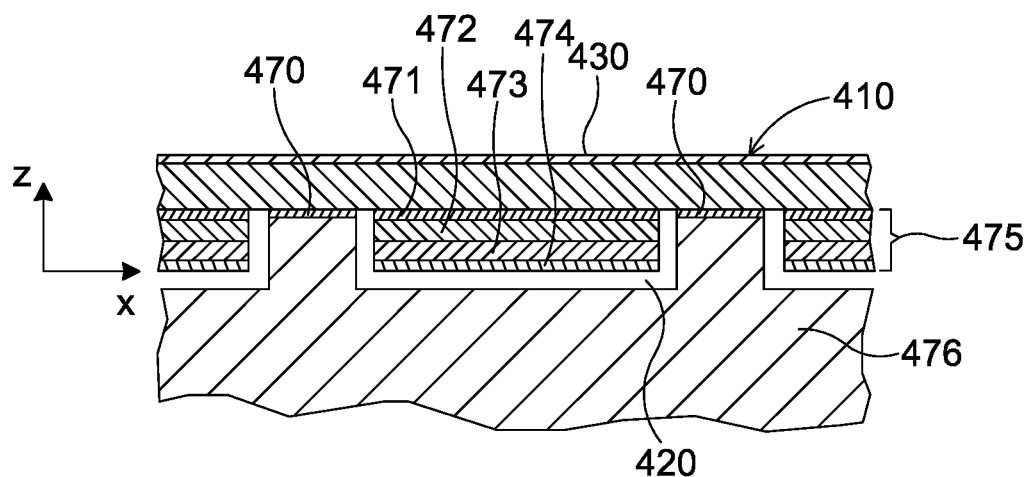
FIG. 15a shows a portion of a second embodiment of the optical element of FIG. 10 wherein a piezoelectric actuator is provided within each of the closed channels.
Figure 15B:
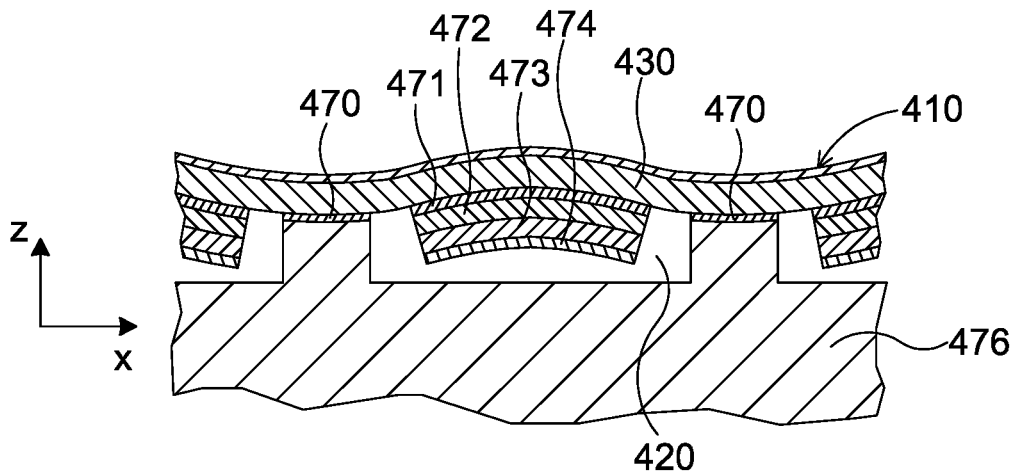
FIG. 15b shows the portion of a second embodiment of the optical element of FIG. 10 shown in FIG. 15a which has been distorted by a distortion mechanism.

FIGS. 15a and 15b show an embodiment wherein a piezoelectric actuator 475 is provided within each of the closed channels 420. In this embodiment, a layer which forms the membranes 430 is attached to a lower, patterned substrate 476 using an adhesive layer 470 or a direct bond. This attachment forms the plurality of closed channels 420. In each channel 420 a piezoelectric bending actuator 475 is attached to a lower surface of the membrane 430 such that it is disposed in the channel 420.

In this embodiment, each piezoelectric actuator 475 is operable to directly control the shape of the optical surface 410 above it (i.e. the membrane 430). The piezoelectric actuator 475 may comprise two electrodes 471, 474 and two layers 472, 473 of piezoelectric material disposed between the electrodes. The piezoelectric actuator 475 is further provided with a power supply (not shown) that is operable to apply a voltage across the two electrodes 471, 474, and a controller (not shown) operable to control the voltage applied by the power supply. The two layers of piezoelectric material 472, 473 are configured such that a voltage applied across the electrodes 471 and 474 results in a bending of the piezoelectric actuator 461.

The illustrated piezoelectric actuator 475 is a bimorph piezoelectric bending actuator, comprising two layers of piezoelectric material. However, it will be appreciated that many other types of bending actuators are possible. For example, the piezoelectric actuator 475 may alternatively be a unimorph piezoelectric bending actuator (i.e. with a single layer of piezoelectric material) or multimorph (i.e. with more than two layers of piezoelectric material).

Figure 16:
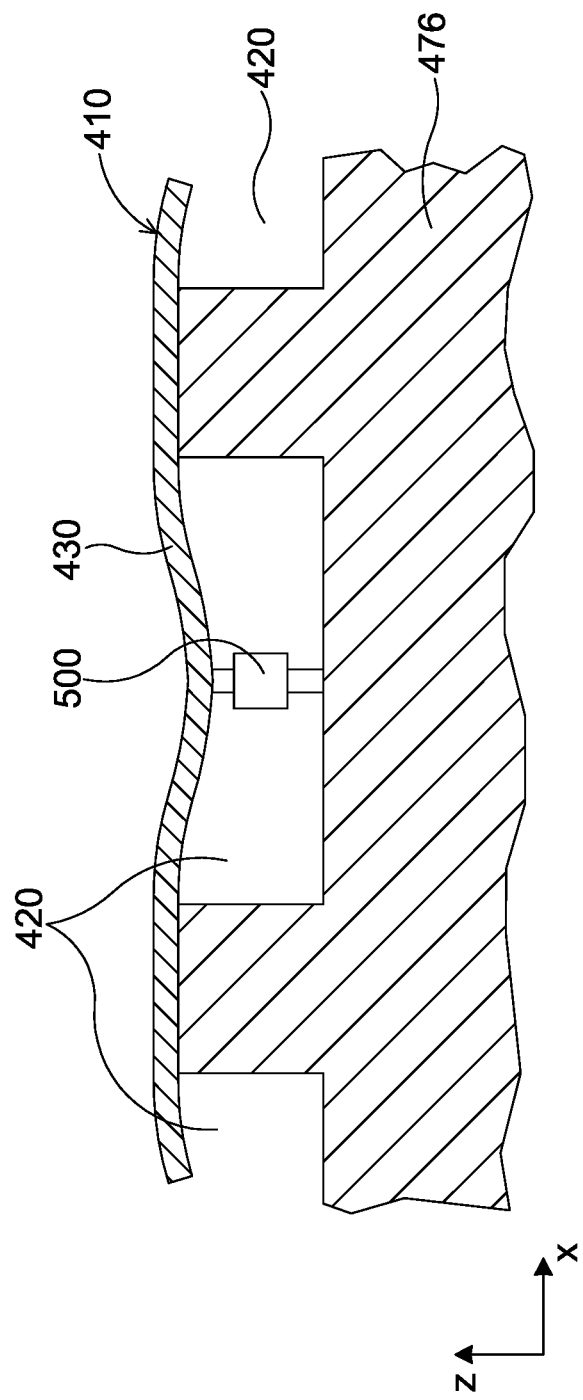
FIG. 16 shows a portion of a third embodiment of the optical element of FIG. 10 wherein a second type of piezoelectric actuator is provided within each of the closed channels.

An alternative embodiment that comprises a piezoelectric actuator in each of the channels 420 is shown in FIG. 16. The piezoelectric actuator 500 is a push-pull piezo-electric element. In response to a control voltage, the piezoelectric actuator 500 is arranged to apply a force to the membrane 430 that is generally in the z-direction. Compared to the bending actuator (as shown in FIGS. 15a and 15b), an advantage of the push-pull piezo-electric element 500 is that it is capable of producing larger vertical forces and faster response times. A disadvantage is that it is generally more difficult to achieve a large amplitude in a compact vertical space (since the extent of the channel 420 in the z-direction is relatively small).

In another embodiment, an electrostatic actuator is provided within each of the closed channels. By applying an appropriate voltage across each electrostatic actuator, the shape of the optical surface 410 may be controlled accurately.

Figure 17:
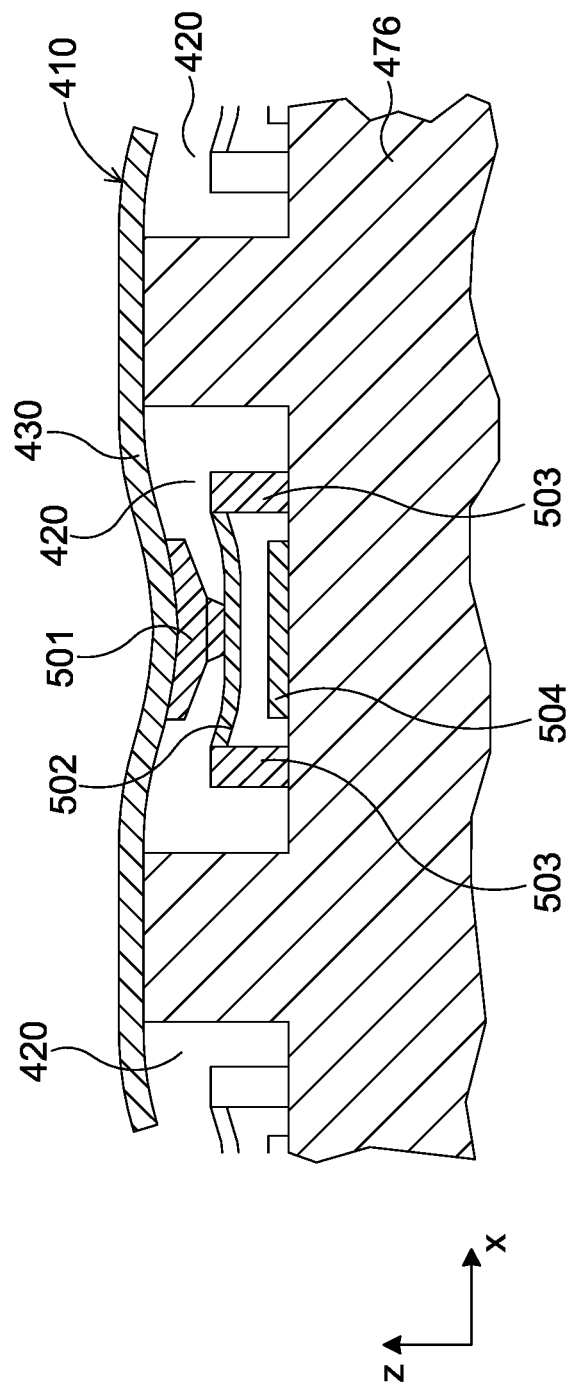
FIG. 17 shows a fourth embodiment of the optical element of FIG. 10 wherein a electrostatic actuator is provided in each of the closed channels.

An embodiment using an electrostatic actuator in each channel may be generally of the form shown in FIG. 16 but wherein actuator 500 is an electrostatic actuator that is operable to generate a downward or upward force onto the membrane 430. One such embodiment of an electrostatic actuator is shown in FIG. 17. The electrostatic actuator comprises a flexible, membrane electrode 502 and a second electrode 504. The membrane electrode 502 is adjacent to and separated from the second electrode 504.

The membrane electrode 502 is supported at each end across its width (or in the x-direction) by a post 503, which connects the membrane electrode 502 to a lower substrate 476 of the optical element 400. The membrane electrode 502 is connected to membrane 430 via a strut 501.

The electrostatic actuator is further provided with a power supply (not shown) that is operable to apply a voltage across the membrane electrode 502 and the second electrode 504, and a controller (not shown) operable to control the voltage applied by the power supply. The application of this voltage across the membrane electrode 502 and the second electrode 504, results in an attractive force between the two electrodes 502, 504. This force is transmitted to the membrane 430 via the strut 501.

Each of the components 501-504 may extend in the y-direction over the full length of each channel 420. Alternatively, one or more of these components 501-504 may be split up in sections such that the full length of the channel 420 is actuated by a plurality of electrostatic actuators.

Although the embodiments of the optical element 400 described above with reference to FIGS. 10-17 are described as being suitable for use as an attenuator of the type shown in FIGS. 5 and 5a, it will be appreciated that these embodiments of optical element 400 provide an adjustable diffraction grating that may be used for other purposes. For example, such an optical element 400 may alternatively be used as a beam splitting apparatus.

Figure 18:
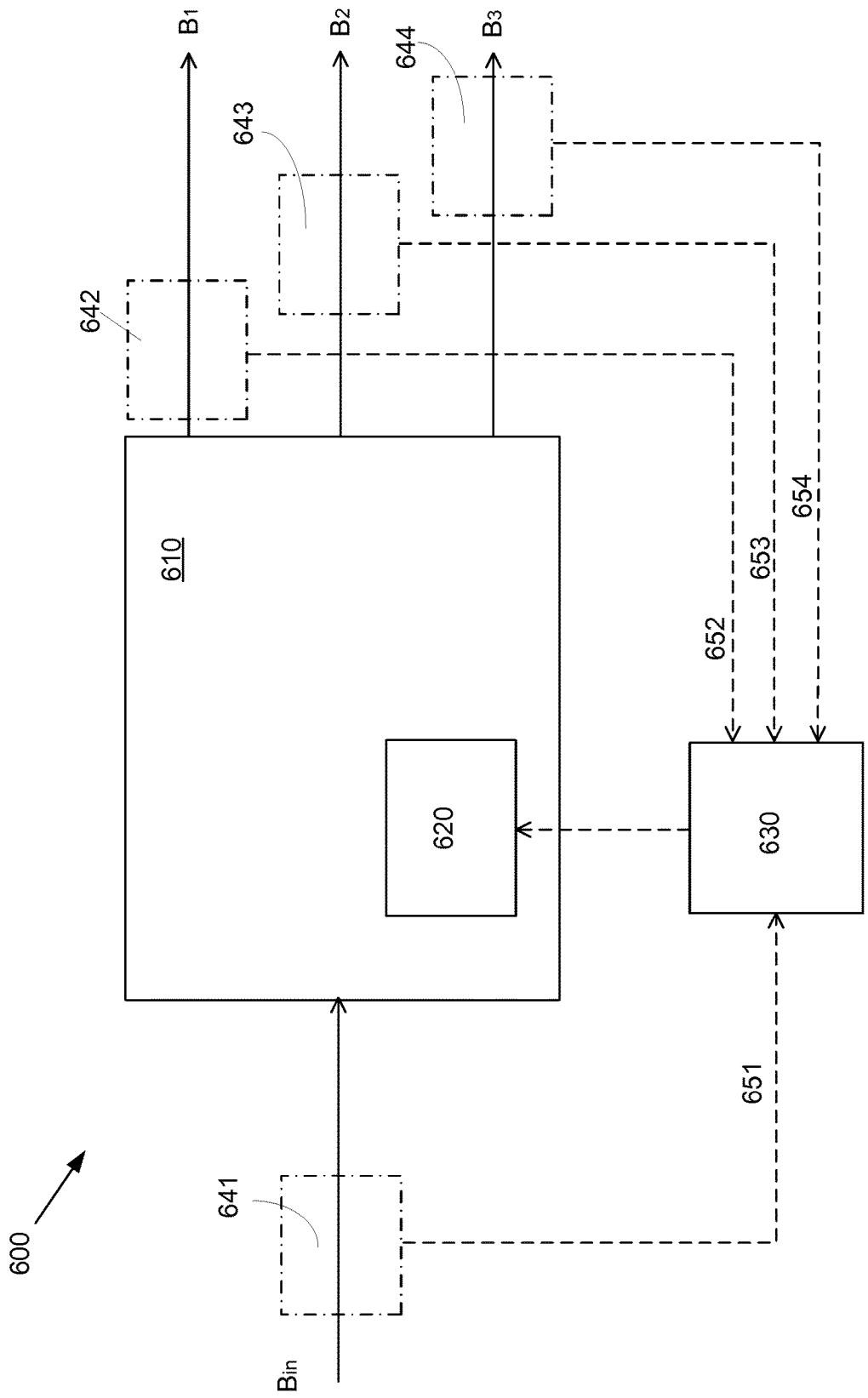
FIG. 18 is a schematic illustration of a beam splitting apparatus according to an embodiment of the invention, which may form part of a beam delivery system of the lithographic system of FIG. 1.

FIG. 18 is a schematic illustration of a beam splitting apparatus 600 according to an embodiment of the invention. The beam splitting apparatus 600 may for example form part of the beam delivery system BDS of FIG. 1. The beam splitting apparatus 600 comprises an optical element 610, a distortion mechanism 620 and a controller 630. The optical element 610 has an optical surface for receiving an input radiation beam $B_{in}$. As will be described below, a periodic structure is provided on the optical surface which acts as a diffraction grating such that the input radiation beam $B_{in}$ is diffracted from the optical element 610 to form a plurality of angularly separated output radiation beams $B_1$, $B_2$, $B_3$. The distortion mechanism 620 is operable to distort the optical surface of optical element 610 so as to control a shape of the periodic structure.

The controller 630 is operable to use the distortion mechanism 620 to control a shape of the periodic structure so as to at least partially correct for changes in the relative output powers of the output radiation beams $B_1$, $B_2$, $B_3$ due to variation in the wavelength of the input radiation beam $B_{in}$. The controller 630 is operable to generate a control signal 655 which is received by the distortion mechanism 620.

In order to at least partially correct for changes in the relative output powers of the output radiation beams $B_1$, $B_2$, $B_3$ due to variation in the wavelength of the input radiation beam $B_{in}$, the beam splitting apparatus 600 may further comprise one or more sensors that are operable to determine one or more properties of one or more of the input radiation beam and the output radiation beams $B_1$, $B_2$, $B_3$. These properties may be used by the controller 630 to generate the control signal 655 that is sent to the distortion mechanism 620.

For example, in some embodiments, the beam splitting apparatus may comprise a sensor 641 that is operable to determine a wavelength of the input radiation beam $B_{in}$. Sensor 641 may, for example, comprise an interferometer. Sensor 641 may be operable to send a signal 651 to the controller 630 that is indicative of the wavelength of the input radiation beam $B_{in}$.

Additionally or alternatively, the beam splitting apparatus 600 may comprise one or more sensors 642, 643, 644 that are operable to determine a quantity indicative of a power of one of the output radiation beams $B_1$, $B_2$, $B_3$. Each sensor 642, 643, 644 may be operable to send a signal 652, 653, 654 to the controller 630 that is indicative of the power of one of the output radiation beam $B_1$, $B_2$, $B_3$. In the illustrated embodiment: sensor 642 is operable to determine a quantity indicative of a power of output radiation beam $B_1$ and to send a signal 652 indicative thereof to the controller 630; sensor 643 is operable to determine a quantity indicative of a power of output radiation beam $B_2$ and to send a signal 653 indicative thereof to the controller 630; and sensor 644 is operable to determine a quantity indicative of a power of output radiation beam $B_3$ and to send a signal 654 indicative thereof to the controller 630.

The controller 630 may be operable upon receipt of one or more of the control signals 651, 652, 653, 654 to generate the control signal 655 in dependence on the one or more of the control signals 651, 652, 653, 654. With such an arrangement, the distortion mechanism 620 is operable to control the shape/amplitude of the periodic structure in dependence on: (a) a determined wavelength of the input radiation beam; and/or (b) a quantity indicative of the power of the output radiation beam so as to control the power of the output radiation beam.

Figure 19A:
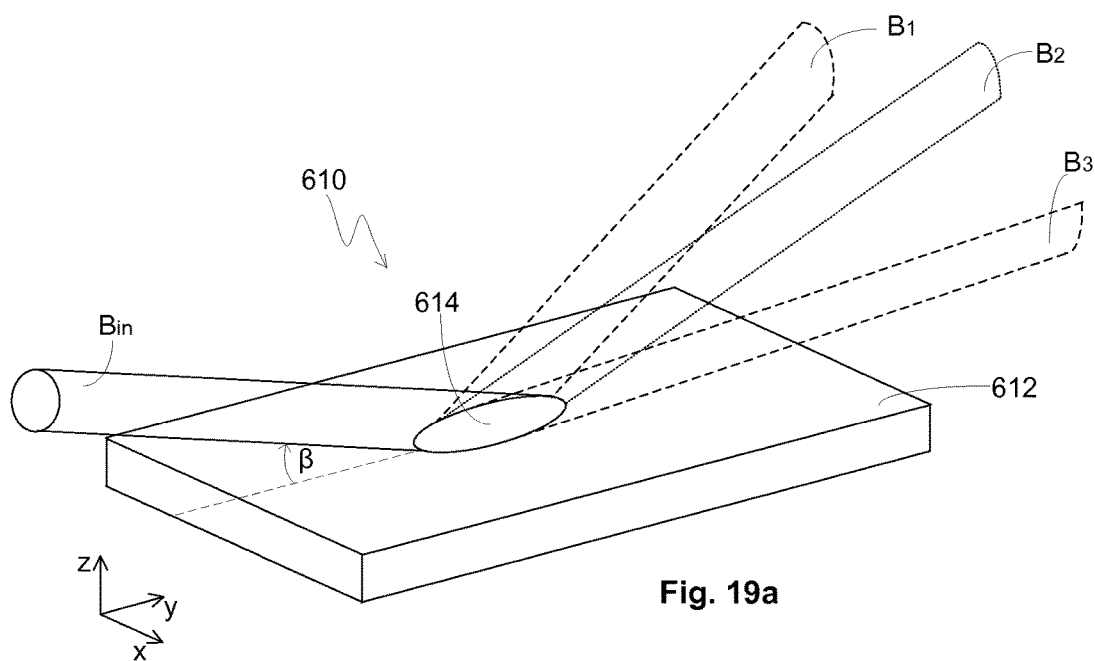
FIG. 19a is a schematic perspective view of an embodiment of an optical element, which may form part of the apparatus of FIG. 18.
Figure 19B:
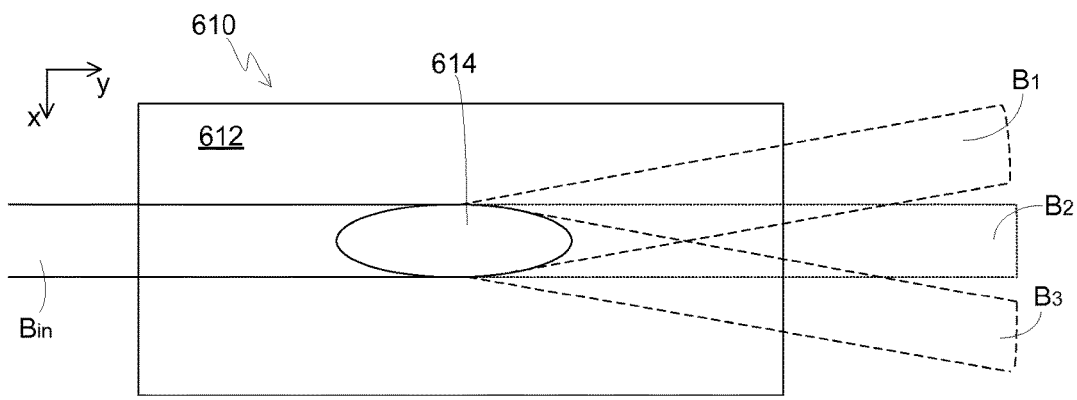
Figure 19C:
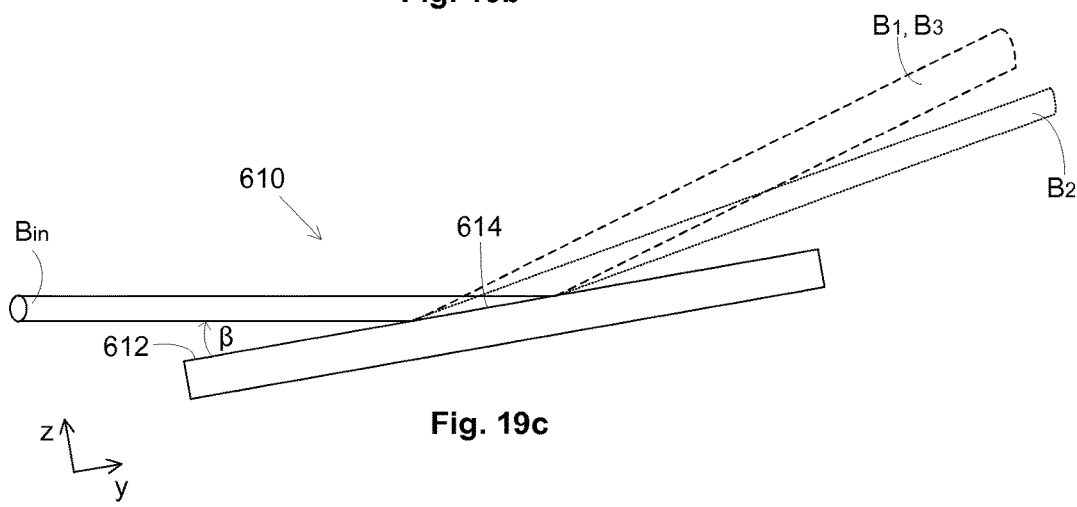

An embodiment of an optical element 610 is illustrated schematically in FIGS. 19a, 19b and 19c. Optical element 610 comprises a reflective surface 612 and is suitable for receiving input radiation beam $B_{in}$. The input radiation beam $B_{in}$ may, for example, comprise the radiation beam $B_{FEL}$ output by the free electron laser FEL in FIG. 3.

The reflective surface 612 lies generally in a plane (x-y plane in FIGS. 19a-19c). In use, the optical element 610 is arranged to receive the input radiation beam $B_{in}$ and to output the plurality of radiation beams $B_1$, $B_2$, $B_3$.

The input radiation beam $B_{in}$ is incident upon the reflective 612 surface at a grazing incidence angle $\beta$. The grazing incidence angle $\beta$ is the angle between the input radiation beam $B_{in}$ and the reflective surface 612. The grazing incidence angle $\beta$ may, for example, be less than 5°, for example, around 2° or even less, for example around 1°. The input radiation beam $B_{in}$ may be generally circular in cross section and may therefore irradiate a generally elliptical region of the reflective surface 612. This generally elliptical region may be referred to as a beam spot region 614. The dimensions of the beam spot region 614 are determined by the diameter of the input radiation beam $B_{in}$ and the grazing incidence angle $\beta$. The length of the minor axis of the elliptical beam spot region is equal to the diameter of the input radiation beam $B_{in}$ whereas the length of the major axis of the elliptical beam spot region is equal to the diameter of the input radiation beam $B_{in}$ divided by $\sin(\beta)$. The orientation of the beam spot region is dependent upon the direction of the input radiation beam $B_{in}$. In the example embodiment shown in FIGS. 19a-19c, the major axis of the beam spot region is aligned with the y-direction and the minor axis of the beam spot region is aligned with the x-direction.

When the input radiation beam $B_{in}$ is incident on the reflective surface 612 it is diffracted such that, in the far field, the output radiation beams $B_1$, $B_2$, $B_3$ are spatially separated, as now described. To achieve this, the reflective surface 612 is not flat but rather is provided with a grating structure. That is, the reflective surface 612 does not lie solely in the x-y plane but has some modulation in a direction normal to the x-y plane. In this embodiment output radiation beam $B_2$ corresponds to the $0^{th}$ order diffraction beam and output radiation beams $B_1$ and $B_3$ correspond to the $\pm1^{st}$ order diffraction beams. In other embodiments, a different number of radiation beams $B_1$, $B_2$, $B_3$ may be output from the beam spot region 614. For example, in one embodiment five radiation beams may be output from the beam spot region 614 and the five output radiation beams may correspond to the $0^{th}$, $\pm1^{st}$, $\pm2^{nd}$ order diffraction beams.

The grating structure comprises a plurality of grooves extending across reflective surface 612. The grooves may be formed by any suitable process such as, for example, etching, stamping or electroforming. The grooves may have any profile shape, i.e. the cross sectional shape of the grooves in a plane perpendicular to the direction that they extend along may have any shape.

Figure 20:
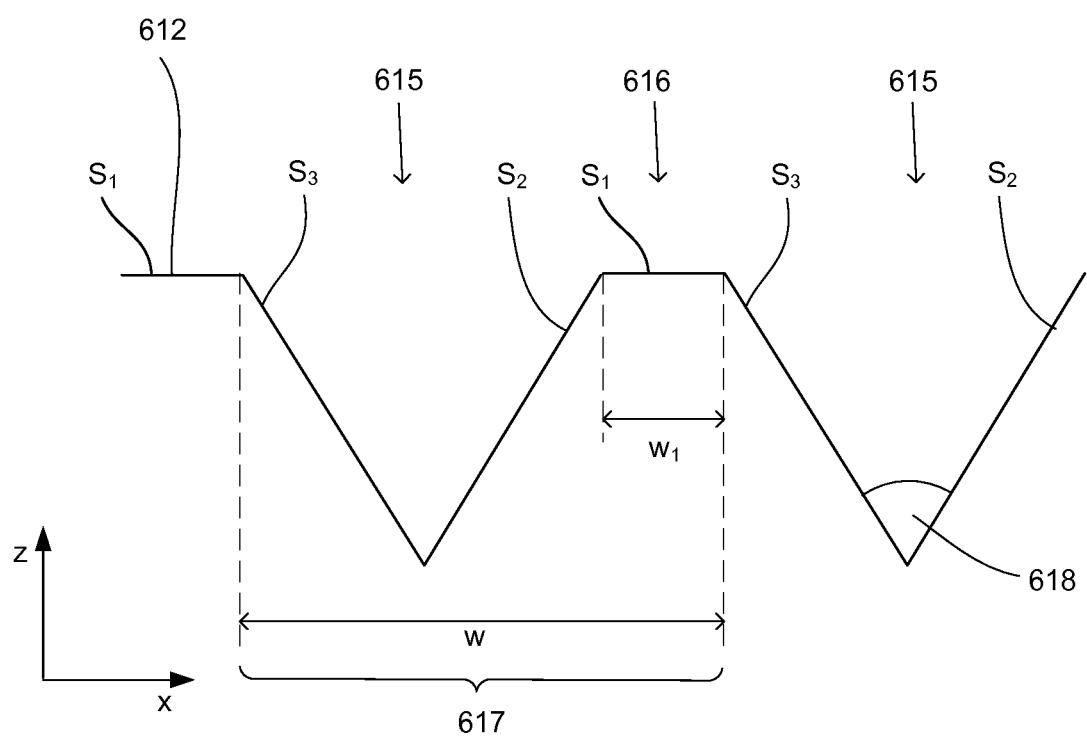
FIG. 20 is a cross sectional view of a portion of a reflective surface of the optical element of FIGS. 19a-19c in the x-z plane.

In one embodiment (as now described), the grooves are formed from a plurality of generally flat faces. A cross section of a portion of the reflective surface 612 in the x-z plane for such an embodiment is shown in FIG. 20.

The grooves 615 form a plurality of ridges 616, dividing the reflective surface 612 into three groups of reflective faces. Top faces of each ridge 616 form a first group of faces $S_1$, left-hand sides of each ridge 616 form a second group of faces $S_2$ and right-hand sides of each ridge 616 form the third group of faces $S_3$. The grooves 615 therefore divide the reflective surface 612 into a plurality of groups of reflective faces, wherein the faces within each group are substantially parallel, but at different angles with respect to the faces of each other group. That is, the faces within a particular group each have a particular orientation which is different to faces in other groups.

It will be appreciated that other groove profiles may alternatively be used. For example, in an alternative embodiment, the profile of the grooves may comprise one or more curved sections.

The grating structure may be considered to be formed from a plurality of unit cells 617. The unit cell 617 may be the profile shape of the grooves 615, i.e. the cross sectional shape of the grooves 615 in a plane perpendicular to the direction that they extend along at a given location on the reflective surface 612 (in the x-direction). Each unit cell 617 may extend from one part of a groove 615 or ridge 616 to a corresponding part of an adjacent groove 615 or ridge 616. For example, each unit cell 617 may comprise a top face $S_1$ of a ridge 616, a left-hand face $S_2$ of a ridge 616 and a right hand face $S_3$ of a ridge 616 (the three faces being adjacent to each other). The size and shape of the unit cell 617 of the grating structure may be generally uniform. The width of the unit cell 617 of the grating structure may be referred to as its pitch. A width w of the unit cell 617 of the grating structure may, for example, be of the order of around 1 µm. The width $w_1$ of the $S_1$ faces may, for example, be in the range of 0.10 µm to 0.50 µm.

For a given direction of the input radiation beam $B_{in}$ with respect to the grating structure (i.e. grooves 615) and a given wavelength of the input radiation beam $B_{in}$, the direction of the radiation beams $B_1$, $B_2$, $B_3$ is dependent on the pitch of the grating, i.e. the width w of its unit cells 617, and is independent of the shape of the unit cells. However, the relative powers of the output radiation beams $B_1$, $B_2$, $B_3$ are dependent upon the shape of the unit cell 617 of the grating structure. In particular, the ratios of intensities of the branch radiation beams are dependent on the ratio of the width $w_1$ of the $S_1$ faces (in the x-direction) to the width w of the unit cell 617 pitch of the grating structure. The percentage of the width of the unit cell 617 (in the x-direction) which is formed by the top face $S_1$ may be referred to as the "duty cycle" of the grating structure.

The powers of each of the output radiation beams $B_1$, $B_2$, $B_3$ are dependent upon the duty cycle of the grating structure and the grazing incidence angle β of the input radiation beam $B_{in}$. In one embodiment, the width w of the unit cell 617 of the grating structure is 1 µm, the wavelength of the input radiation beam $B_{in}$ is 13.5 nm and the grazing incidence angle β is 1.1°. For such an embodiment, a duty cycle of 26% may result in an even distribution of power between the output radiation beams $B_1$, $B_2$, $B_3$ (i.e. each beam receives 33% of the power output by the optical element 610). Other duty cycles result in different distribution of power between the output radiation beams $B_1$, $B_2$, $B_3$.

The reflective surface 612 may comprise any suitable number of grooves 615. The number of grooves 615 across the beam spot region 614 is determined by the width w of the unit cell 617 of the grating structure and the length of the minor axis of the beam spot region 614. In one example embodiment, the reflective surface 612 may comprise of the order of 1000 grooves 615 across the beam spot region 614.

The output radiation beams $B_1$, $B_2$, $B_3$ may have an intensity distribution in the far field (e.g. at a lithographic tool $LA_1$-$LA_n$) that is substantially similar to the intensity distribution of the input radiation beam $B_{in}$, which may be desirable.

In the described example embodiment the grooves 615 extend generally in the y-direction. That is, the grooves 615 are generally parallel to the plane of incidence of input radiation beam $B_{in}$ (which is the plane containing the incoming radiation beam $B_{in}$ and the normal to the reflective surface 612, i.e. the z direction). Since the direction perpendicular to the grooves (i.e. the x-direction) is not in the plane of incidence of input radiation beam $B_{in}$, the grating results in conical diffraction, with the output radiation beams $B_1$, $B_2$, $B_3$ lying on a cone. In an alternative embodiment the grooves may extend generally perpendicular to the direction of propagation of the input radiation beam $B_{in}$ such that the output radiation beams $B_1$, $B_2$, $B_3$ lie in a plane.

The beam splitting apparatus 600 may form part of an optical system for a radiation beam. For example, the beam splitting apparatus 600 may form part of a beam delivery system BDS for a lithographic system LS, which may direct radiation from one or more radiation sources SO to one or more lithographic apparatus $LA_a$-$LA_n$.

It will be appreciated that while the optical element 610 is arranged to split an input radiation beam $B_{in}$ into three branch radiation beams, gratings may be provided which split a radiation beam into a different number of branch radiation beams. Generally, a grating may be provided which splits a radiation beam into two or more branch radiation beams.

The beam splitting apparatus 600 provides a convenient arrangement for splitting an input radiation beam $B_{in}$ into a plurality of output radiation beams $B_1$, $B_2$, $B_3$. The angular separation of the output radiation beams $B_1$, $B_2$, $B_3$ is dependent on the orientation of the input radiation beam $B_{in}$ with respect to the periodic grating structure (e.g. the grazing incidence angle), a pitch of the periodic structure, and a wavelength of the input radiation beam $B_{in}$. In addition, the relative powers of the output radiation beams $B_1$, $B_2$, $B_3$ are dependent on the shape of the periodic structure and the wavelength of the input radiation beam $B_{in}$. Therefore both the angular separation of the output radiation beams $B_1$, $B_2$, $B_3$ and the relative powers of the output radiation beams $B_1$, $B_2$, $B_3$ are dependent on the wavelength of the input radiation beam $B_{in}$.

Therefore, a static grating structure would result in a beam splitting apparatus whose output powers and directions are sensitive to variation in the wavelength of the input radiation beam $B_{in}$. However, the wavelength of a radiation beam $B_{FEL}$ output by a free electron laser FEL (see FIG. 3) may be expected to vary over time. As the wavelength of an input radiation beam $B_{in}$ is varied both the angles of the outgoing diffraction orders (except for the $0^{th}$ order) and the power in the different orders exiting the grating will change.

The variation in pointing directions of the output radiation beams $B_1$, $B_2$, $B_3$ are relatively small and may not pose a problem for the optics downstream of the beam splitting apparatus 600. However, for embodiments wherein the beam splitting apparatus 600 is used in the beam delivery system BDS of FIG. 1, any variation in the power of the output radiation beams $B_1$, $B_2$, $B_3$ will result in a variation of the power of the branch radiation beams $B_a$-$B_n$ that are supplied to the lithographic tools $LA_a$-$LA_n$. In turn, this will lead to a variation in the dose of radiation delivered to different parts of the substrate W. This can result in errors of the image formed on the substrate W and, in particular, can affect the critical dimension uniformity of the lithographic tool. It is estimated that a wavelength stability of better than 0.01% may be required in order to obtain a dose stability of the order of 0.1%. It may not be possible to achieve such wavelength stability in the output radiation beam $B_{FEL}$ of a free electron laser.

Figure 21A:
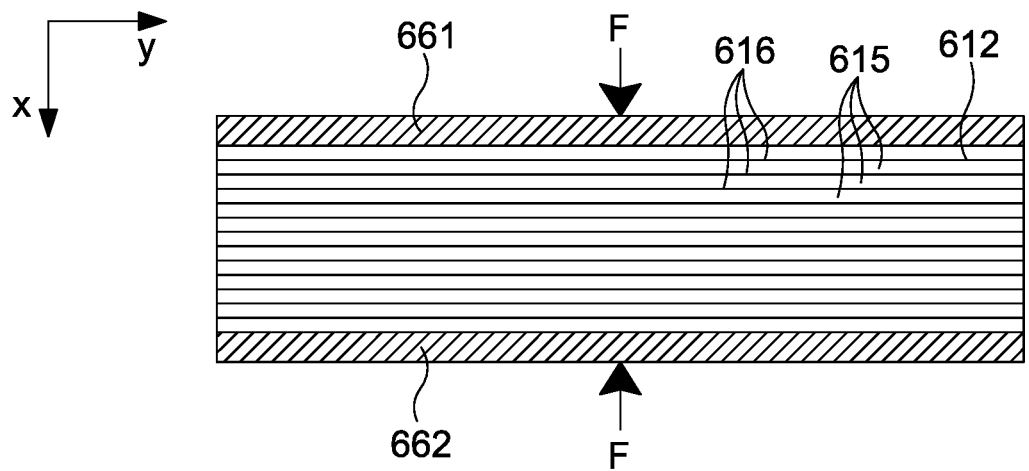
FIG. 21a is a plan view of the optical element of FIGS. 19a-19c along with an actuator.
Figure 21B:
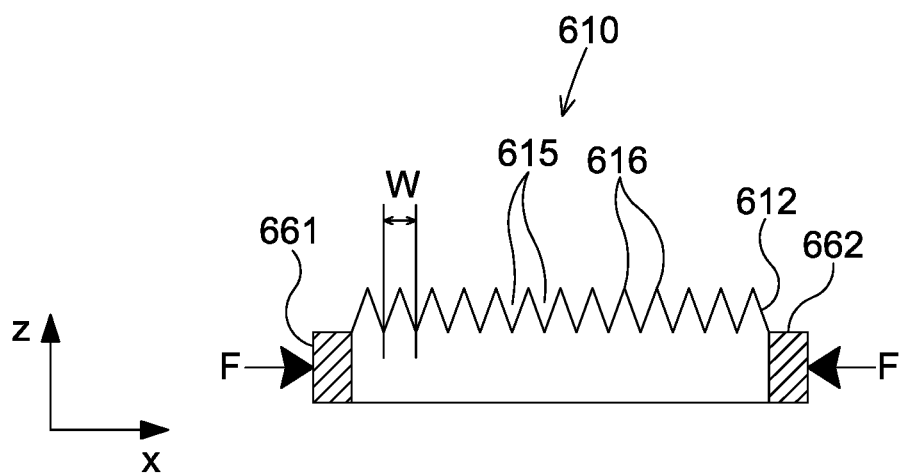

As shown in FIGS. 21a and 21b, the beam splitting apparatus 600 comprises two actuators 661, 662. Each of the actuators 661, 662 is provided adjacent to an opposite edge of the optical element 610. Each of the two actuators 661, 662 is operable to apply a force to the optical element 610 that is generally directed in a direction (the x-direction) that is perpendicular to the direction (the y-direction) in which the grooves 615 of the grating structure extend. Together, the two actuators 661, 662 are operable to cause the optical surface 612 to compress or expand in a direction (the x-direction) that is perpendicular to the direction (the y-direction) in which the grooves 615 of the grating structure. As a result, the actuators 661, 662 are operable to control the pitch of the periodic grating structure.

By suitable actuation using actuators 661, 662 the a shape of the periodic structure may be controlled so as to at least partially correct for changes in the relative output powers of the output radiation beams $B_1$, $B_2$, $B_3$ due to variation in the wavelength of the input radiation beam $B_{in}$. Together, the two actuators 661, 662 may be considered to be a distortion mechanism operable to control a shape of the periodic structure. The two actuators provide a specific example of the distortion mechanism 620 of FIG. 18.

The average or nominal pitch of the grating structure may be around 1000 nm. The outer dimensions of the reflective surface 612 may be of the order of 300 mm (in the y-direction) by 20 mm (in the x-direction). The actuators 661, 662 may be operable to vary the nominal pitch of the periodic grating structure by approximately +/−0.1%. For embodiments wherein a width (or extent of the optical element 610 in the x-direction) is 20 mm this implies that the actuators 661, 662 may be operable to vary the width of the optical element 610 by +/−20 μm. Such a range of actuation can be realized. For example, the two actuators may each comprise a piezoelectric actuator.

Furthermore, this actuation of the optical element 610 can be achieved with a relatively high bandwidth, for example, with a bandwidth of up to 10 kHz. A target location on the substrate W may receive EUV radiation for an exposure time period, which may be around 1 ms or greater. In some embodiments, the exposure time may be of the order of tens of milliseconds, for example in the range of 50-100 ms. A feedback-based control loop using the beam splitting apparatus 600 operating at a frequency of 10 kHz or more will provide some control of exposure dose delivered in 1 ms. Therefore, the beam splitting apparatus 600 can be used to at least partially correct for variations in radiation doses provided to different parts of the substrate W. The beam splitting apparatus 600 can be used to achieve dose stability within a large frequency band. In particular, the beam splitting apparatus 600 may be operable to at least partially correct for variations in dose caused by variations in the wavelength of the radiation in a frequency range between 100 Hz and 10 kHz. Note that for higher frequency variations, any dose error will be reduced by scan averaging over the exposure time.

The beam splitting apparatus 600 provides an arrangement that allows the relative powers of the plurality of output radiation beams $B_1$, $B_2$, $B_3$ to remain substantially unaffected by any drift in the wavelength of the input radiation beam over time. Furthermore, the beam splitting apparatus 600 provides an arrangement that allows the directions of the plurality of output radiation beams $B_1$, $B_2$, $B_3$ to remain substantially unaffected by any drift in the wavelength of the input radiation beam over time.

The optical element 610 can be formed from silicon by, for example, anisotropic etching along crystal planes of a silicon wafer. For example, the top faces $S_1$ may be formed along the (100) crystallographic plane and the faces $S_2$, $S_3$ may be formed along the (111) and (−111) crystallographic planes. In this case, the angle 618 at the bottom of the grooves will be approximately 70.5° and the grooves 615 and ridges 616 will extend along the (01-1) direction.

It will be appreciated that various layouts are possible depending on the (h k l) numbers describing the top faces $S_1$.

A grating in which the top faces $S_1$ are formed along the (100) crystallographic plane and the faces $S_2$, $S_3$ are formed along the (111) and (−111) crystallographic planes form the plurality of (e.g. three) output radiation beams. The number of output radiation beams is dependent upon the number of diffraction orders that are present. In turn, the number of diffraction orders present is dependent on the grazing incidence angle of the input radiation beam $B_{in}$ since larger grazing incidence angles enable more diffraction orders.

An advantage of using silicon for the optical element 610 is that thermal expansion during operation may be limited by operating at approximately 123 K. At this temperature the heat conductivity of silicon is of the order of 600 W/m/K or more, which is a factor of 4 better than its heat conductivity at room temperature and around 50% better than the heat conductivity of copper (Cu). Therefore, even a relatively large heat load can be withstood, while keeping the temperature of the optical element in the range where expansion of the optical element is low and the optical element maintains its designed structural dimensions, despite significant heat load.

From the above, it will be apparent that optical elements which provide a reflective grating structure may be manufactured in any of a plurality of suitable ways. In one embodiment, gratings may be produced by processing a silicon wafer using a plurality of etchants in order to provide ridges with surfaces that are substantially atomically flat. Etchants such as potassium hydroxide (KOH), sodium hydroxide (NaOH) and ammonium fluoride (NH4F), for example, may be used. A suitable grating may be manufactured as described above. The grating may then be copied using a process such as thermoplastic moulding in a metal glass, or by stamping, for example.

While it is described above that the etched surface may be silicon, it is to be understood that other materials may be used. Examples of other materials which may be anisotropically etched to provide a grating include germanium (Ge), gallium arsenide (GaAs), silicon-germanium (SiGe), indium phosphide (InP) and indium arsenide (InAs). Generally, however, any suitable (crystalline) material may be used.

The optical element 610 may be provided with a coating of a more reflective (less absorbing) material (for EUV radiation). For example, the mirror may be provided with a coating of ruthenium (Ru) or molybdenum (Mo). This may, for example, have a thickness of around 50 nm. Molybdenum and ruthenium both have relatively high grazing incidence reflectivities for radiation having wavelengths of 13.5 nm. Other coatings may be selected for other wavelengths of radiation. Generally, however, transparent materials with a sufficiently high electron density provide good grazing incidence reflection. Heavy element metals are examples of such materials. Additionally, materials may be selected for resistance to conditions likely to be present within the beam delivery system BDS, such as the generation of EUV radiation-induced plasma.

In some embodiments, an amorphous metal (or metal glass), such as a mix of Mo and Ru, may be deposited on the optical elements (flat or etched silicon) to provide a reflective coating. The amorphous structure of the metal glass may be used to provide smooth surfaces with high reflectivity for a desired wavelength.

It will be appreciated that any other appropriate materials such as zirconium (Zr), platinum (Pt), nickel (Ni), copper (Cu), silver (Ag), gold (Au) may be used.

Where a reflective coating is provided, a further coating may be applied to the reflective coating. For example, oxides, nitrides, carbides, etc, may be applied in order to increase the stability and resistance of the reflective coating to conditions likely to be present.

Where a reflective coating is provided, one or more interface layers may be provided between the etched material (e.g. Si) and the reflective coating to reduce surface roughness and increase thermal conductivity. For example, an interface layer of graphene may be provided.

While not depicted in the Figures, cooling channels may be provided on a reverse side of any or all of the optical elements described above (i.e. a side which does not receive the input radiation beam $B_{in}$). Such cooling channels may be arranged to receive a liquid coolant such as water, or a two-phase liquid/gas coolant.

It will be appreciated that herein when an object is described as being configured to receive a radiation beam and to scatter the radiation beam so as to form the one or more output radiation beams, the term "scatter" is intended to include reflection or diffraction (either reflective or transmissive).

A beam spot region of an optical surface will be understood to mean the region of an optical surface upon which an input radiation beam is incident. For example, a generally circular input radiation beam which is incident upon an optical surface at an oblique angle will irradiate a generally elliptical region of the optical surface. Such an elliptical beam spot region will have a minor axis and a major axis. It will be appreciated that the input radiation beam may not have a sharply defined edge, for example the input radiation beam may have a Gaussian-like intensity profile. For such embodiments, the edge of the input radiation beam may be defined as the point where its intensity falls below a predetermined cut off value. Alternatively, for a rotationally symmetric intensity profile, the edge of the input radiation beam may be defined as a circle which contains a predetermined percentage (for example 95%) of the power of the radiation beam. The beam spot region may be defined accordingly.

In the above described embodiments an adjustable periodic structure is formed on an optical surface of an optical element, which results in a plurality of sub-beams leaving the optical surface, each one corresponding to a different diffraction order. In the above described embodiments, the optical element forms part of an attenuator. One of the sub-beams forms an output radiation beam of the attenuator and by varying the amplitude of the periodic structure the power of said output radiation beam may be varied. In alternative embodiments, the optical element may form part of a beam splitting apparatus. For example, the optical element may form part of the beam delivery system BDS and may split a main radiation beam into a plurality of sub-beams. The sub-beams leaving the optical element may each form a branch radiation beam of the beam splitting apparatus. This may be achieved, for example, by providing more than one aperture in wall 120.

Attenuator 15a-15n may comprise one or more of the above described embodiments alone or in combination with other attenuators. The other attenuators may form part of a feed-back loop which operates at a different time scale. For example the attenuator 100 described above may be operable to provide dose control of radiation delivered to a substrate W within a lithographic apparatus in real time (i.e. during exposure of the substrate). A slower attenuator may be used to account for longer time scale drift of the dose of radiation received by a substrate. For example, a gas chamber based attenuator may also be used to account for longer time scale drift of the dose of radiation received by a substrate.

In some embodiments, a controller may control the power of EUV radiation emitted from the radiation source SO. A sensor apparatus may monitor the power of the EUV radiation beam output by the radiation source SO or a parameter correlated with the power of the EUV radiation beam. The controller may adjust the radiation source SO based on the output of the sensor apparatus. Thus a feedback-based control loop may be provided. The sensor apparatus may be provided at any suitable location within lithographic system LS.

While it is described above in connection with FIG. 1 that a respective attenuator 15a-15n is provided for each branch radiation beam, it will be appreciated that in other embodiments, an attenuator may be provided for only one or some of the branch radiation beams. Further, a single attenuator may be provided for a plurality of branch radiation beams. For example, although the attenuators 15a-15n are shown disposed outside of the beam delivery system BDS, in other embodiments, an attenuator as described herein may be disposed within the beam delivery system BDS so as to attenuate a plurality of branch radiation beams. For example, to attenuate all of the branch radiation beams $B_b$-$B_n$ together, an attenuator may be provided immediately after the branching of the first branch radiation beam $B_a$. Any combination or configuration of attenuators may be provided.

An attenuator as generally described above may be positioned elsewhere within the lithographic system before the substrate W. For example, with reference to FIG. 2, an attenuator may be positioned within the illumination system IL.

Whilst embodiments of the invention have been described in the context of a single free electron laser FEL, it should be appreciated that any number of free electron lasers FEL may be used. For example, two free electron lasers may be arranged to provide EUV radiation to a plurality of lithographic apparatus. This is to allow for some redundancy. This may allow one free electron laser to be used when the other free electron laser is being repaired or undergoing maintenance.

Lithographic system LS may comprise any number of lithographic apparatus. The number of lithographic apparatus which form a lithographic system LS may, for example, depend on the amount of radiation which is output from a free electron laser and on the amount of radiation which is lost in the beam delivery system BDS. The number of lithographic apparatus which form a lithographic system LS may additionally or alternatively depend on the layout of a lithographic system LS and/or the layout of a plurality of lithographic systems LS.

Embodiments of a lithographic system LS may also include one or more mask inspection apparatus MIA and/or one or more Aerial Inspection Measurement Systems (AIMS). In some embodiments, the lithographic system LS may comprise two mask inspection apparatuses to allow for some redundancy. This may allow one mask inspection apparatus to be used when the other mask inspection apparatus is being repaired or undergoing maintenance. Thus, one mask inspection apparatus is always available for use. A mask inspection apparatus may use a lower power radiation beam than a lithographic apparatus. Further, it will be appreciated that radiation generated using a free electron laser FEL of the type described herein may be used for applications other than lithography or lithography related applications.

The term "relativistic electrons" should be interpreted to mean electrons which have relativistic energies. An electron may be considered to have a relativistic energy when its kinetic energy is comparable to or greater than its rest mass energy (511 keV in natural units). In practice a particle accelerator which forms part of a free electron laser may accelerate electrons to energies which are much greater than its rest mass energy. For example a particle accelerator may accelerate electrons to energies of >10 MeV, >100 MeV, >1GeV or more.

The radiation source SO may comprise one or more free electron lasers FEL which are operable to produce a beam of EUV radiation. It will be appreciated however that in other embodiments, the radiation source SO may comprise other means of generating radiation. For example, the radiation source SO may comprise one or more "laser produced plasma" (LPP) sources. Indeed, it is to be understood that in some embodiments, the radiation source SO may utilise any means operable to provide a suitably powerful radiation beam.

Embodiments of the invention have been described in the context of a free electron laser FEL which outputs an EUV radiation beam. However a free electron laser FEL may be configured to output radiation having any wavelength. Some embodiments of the invention may therefore comprise a free electron laser which outputs a radiation beam which is not an EUV radiation beam.

It will be appreciated that the term "grazing incidence angle" refers to the angle between the propagation direction of an incident radiation beam and a reflective surface that it is incident upon. This angle is complementary to the angle of incidence, i.e. the sum of the grazing incidence angle and the angle of incidence is a right angle.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

The lithographic apparatuses $LA_a$ to $LA_n$ may be used in the manufacture of ICs. Alternatively, the lithographic apparatuses $LA_a$ to $LA_n$ described herein may have other applications. Possible other applications include the manufacture of integrated optical systems, guidance and detection patterns for magnetic domain memories, flat-panel displays, liquid-crystal displays (LCDs), thin-film magnetic heads, etc.

In an embodiment, there is provided an adjustable diffraction grating comprising: an optical element having an optical surface for receiving an input radiation beam, the optical element being provided with a plurality of closed channels below the optical surface, above each closed channel the optical surface being formed from a membrane of material; and a distortion mechanism comprising one or more actuators that are operable to distort the membranes over the closed channels so as to control the shape of the optical surface and to form a periodic structure on the optical surface which acts as a diffraction grating such that the input radiation beam is diffracted from the optical element to form a plurality of angularly separated sub-beams.

In an embodiment, the one or more actuators are operable to control a pressure difference between the interior of the closed channels and the optical surface. In an embodiment, the closed channels are filled with a fluid and the distortion mechanism comprises one or more actuators that are operable to control the pressure of the fluid within the plurality of closed channels. In an embodiment, the fluid has a vapour pressure in the range 10-100 Pa when evaluated at 22 ° C. In an embodiment, the fluid comprises a hydrocarbon of the form $C_xH_yO_z$. In an embodiment, the adjustable diffraction grating further comprises an external fluid supply arranged to supply fluid to and remove fluid from the plurality of channels. In an embodiment, the external fluid supply is arranged to create an oscillating pressure within the channels. In an embodiment, the distortion mechanism comprises one or more piezoelectric actuators, the or each piezoelectric actuator being operable to distort the membranes over one or more of the closed channels so as to control the shape of the optical surface. In an embodiment, the closed channels are filled with a fluid and the or each piezoelectric actuator is operable to control the pressure of the fluid within the plurality of closed channels. In an embodiment, each piezoelectric actuator is operable to directly control the membrane of material above a closed channel within which the piezoelectric actuator is provided. In an embodiment, the piezoelectric actuator is a piezoelectric bending actuator comprising two electrodes and one or more layers of piezoelectric material disposed between the electrodes. In an embodiment, the distortion mechanism comprises one or more electrostatic actuators, the or each electrostatic actuator being operable to distort the membranes over one or more of the closed channels so as to control the shape of the optical surface. In an embodiment, the plurality of channels are arranged in groups with all of the channels in each group being in fluid communication and each group of channels being isolated from adjacent groups. In an embodiment, each group of channels is provided with one or more connecting channels arranged so as to connect each of the channels within that group together. In an embodiment, each group of channels is provided with an actuator that is operable to control the pressure of fluid within each of the channels of the group. In an embodiment, the adjustable diffraction grating further comprises one or more cooling channels defined by a body of the optical element for circulation of a cooling fluid.

In an embodiment, there is provided an attenuator for receiving an input radiation beam and outputting an output radiation beam, the attenuator comprising: an adjustable diffraction grating as described herein; and a blocking member which is positioned in the far field of the optical element such that at least one of the sub-beams passes the blocking member to form the output radiation beam and at least one of the sub-beams is blocked by the blocking member.

In an embodiment, the attenuator further comprises a sensor operable to determine a quantity indicative of the power of the output radiation beam. In an embodiment, the distortion mechanism is operable to control the shape of the periodic structure in dependence on the quantity indicative of the power of the output radiation beam so as to control the power of the output radiation beam.

In an embodiment, there is provided a lithographic apparatus comprising: an attenuator as described herein; an illumination system configured to condition the output radiation beam of the attenuator; a support structure constructed to support a patterning device, the patterning device being capable of imparting the output radiation beam with a pattern in its cross-section to form a patterned radiation beam; a substrate table constructed to hold a substrate; and a projection system configured to project the patterned radiation beam onto the substrate.

In an embodiment, there is provided a lithographic system comprising: a radiation source operable to produce a radiation beam; one or more lithographic apparatuses; and at least one attenuator as described herein, the at least one attenuator being arranged to receive at least a portion of the radiation beam produced by the radiation source and to provide the output radiation beam of the attenuator to at least one of the one or more lithographic apparatuses.

In an embodiment, there is provided a beam splitting apparatus for receiving an input radiation beam and outputting a plurality of output radiation beams, the beam splitting apparatus comprising: an optical element having an optical surface for receiving the input radiation beam, a periodic structure being provided on the optical surface which acts as a diffraction grating such that the input radiation beam is diffracted from the optical element to form a plurality of angularly separated output radiation beams; a distortion mechanism operable to distort the optical surface so as to control a shape of the periodic structure; and a controller; wherein the controller is operable to use the distortion mechanism to control the shape of the periodic structure so as to at least partially correct for changes in the relative output powers of the output radiation beams due to variation in the wavelength of the input radiation beam.

In an embodiment, the beam splitting apparatus further comprises a sensor operable to determine a wavelength of the input radiation beam. In an embodiment, the beam splitting apparatus further comprises a sensor operable to determine a quantity indicative of the power of one of the output radiation beams. In an embodiment, the distortion mechanism is operable to control the shape of the periodic structure in dependence on: (a) the determined wavelength of the input radiation beam; and/or (b) the quantity indicative of the power of the output radiation beam so as to control the power of the output radiation beam.

In an embodiment, there is provided a radiation system comprising: a radiation source operable to produce a main radiation beam; and a beam splitting apparatus as described herein arranged to receive the main radiation beam and to output a plurality of output radiation beams.

In an embodiment, there is provided a lithographic system comprising: a radiation source operable to produce a main radiation beam; a plurality of lithographic apparatuses; and a beam delivery system operable to receive the main radiation beam from the radiation source, split the main radiation beam into a plurality of separate branch radiation beams and to direct each of the branch radiation beams to a different one of the plurality of lithographic apparatuses, wherein the beam delivery system comprises a beam splitting apparatus as described herein.

In an embodiment, there is provided a method for splitting an input radiation beam into a plurality of output radiation beams, the method comprising: providing an adjustable diffraction grating comprising an optical surface, a periodic structure being provided on the optical surface; directing the input radiation beam so as to illuminate the optical surface such that the input radiation beam is diffracted from the optical element to form a plurality of angularly separated output radiation beams; and controlling a shape of the periodic structure so as to at least partially correct for changes in the relative output powers of the output radiation beams due to variation in the wavelength of the input radiation beam.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An adjustable diffraction grating comprising:
an optical element having an optical surface to receive an input radiation beam, the optical element comprising a plurality of closed channels below the optical surface, above each closed channel the optical surface being formed from a membrane of material; and
a distortion mechanism comprising one or more actuators that are operable to distort the membranes over the closed channels so as to control a shape of the optical surface and to form a periodic structure on the optical surface which acts as a diffraction grating such that the input radiation beam is diffracted from the optical element to form a plurality of angularly separated sub-beams.

2. The adjustable diffraction grating of claim 1, wherein the one or more actuators are operable to control a pressure difference between the interior of the closed channels and the optical surface.

3. The adjustable diffraction grating of claim 1, wherein the closed channels are filled with a fluid and the distortion mechanism comprises one or more actuators that are operable to control a pressure of the fluid within the plurality of closed channels.

4. The adjustable diffraction grating of claim 3, wherein the fluid has a vapour pressure selected from the range of 10-100 Pa when evaluated at 22 °C.

5. The adjustable diffraction grating of claim 3, wherein the fluid comprises a hydrocarbon of the form $C_xH_yO_z$.

6. The adjustable diffraction grating of claim 3, further comprising an external fluid supply arranged to supply fluid to and remove fluid from the plurality of channels.

7. The adjustable diffraction grating of claim 6, wherein the external fluid supply is arranged to create an oscillating pressure within the channels.

8. The adjustable diffraction grating of claim 1, wherein the distortion mechanism comprises one or more piezoelectric actuators, the or each piezoelectric actuator operable to distort one or more of the membranes over one or more of the closed channels so as to control the shape of the optical surface.

9. The adjustable diffraction grating of claim 8, wherein the closed channels are filled with a fluid and the or each piezoelectric actuator is operable to control a pressure of the fluid within the plurality of closed channels.

10. The adjustable diffraction grating of claim 8, wherein each piezoelectric actuator is operable to directly control the membrane of material above a closed channel within which the piezoelectric actuator is provided.

11. The adjustable diffraction grating of claim 8, wherein the piezoelectric actuator is a piezoelectric bending actuator comprising two electrodes and one or more layers of piezoelectric material disposed between the electrodes.

12. The adjustable diffraction grating of claim 1, wherein the distortion mechanism comprises one or more electrostatic actuators, the or each electrostatic actuator being operable to distort one or more of the membranes over one or more of the closed channels so as to control the shape of the optical surface.

13. The adjustable diffraction grating of claim 1, wherein the plurality of channels are arranged in groups with all of the channels in each group being in fluid communication and each group of channels being isolated from adjacent groups.

14. The adjustable diffraction grating of claim 13, wherein each group of channels is provided with one or more connecting channels arranged so as to connect each of the channels within that group together.

15. The adjustable diffraction grating of claim 13, wherein each group of channels is provided with an actuator that is operable to control a pressure of fluid within each of the channels of the group.

16. The adjustable diffraction grating of claim 1, further comprising one or more cooling channels defined by a body of the optical element for circulation of a cooling fluid.

17. An attenuator system to receive an input radiation beam and output an output radiation beam, the attenuator system comprising:
    an adjustable diffraction grating comprising:
        an optical element having an optical surface to receive the input radiation beam, the optical element comprising a plurality of closed channels below the optical surface, above each closed channel the optical surface being formed from a membrane of material, and
        a distortion mechanism comprising one or more actuators that are operable to distort the membranes over the closed channels so as to control a shape of the optical surface and to form a periodic structure on the optical surface which acts as a diffraction grating such that the input radiation beam is diffracted from the optical element to form a plurality of angularly separated sub-beams; and
    a blocking member which is positioned in the far field of the optical element such that at least one of the sub-beams passes the blocking member to form the output radiation beam and at least one of the sub-beams is blocked by the blocking member.

18. The attenuator system of claim 17, further comprising a sensor configured to determine a quantity indicative of power of the output radiation beam.

19. The attenuator system of claim 18, wherein the distortion mechanism is configured to control the shape of the periodic structure in dependence on the quantity indicative of the power of the output radiation beam so as to control the power of the output radiation beam.

20. A lithographic apparatus comprising:
    the attenuator system according to claim 17;
    an illumination system configured to condition the output radiation beam of the attenuator system;
    a support structure constructed to support a patterning device, the patterning device being capable of imparting the output radiation beam with a pattern in its cross-section to form a patterned radiation beam;
    a substrate table constructed to hold a substrate; and
    a projection system configured to project the patterned radiation beam onto the substrate.

21. A lithographic system comprising:
    a radiation source operable to produce a radiation beam;
    one or more lithographic apparatuses; and
    at least one attenuator system according to claims 17, the attenuator system arranged to receive at least a portion of the radiation beam produced by the radiation source as the input radiation beam and to provide the output radiation beam of the attenuator system to at least one of the one or more lithographic apparatuses.

* * * * *